(12) United States Patent
Kozuka

(10) Patent No.: US 7,035,158 B2
(45) Date of Patent: Apr. 25, 2006

(54) SEMICONDUCTOR MEMORY WITH SELF FUSE PROGRAMMING

(75) Inventor: Eiji Kozuka, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 87 days.

(21) Appl. No.: 10/724,565

(22) Filed: Nov. 26, 2003

(65) Prior Publication Data
US 2004/0136248 A1   Jul. 15, 2004

(30) Foreign Application Priority Data
Nov. 26, 2002   (JP)   ............................. 2002-342897

(51) Int. Cl.
*G11C 7/00*   (2006.01)

(52) U.S. Cl. ............................. 365/225.7; 365/189.07; 365/200

(58) Field of Classification Search ............. 365/225.7, 365/201, 189.07, 96
See application file for complete search history.

(56) References Cited

U.S. PATENT DOCUMENTS

| | | | | |
|---|---|---|---|---|
| 5,724,366 A | * | 3/1998 | Furutani | 365/201 |
| 6,256,237 B1 | * | 7/2001 | Ho et al. | 365/200 |
| 6,310,807 B1 | * | 10/2001 | Ooishi et al. | 365/200 |
| 6,324,106 B1 | * | 11/2001 | Urakawa | 365/200 |
| 6,788,596 B1 | * | 9/2004 | Kim et al. | 365/200 |
| 6,809,982 B1 | * | 10/2004 | Fujima | 365/225.7 |

FOREIGN PATENT DOCUMENTS

| JP | 2002-042494 | 2/2002 |
|---|---|---|
| JP | 2002-197889 | 7/2002 |

* cited by examiner

*Primary Examiner*—Son Mai
(74) *Attorney, Agent, or Firm*—Hogan & Hartson, L.L.P.

(57) ABSTRACT

A fault after an assembling process is saved by using a tester. An error detector circuit compares read data from a memory cell and data from an external input/output terminal by means of a comparator circuit, thereby determining whether a memory cell is good or faulty. The error detector circuit outputs a sense signal COMPERR in the case where the memory cell is faulty. A self fuse program circuit causes a latch circuit LAi to latch an external address as a save address upon receipt of the sense signal COMPERR. By a counter Ci and a switch circuit SW, programming of a save address is carried out by transferring the save address latched at the latch circuit LAi to a fuse program circuit FPi on one bit by one bit basis.

17 Claims, 35 Drawing Sheets

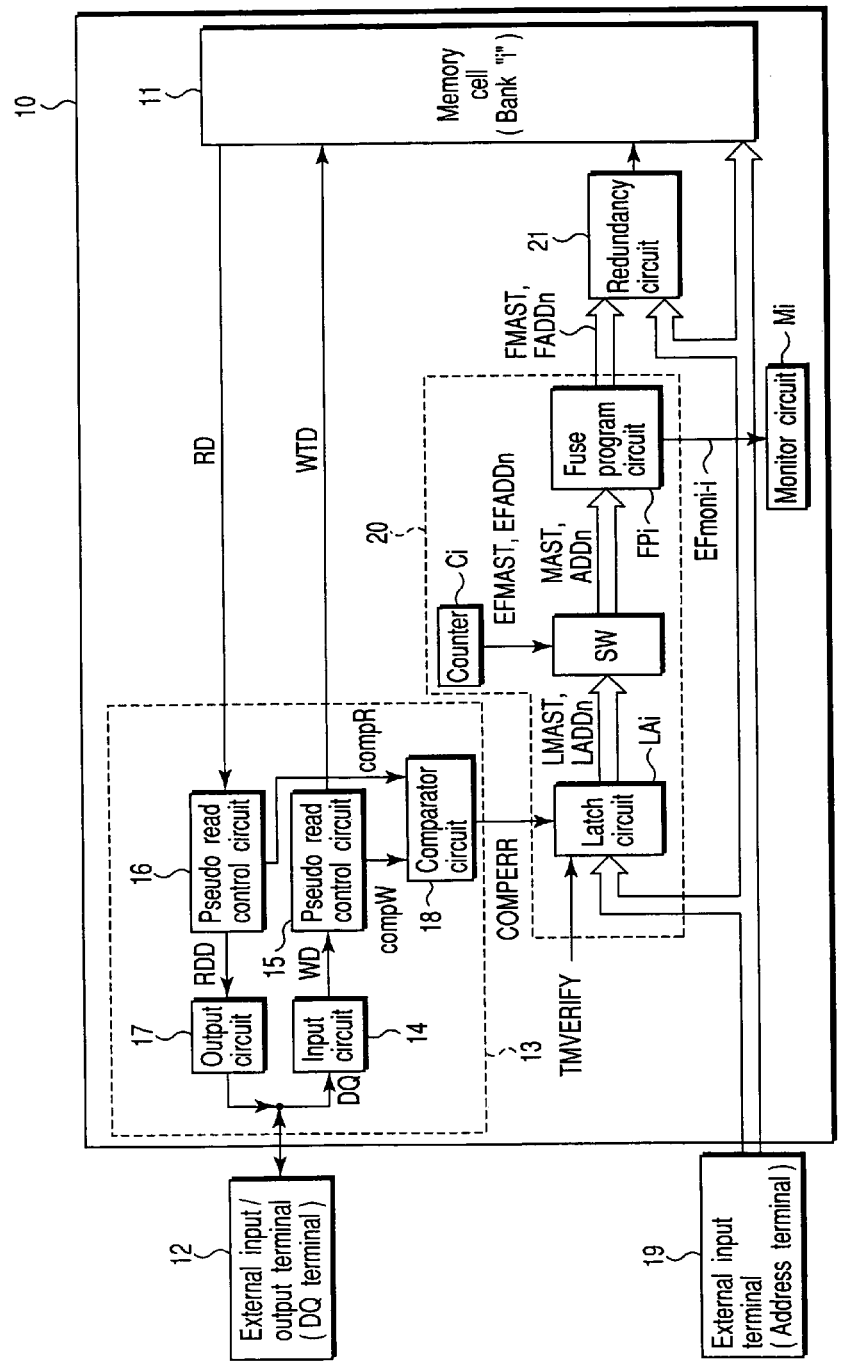
F I G. 8

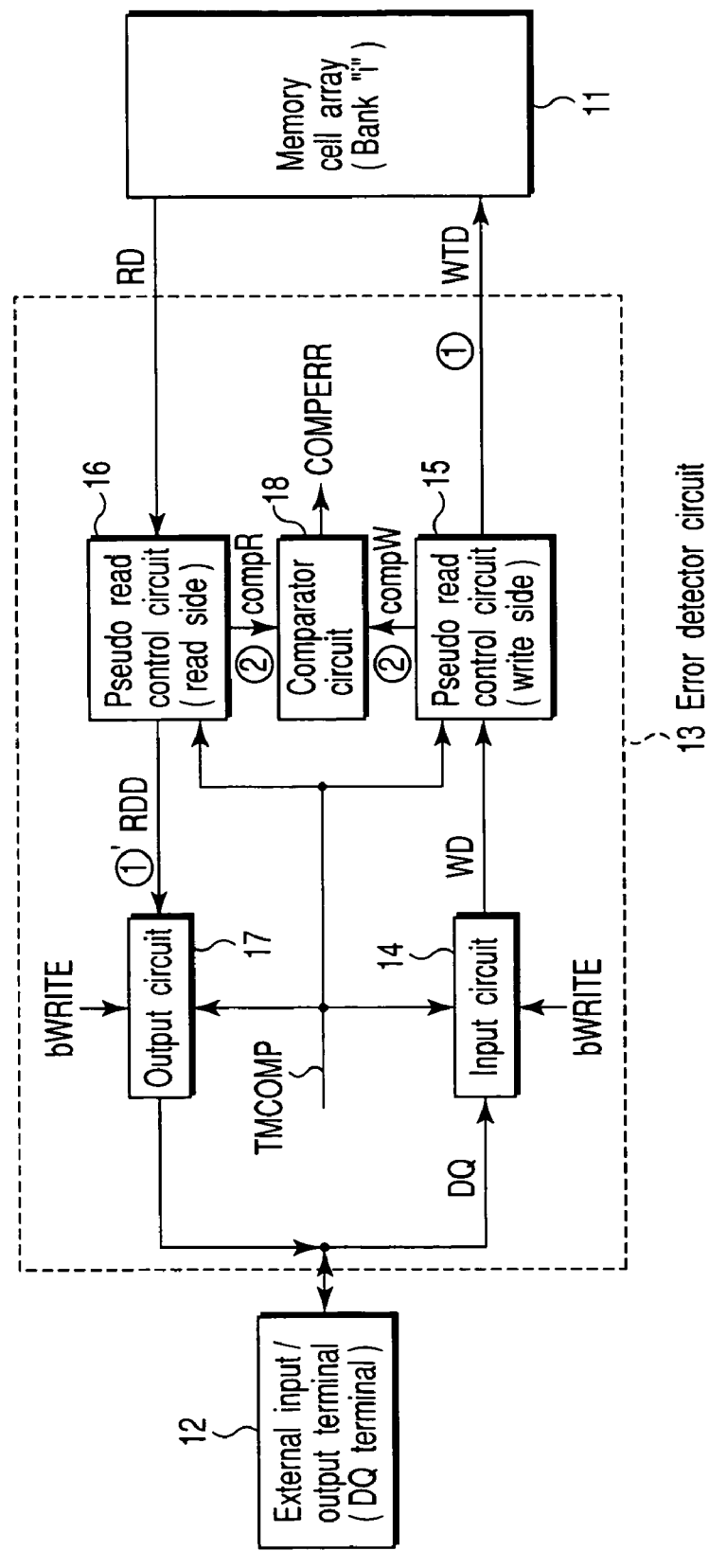
Error detector circuit
①: Route of read/write data during normal node
②: Route of read/write data during testing (error detection)
F I G. 9

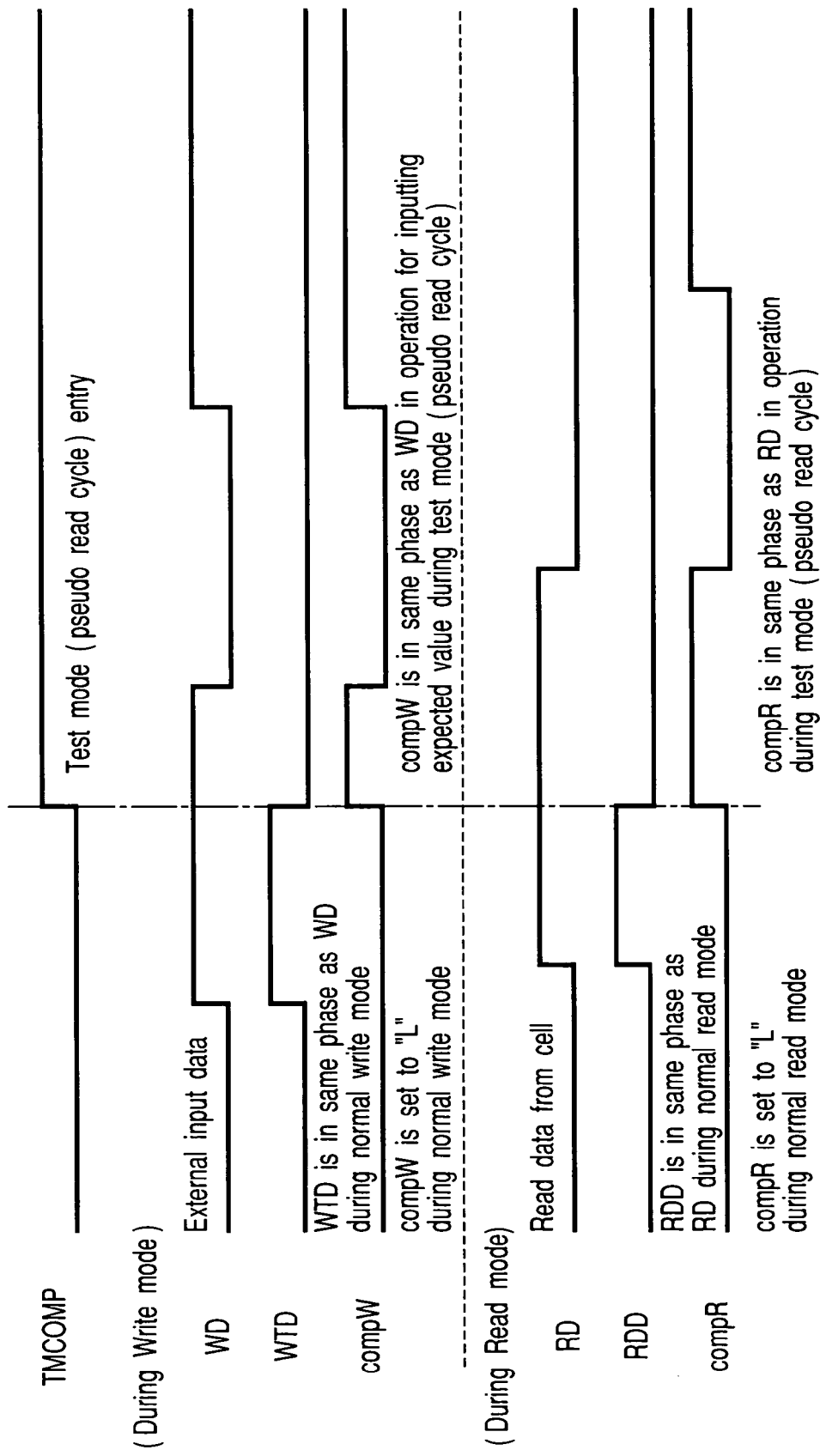
F I G. 16

In case of 1-bit type

In case of 4-bit type

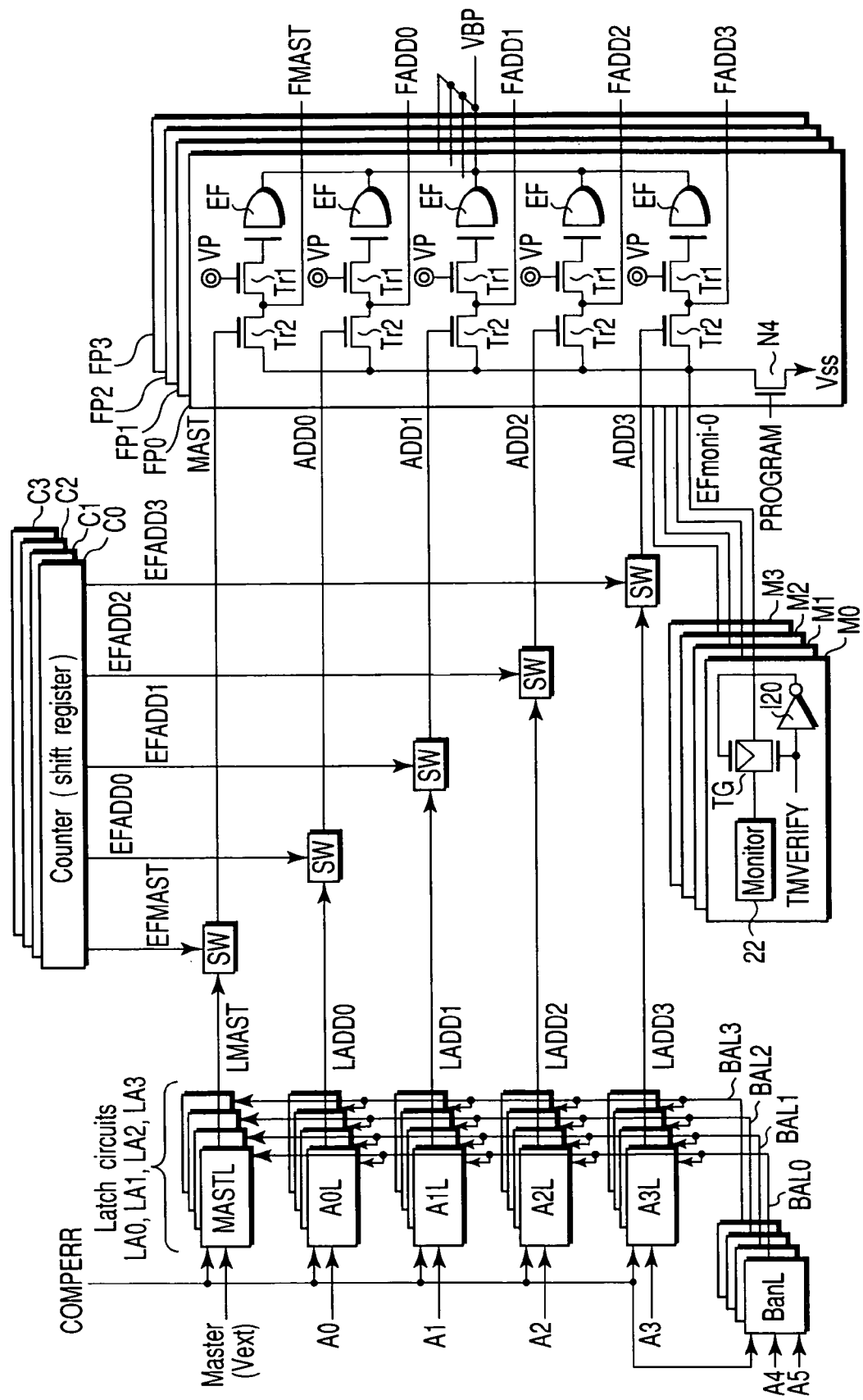
F I G. 20

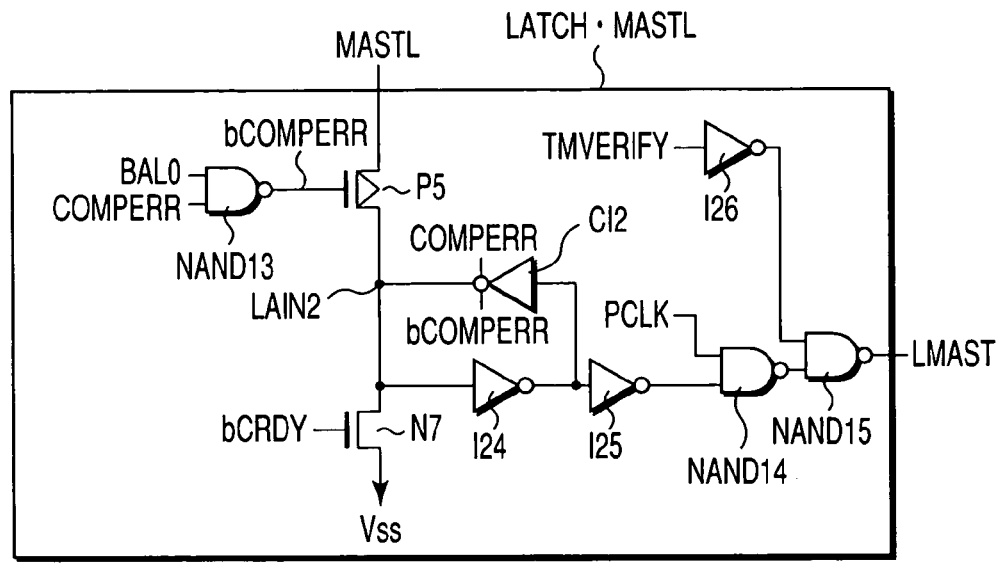
F I G. 25
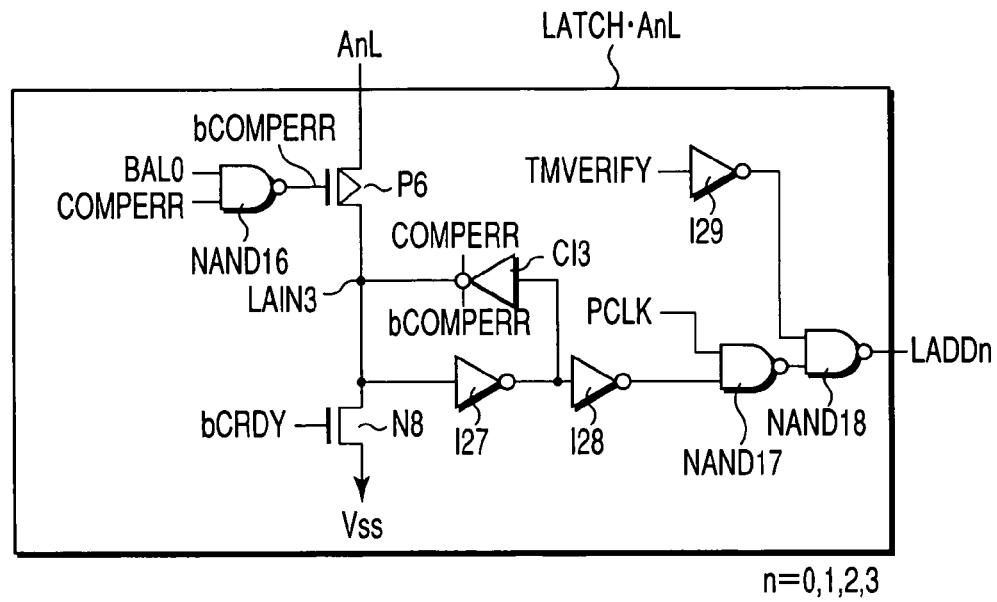
F I G. 26
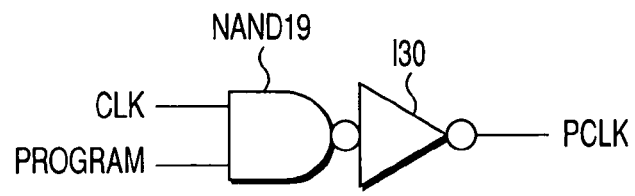
F I G. 27

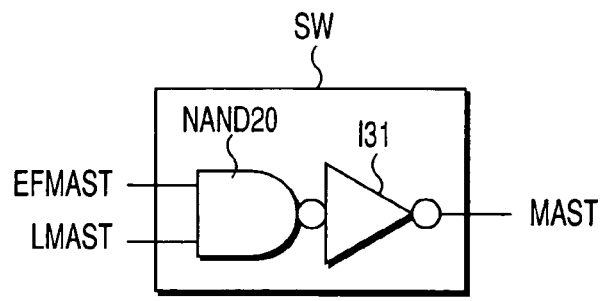
F I G. 29
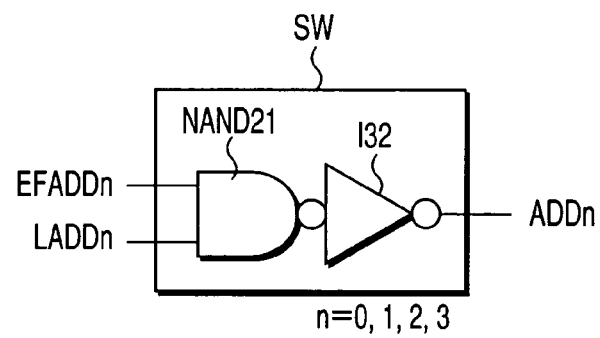
F I G. 30
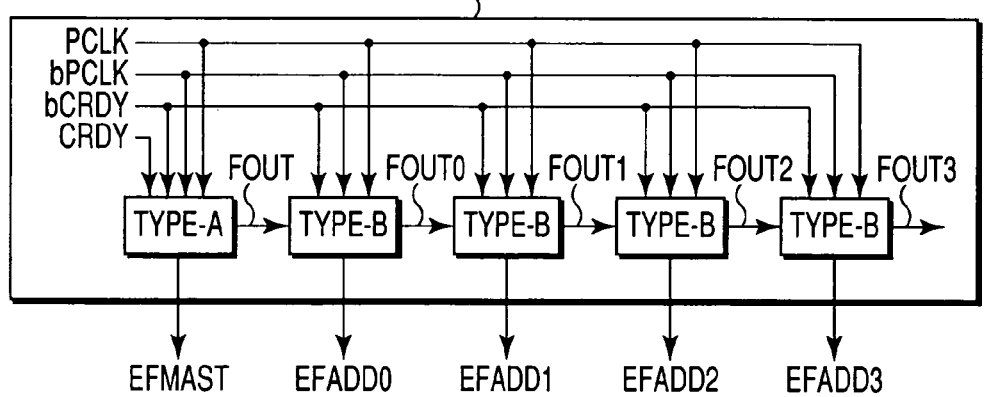
F I G. 31
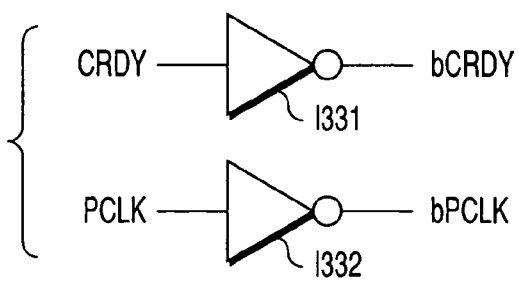
F I G. 32

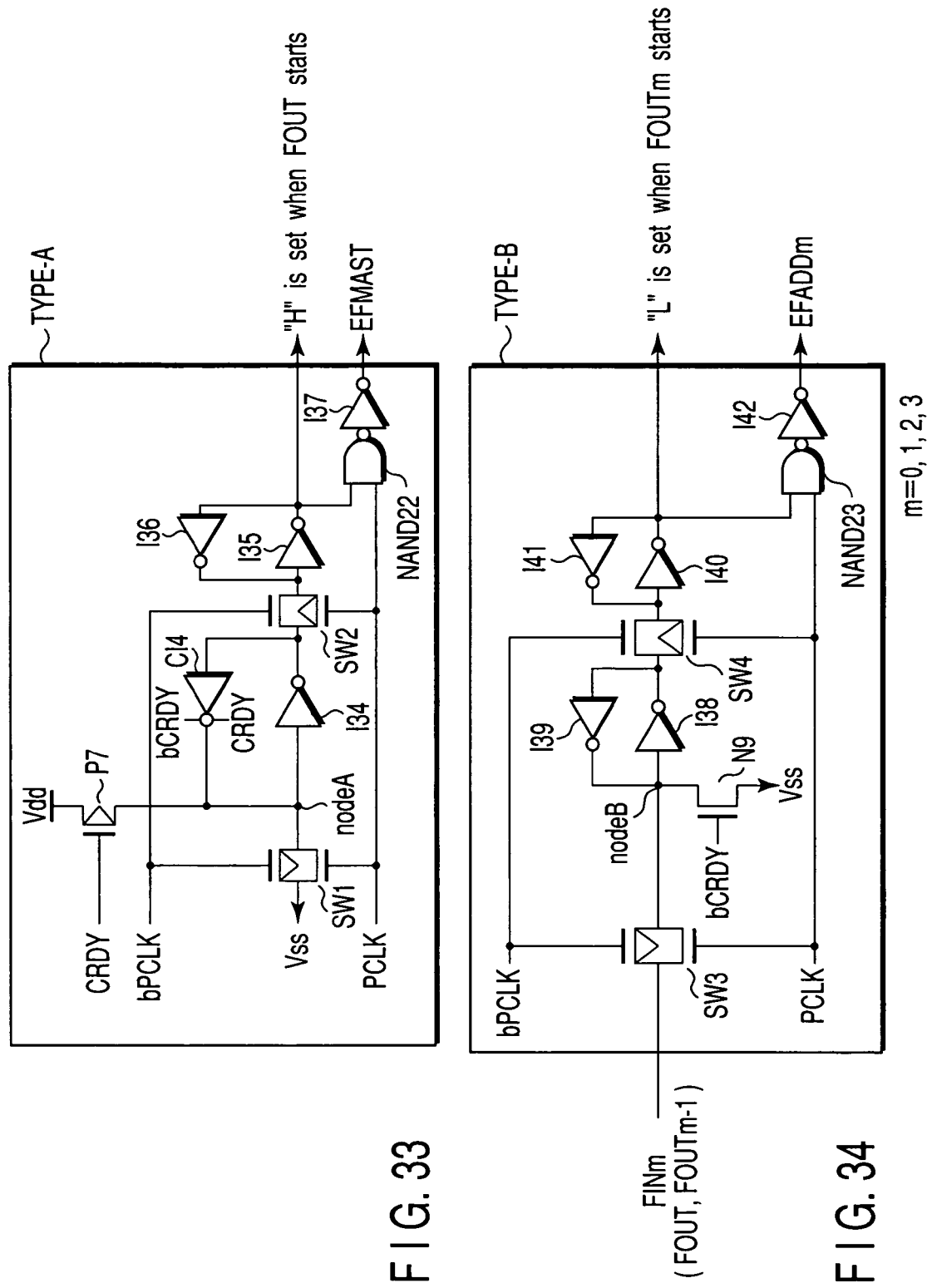
F I G. 33  F I G. 34

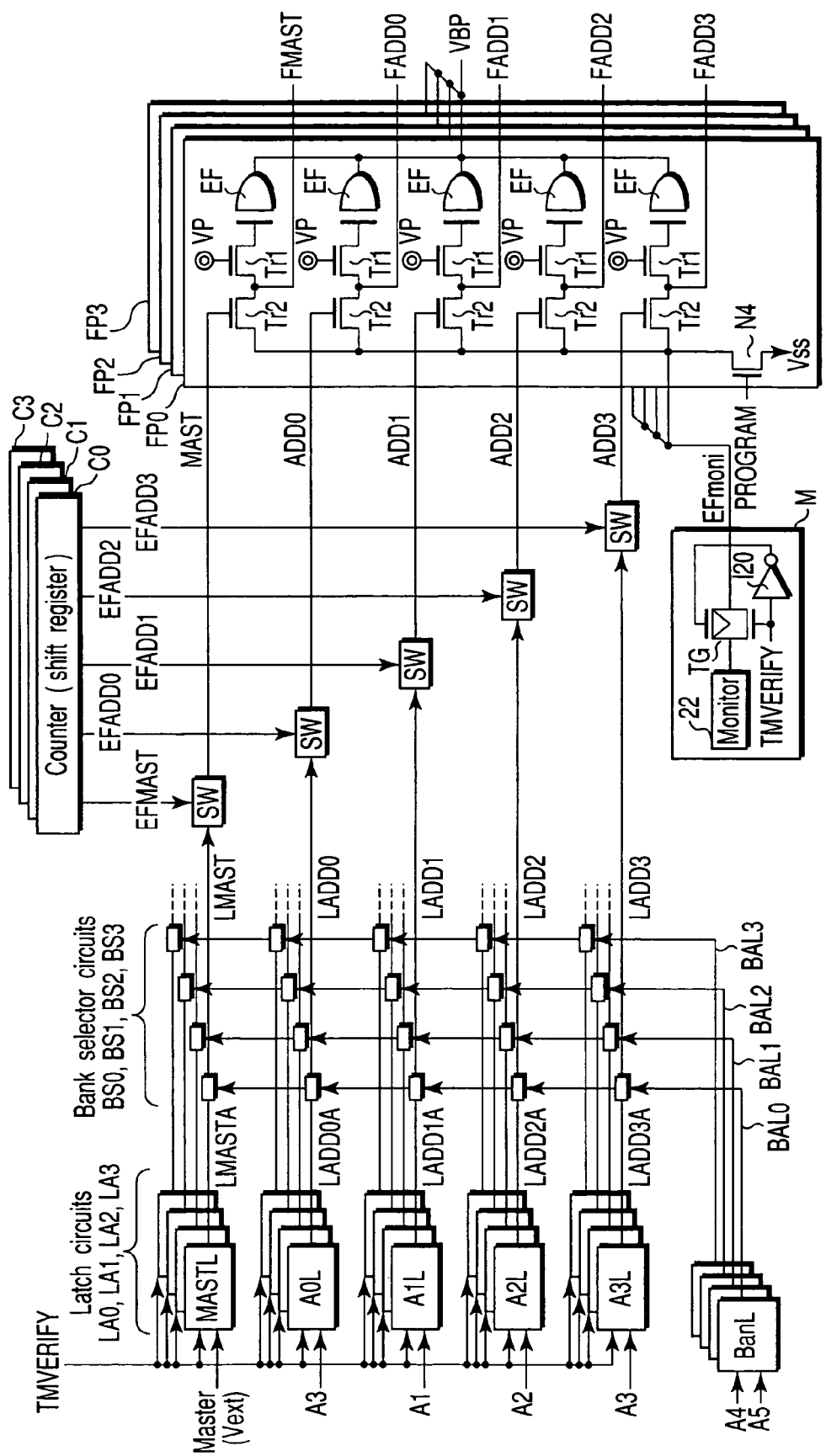
F I G. 40

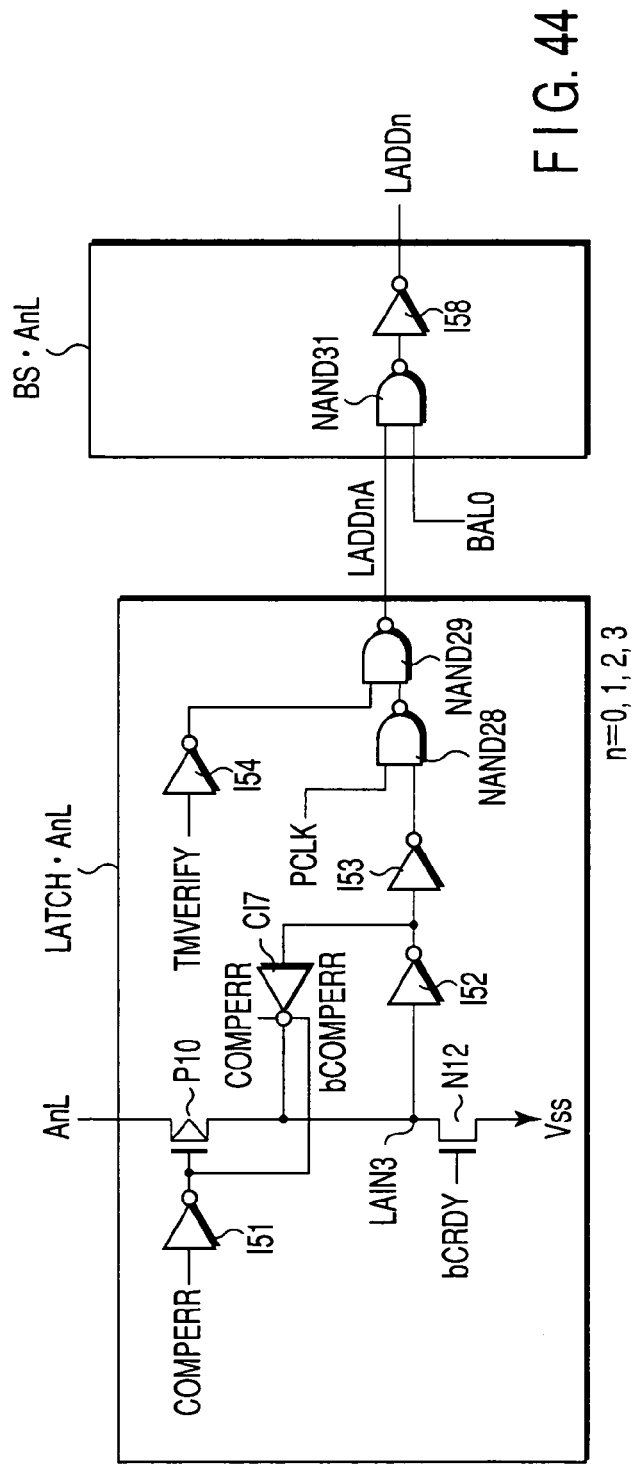
F I G. 44
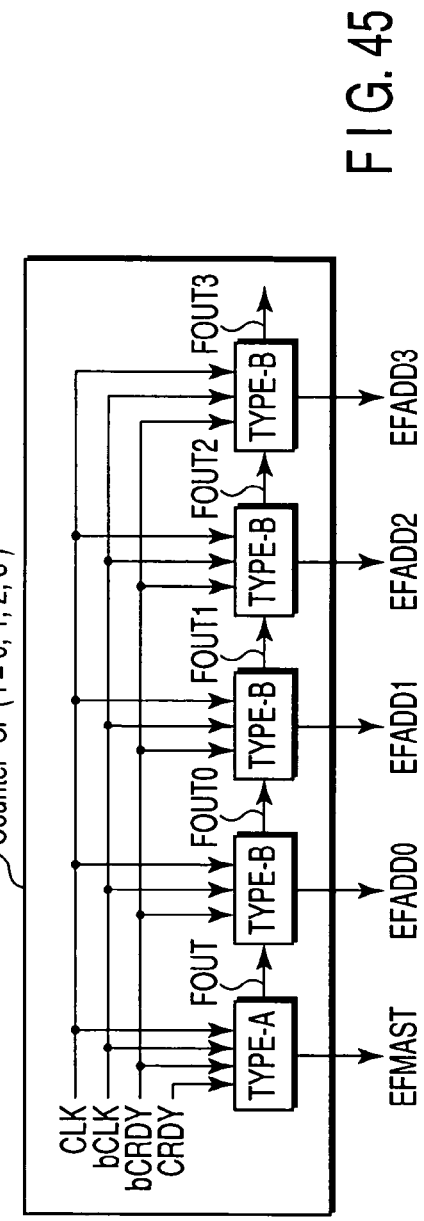
F I G. 45

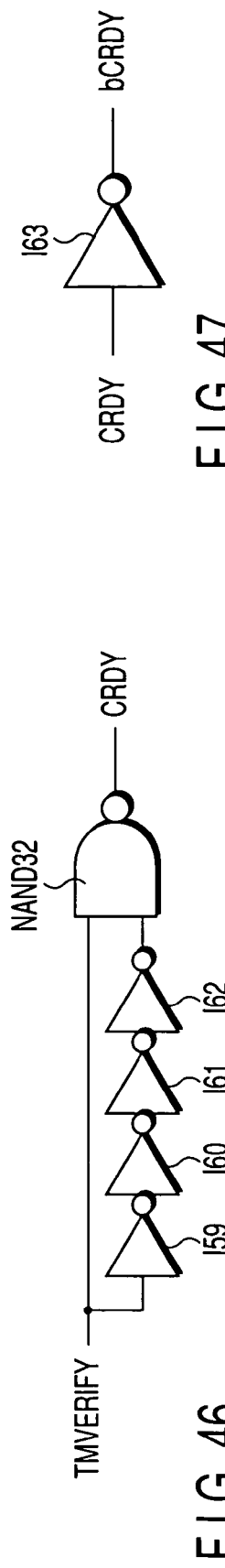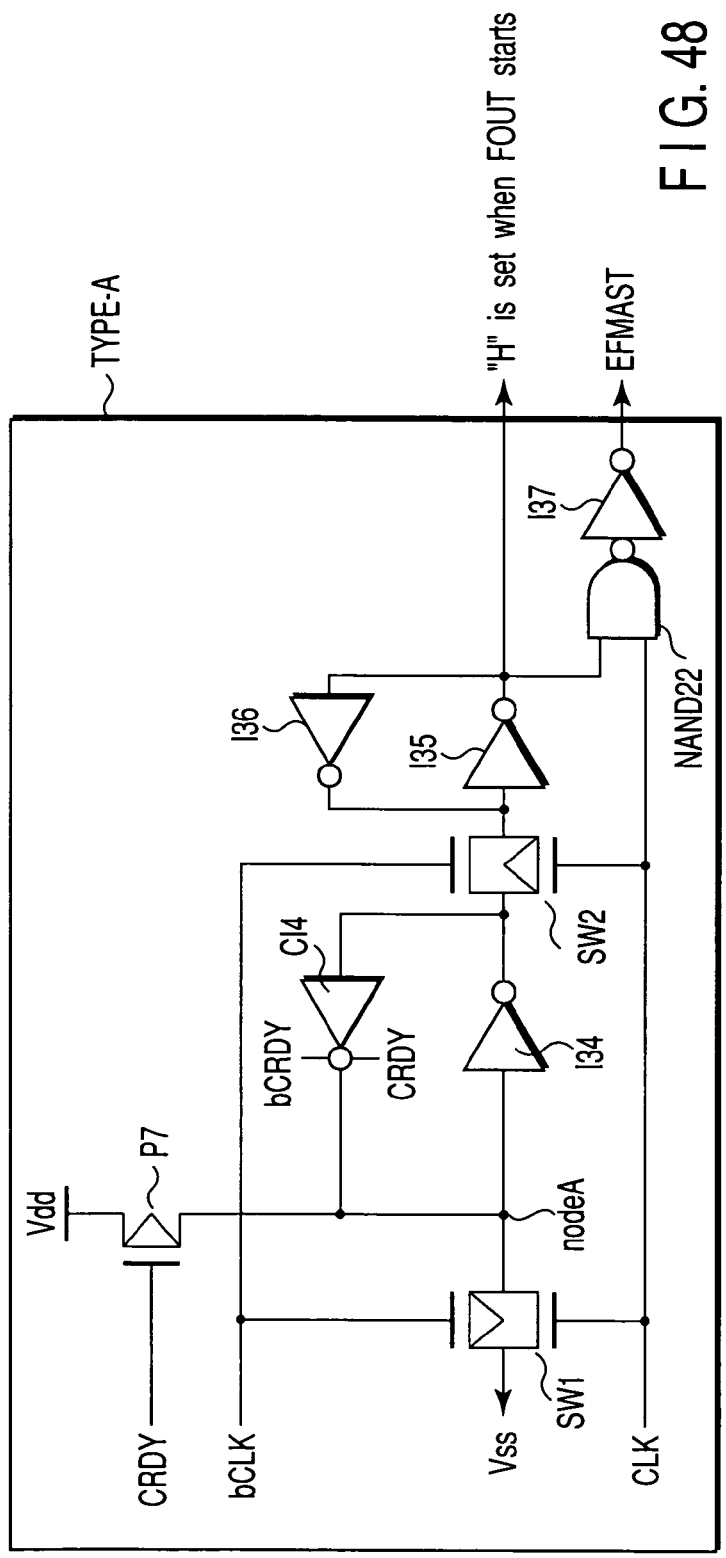

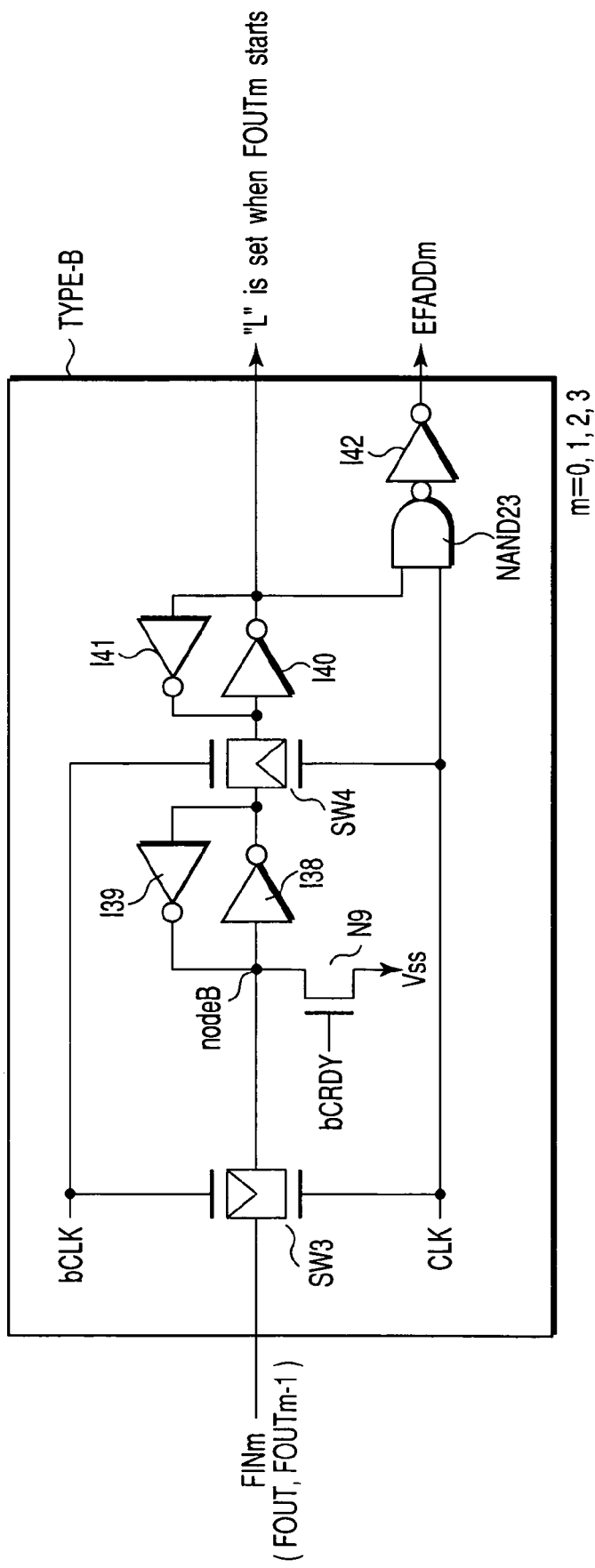
F I G. 49

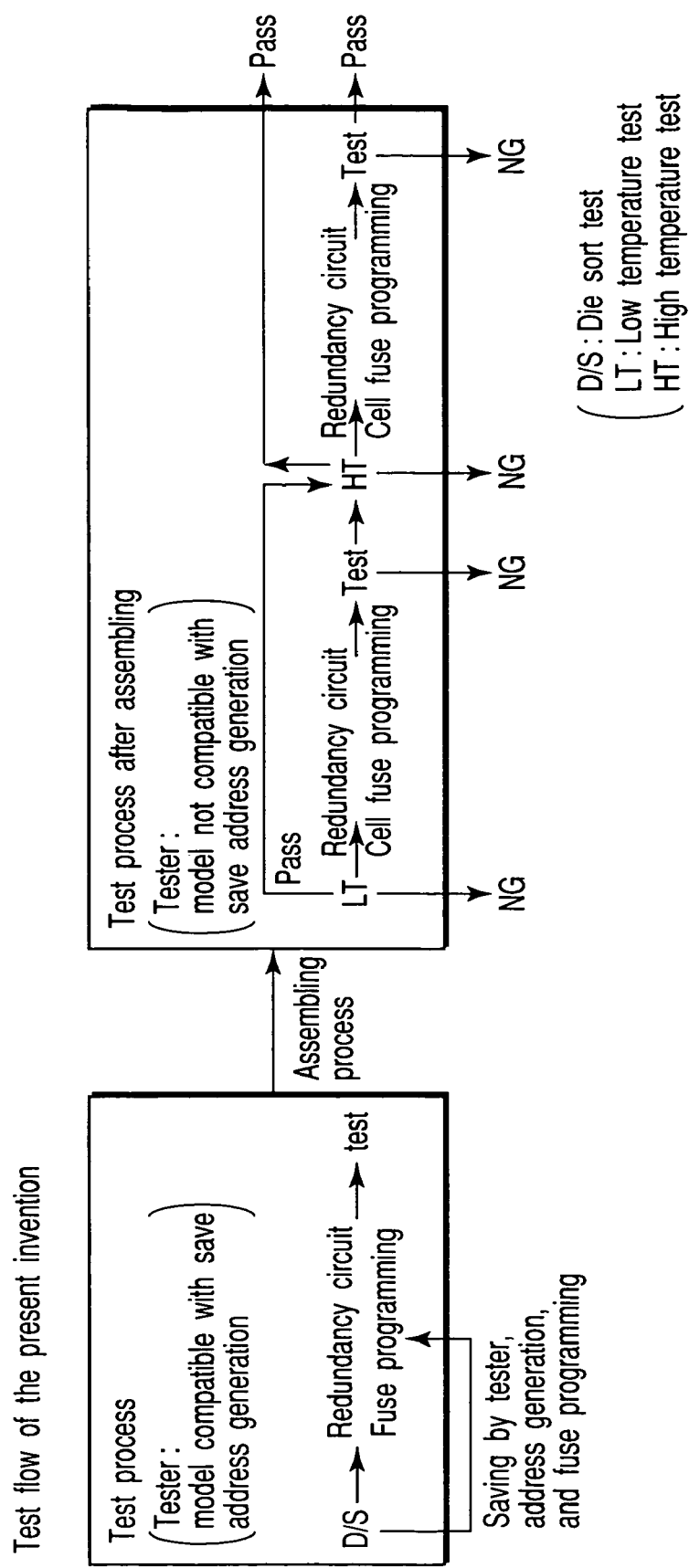
F I G. 51

SEMICONDUCTOR MEMORY WITH SELF FUSE PROGRAMMING

CROSS-REFERENCE TO RELATED APPLICATIONS

This application is based upon and claims the benefit of priority from the prior. Japanese Patent Application No. 2002-342897, filed Nov. 26, 2002, the entire contents of which are incorporated herein by reference.

BACKGROUND OF THE INVENTION

1. Field of the Invention

The present invention relates to a semiconductor memory in which a save address is stored in an electrically writable fuse (E-Fuse).

2. Description of the Related Art

In general, a semiconductor memory comprises a redundancy circuit for replacing a spare cell a faulty cell which has been judged to be faulty by testing in order to improve the yield of products. This replacement is achieved by programming an address of a faulty cell, i.e., a save address in a fuse array after testing.

During normal operation, for example, if an external address which is identical to the save address stored in the fuse array is allocated to a chip, the spare cell is selected instead of the faulty cell. Thus, the faulty cell has been apparently saved, and the yield of products can be improved (for example, refer to Jpn. Pat. Appln. KOKAI Publication No. 2002-197889).

As a fuse array for storing a save address, there is generally known a laser fuse for breaking a fuse by using a laser beam. Because a program of the save address for the laser fuse uses a laser beam, such programming can be carried out only in a wafer state, and cannot be carried out after an assembling process.

In recent years, there has been developed a semiconductor memory in which an address of a faulty cell which has been faulty in a test after the assembling process is programmed for a fuse array, and the fuse array is composed of an electrically writable fuse (hereinafter, referred to as an electrical fuse) in order to further improve the yield of products.

FIG. 1 shows essential portions of a conventional semiconductor memory comprising an electrical fuse.

A memory cell array 11 is allocated in a chip 10. The memory cell array 11 may be one of a plurality of memory blocks (for example, a bank). In this embodiment, the memory cell array 11 is assumed to include some of the periphery circuits such as a decoder, a sense amplifier, and a read/write circuit.

An external input/output terminal (DQ terminal) 12 is provided as an element for capturing write data in the chip 10 and for outputting read data to the outside of the chip. An input circuit 14A transfers to the memory cell array 11 the write data provided to the external input/output terminal 12. An output circuit 17A transfers to the external input/output terminal 12 the read data read out from the memory cell array 11.

An external input terminal (address terminal) 19A is provided as an element for capturing row/column address data in the chip 10 during normal operation and during testing. The row/column address data is provided to the memory cell array 11, and is used to select a memory cell.

In addition, during fuse programming after testing, for example, data A0 to A4 required for programming a save address in a fuse array are produced by a tester. The data A0 to A4 are supplied into the chip 10 via the external input terminal 19A.

The data A0 to A4 are provided to a decoder circuit DCi. The decoder circuit DCi decodes the data A0 to A4, and generates fuse program data D0 to D19. The fuse program data D0 to D19 determine a fuse targeted for fuse blowing.

A fuse program circuit FPi comprises a fuse array including a plurality of electrical fuses. The fuse program circuit FPi electrically breaks a capacitor insulating film of one electrical fuse (for example, capacitor) in a fuse array determined by the fuse program data D0 to D19. Finally, master data (1 bit) FMAST and save address data (a plurality of bits) FADDn are programmed for the fuse array.

The master data FMAST is provided as data for determining whether the fuse program circuit FPi is valid or invalid. In the case where the master data FMAST indicates that the fuse program circuit FPi is valid, the save address data FADDn programmed for the fuse program circuit FPi is valid.

A monitor circuit M is provided as a circuit for detecting whether or not the master data FMAST and save address data FADDn have been precisely programmed for the fuse array.

During normal operation, the fuse program circuit FPi outputs the master data FMAST and save address data FADDn. A redundancy circuit 21 compares the save address data FADDn with external address data in the case where the master data FMAST indicates that the fuse program circuit FPi is valid.

When both of the data coincide with each other, the redundancy circuit 21 outputs a replacement signal "Rep". The memory cell array 11 selects a spare cell instead of a faulty cell upon the receipt of the replacement signal "Rep".

The chip 10 includes a memory chip, an IC chip comprising a memory cell array, for example, a memory mixed IC chip, or a system LSI chip, etc. The type of the memory is not limited. This chip includes all memories such as DRAM, SRAM, FeRAM, MRAM, ROM, and flash memory.

Now, a description will be given with respect to examples of the decoder circuit DCi, fuse program circuit FPi, and monitor circuit M shown in FIG. 1.

In order to ensure clarity, presupposition is defined as follows. Four banks (memory cell array) are allocated in one chip 10. One decoder circuit DCi, one fuse program circuit FPi, and one redundancy circuit 21 are provided for one bank. One bank consists of, for example, a 16-row and 16-column matrix shaped memory cell array, and save address data FADD0 to FADD3 are composed of 4 bits.

FIG. 2 shows an example of the decoder circuit DCi (i=0, 1, 2, 3), and FIG. 3 shows examples of the fuse program circuit FPi (i=0, 1, 2, 3) and the monitor circuit M.

Four decoder circuits DC0, DC1, DC2, and DC3 exist corresponding to four banks 0, 1, 2, and 3, and four fuse program circuits FP0, FP1, FP2, and FP3 exist corresponding to four banks 0, 1, 2, and 3.

The data A0 to A4 generated by a tester (address data during fuse programming) are inputted to the decoder circuits DC0, DC1, DC2, and DC3.

The decoder circuit DC0 corresponding to bank 0 outputs fuse program data (decode signals) D0 to D4. The fuse program data D0 to D4 are inputted to a fuse program circuit FP0 which corresponds to bank 0.

The decoder circuit DC1 corresponding to bank 1 outputs fuse program data (decode signals) D5 to D9. The fuse program data D5 to D9 are inputted to a fuse program circuit FP1 which corresponds to bank 1.

The decoder circuit DC2 corresponding to bank 2 outputs fuse program data (decode signals) D10 to D14. The fuse program data D10 to D14 are inputted to a fuse program circuit FP2 which corresponds to bank 2.

The decoder circuit DC3 corresponding to bank 3 outputs fuse program data (decode signals) D15 to D19. The fuse program data D15 to D19 are inputted to a fuse program circuit FP3 which corresponds to bank 3.

As shown in Table 1, one of the fuse program data (decode signals) D0 to D19 is set to "H" in response to values of the data A0 to A4 generated by a tester.

In FIG. 3, "1" is set in the case where the capacitor insulating film of the electrical fuse EF has been broken (in a conductive state), and "0" is set in the case where the film is not broken (in a non-conductive state). A circuit for reading out master data (1 bit) FMAST and save address data (4 bits) FADD0 to FADD3 is not shown.

In examples of FIGS. 2 and 3, a save address is generated by a tester (device type compatible with save address generation). In this case, the tester comprises a function for testing all the memory cells which configure a memory cell array and a function for representing an address of a memory cell which has been determined to be faulty on a map (Fail

TABLE 1

| | | | | | Position of EF to be broken (programmed) | | | | | | | | | | | | | | | |
|---|---|---|---|---|---|---|---|---|---|---|---|---|---|---|---|---|---|---|---|---|
| | | Bank 0 | | | | | Bank 1 | | | | | Bank 2 | | | | | Bank 3 | | | |
| Decode signal set to "H" | MAST D0 | A0 D1 | A1 D2 | A2 D3 | A3 D4 | MAST D5 | A0 D6 | A1 D7 | A2 D8 | A3 D9 | MAST D10 | A0 D11 | A1 D12 | A2 D13 | A3 D14 | MAST D15 | A0 D16 | A1 D17 | A2 D18 | A3 D19 |
| Data         A0 | 0 | 1 | 0 | 1 | 0 | 1 | 0 | 1 | 0 | 1 | 0 | 1 | 0 | 1 | 0 | 1 | 0 | 1 | 0 | 1 |
| (address)    A1 | 0 | 0 | 1 | 1 | 0 | 0 | 1 | 1 | 0 | 0 | 1 | 1 | 0 | 0 | 1 | 1 | 0 | 0 | 1 | 1 |
| generated    A2 | 0 | 0 | 0 | 0 | 1 | 1 | 1 | 1 | 0 | 0 | 0 | 0 | 1 | 1 | 1 | 1 | 0 | 0 | 0 | 0 |
| by tester    A3 | 0 | 0 | 0 | 0 | 0 | 0 | 0 | 0 | 1 | 1 | 1 | 1 | 1 | 1 | 1 | 1 | 0 | 0 | 0 | 0 |
|              A4 | 0 | 0 | 0 | 0 | 0 | 0 | 0 | 0 | 0 | 0 | 0 | 0 | 0 | 0 | 0 | 0 | 1 | 1 | 1 | 1 |

Now, a specific example will be described here.

For example, assume that, as a result of testing, a faulty cell exists in bank 0, and the faulty addresses (save addresses) A0, A1, A2, and A3 are "0", "0", "0", and "1". The save address may be a row address (row save) or may be a column address (column save).

First, during fuse programming after testing, the address data A0, A1, A2, A3, and A4 generated by a tester are limited to "0", "0", "0", "0", and "0". In this case, as shown in Table 1, only data D0 of the fuse program data D0 to D19 is set to "H".

As a result, MAST in the fuse program circuit FP0 of FIG. 3 is set to "H", and an N-channel MOS transistor Tr2 in which MAST is to be inputted to a gate is set to an ON state. An N-channel MOS transistor Tr1 is provided as a barrier transistor for mitigating a high voltage, and is always in an ON state.

Therefore, a high voltage is applied to an electrical fuse (for example, capacitor) EF associated with FMAST; a capacitor insulating film of the electrical fuse EF is broken, and the fuse program circuit FP0 is valid.

Next, the address data A0, A1, A2, A3, and A4 generated by a tester are set to "0", "0", "1", "0", and "0". In this case, as shown in Table 1, only data D4 of the fuse program data D0 to D19 is set to "H".

As a result, A3 in the fuse program circuit FP0 of FIG. 3 is set to "H", and the N-channel MOS transistor Tr2 in which A3 is to be inputted to a gate is set to an ON state. The N-channel MOS transistor Tr1 is provided as a barrier transistor for mitigating a high voltage, and is always in an ON state.

Therefore, a high voltage is applied to an electrical fuse (for example, capacitor) EF associated with FADD3, and a capacitor insulating film of the electrical fuse EF is broken.

Due to the above fuse programming operation being operated twice, "0", "0", "0", and "1" are programmed as save addresses A0, A1, A2, and A3 in the fuse program circuit FP0.

Address Map: FAM), and obtaining a save address (save solution) for saving a faulty cell most effectively.

When a save address is programmed for the fuse program circuit FPi, in this example, the decoder circuit DCi of FIG. 2 is provided in a chip in order to reduce the number of external terminals used for the programming. That is, when the decoder circuit DCi is used, the number of external terminals may be 5 (A0 to A4). When the decoder circuit DCi is not used, the number of external terminals must be equal to at least the number of fuses (20).

FIG. 4 shows an example of specific operating waveform during fuse programming.

This operating waveform is provided as an example of programming "0", "0", "0", and "1" as the save addresses A0, A1, A2, and A3 with respect to bank 1.

First, a fuse program signal (fuse program entry number) PROGRAM is set to "H", and a fuse program mode is established. At this time, an N-channel MOS transistor N4 in the fuse program circuit FPi of FIG. 3 is set to an ON state. In addition, a VBP level (electrical potential) is set at a value which is sufficiently large for fuse breakage.

The VBP level is set at a value which is sufficiently large only when the fuse program mode is established in order to ensure low power consumption during chip operation. When VBP is not used, for example, a grounding electrical potential is set.

Next, FMAST programming is carried out.

In synchronism with a fall edge of a row address strobe signal/RAS (a turning point from "H" to "L"), the address signals A0 to A4 generated by a tester are captured in the decoder circuit DCi of FIG. 2. The address signals A0 to A4 are obtained as "1", "0", "1", "0", and "0". As shown in Table 1, a decode signal D5 corresponding to FMAST in bank 1 is set to "H".

Because of this, VBP is provided at one end of only an electrical fuse EF which corresponds to FMAST in bank 1, and a grounding electrical potential is provided at the other end of the fuse. As a result, a remarkable difference in electrical potential occurs at both ends of the capacitor insulating film of the electrical fuse (for example, capacitor) EF which corresponds to FMAST in bank 1, the capacitor insulating film is broken, and "1" (=valid)" is programmed.

Next, FADD3 programming is carried out.

Here, "0" is programmed with respect to FADD0 to FADD2. However, an initial state (an unbroken state) of the electrical fuse EF is set to "0". Therefore, there is no need to carry out fuse programming with respect to FADD0 to FADD2.

In synchronism with the fall edge of the row address strobe signal/RAS (the turning point from "H" to "L"), the address signals A0 to A4 generated by a tester are captured in the decoder circuit DCi of FIG. 2. The address signals A0 to A4 are obtained as "1", "0", "0", "1", and "0". As shown in Table 1, a decode signal D9 corresponding to ADD3 in bank 1 is set to "H".

Because of this, VSP is provided at one end of only an electrical fuse EF which corresponds to FADD3 in bank 1, and a grounding electrical potential is provided to the other end of the fuse. As a result, a remarkable difference in electrical potential occurs at both ends of the capacitor insulating film of the electrical fuse (for example, capacitor) EF which corresponds to FADD3 in bank 1, the capacitor insulating film is broken, and "1" is programmed.

In this example, one ends of all the electrical fuses EF are connected in common, and VBP (high electrical potential) is provided at one ends of the fuses. Therefore, fuse programming is carried out on one bit by one bit basis. In this example, at least one programming operation (FMAST=1 bit) and a maximum of 5 programming operations (FMAST+ADD0 to ADD3=5 bits) are carried out for one save address.

In general, after a save address has been programmed, verification for verifying whether or not the save address has been precisely programmed is executed.

A fuse programming operation is executed only for a fuse targeted for "1"-programming, because the initial state of the electrical fuse is set to "0", as described above.

In contrast, a verifying operation is provided to verify whether or not the save address has been precisely programmed. Thus, for example, all the electrical fuses (FMAST, FADD0 to FADD3) are programmed sequentially on one bit by one bit basis.

In this case, the verifying operation starts from FMAST of bank 0, for example, advances in ascending order of FADD0, FADDS1, FADD2, and FADD3 of bank 0, and further, advances in ascending order of bank 1, bank 2, and bank 3.

In verification relevant to an electrical fuse for which "1"-programming has been executed, when EFmoni is set to "H", programming OK is produced. When it is set to "L", programming NG is produced. In verification relevant to an electrical fuse for which "1"-programming has not been executed, when EFmoni is set to "L", programming OK is produced. When it is set to "H", programming NG is produced.

In the case where one monitor circuit is provided for one bank, verification operations in a plurality of banks can be executed in parallel. In addition, in the case where only one monitor circuit is provided for a plurality of banks, the verifying operations are carried out sequentially on a one bank by one bank basis.

Verifying operation is eventually carried out as verification of "1"-programming relevant to an electrical fuse. Therefore, the verifying operation may be targeted for only an electrical fuse for which "1"-programming has been carried out instead of carrying out the above operation for all the electrical fuses.

In this case, when "1"-programming is OK, a current path from VBP to Vss is produced via the electrical fuse EF and transistors Tr1, Tr2, and Tr3. On the other hand, when "1"-programming is NG, no fuse is broken, and thus, such a current path is not produced.

According to a verifying operation targeted for only an electrical fuse for which "1"-programming has been carried out, an address used during fuse programming may be allocated from a tester to a chip again. Therefore, the verifying operation can be carried out simply and within a short time.

FIG. 5 shows an example of operating waveform when a save address is verified.

This operating waveform relates to a verifying operation targeted for only the electrical fuse for which "1"-programming has been carried out.

First, a test mode verify signal TMVERIFY is set to "H", and a verify mode is established. At this time, a transfer gate TG in the monitor circuit M of FIG. 3 is set to an ON state. In addition, a VBP level (electrical potential) is set to "H", for example, a power supply potential Vdd.

The VBP level is set to "H" only when the verify mode is established in order to ensure low power consumption during chip operation. When VBP is not used, for example, a grounding electrical potential is set.

First, verification of FADD0 in bank 0 will be described here.

In synchronism with the fall edge of the row address strobe signal/RAS, the address signals A0 to A4 generated by a tester are captured in the decoder circuit DCi of FIG. 2. The address signals A0 to A4 are obtained as "1", "0", "0", "0", and "0". As shown in Table 1, a decode signal D1 corresponding to FADD0 in bank 0 is set to "H".

Because of this, VBP is provided at one end of only an electrical fuse EF which corresponds to FADD0 in bank 0, and a grounding electrical potential is provided at the other end of the fuse. As a result, the value of EFmoni changes according to a state of the electrical fuse EF which corresponds to FADD0 in bank 0.

For example, "0"-programming has been executed for an electrical fuse associated with FADD0 in bank 0.

In this case, as shown in the figure, when no current iPD flows and EFmoni is set to "L", the fuse associated with FADD0 in bank 0 is not broken. Thus, it is possible to check that "0" has been precisely programmed. On the other hand, when a current iPD flows and EFmoni is set to "H", the fuse associated with FADD0 in bank 0 is broken. Thus, "1" is assumed to have been mistakenly programmed.

Now, verification of FMAST in bank 1 will be described here.

In synchronism with the fall edge of the row address strobe signal/RAS, the address signals A0 to A4 generated by a tester are captured in the decoder circuit DCi of FIG. 2. The address signals A0 to A4 are obtained as "1", "0", "1", "0", and "0". As shown in Table 1, a decode signal D5 corresponding to FMAST in bank 1 is set to "H".

Because of this, VBP is provided at one end of only an electrical fuse EF which corresponds to FMAST in bank 1, and a grounding electrical potential is provided at the other end of the fuse. As a result, the value of EFmoni changes according to a state of the electrical fuse EF which corresponds to FMAST in bank 1.

For example, "1"-programming has been executed for the electrical fuse associated with FMAST in bank 1.

In this case, as shown in the figure, in the case where a current iPD flows and EFmoni is set to "H", the fuse associated with FMST in bank 1 is broken. Thus, it is possible to check that "1" has been precisely programmed. On the other hand, in the case where no current iPD flows and EPmoni is set to "L", the fuse associated with FMAST in bank 1 is not broken. Thus, "0" is assumed to have been mistakenly programmed.

FIG. 6 shows a test flow when a laser fuse is used.

In this case, in a test process at a wafer stage, for example, in a die sort test D/S, testing is executed by a tester capable of producing a save address. During save address programming, fuse breakage is executed by a laser machine. Then, it is tested whether or not a faulty cell has been precisely replaced with a spare cell.

In the case where the laser fuse is used, saving of a faulty cell can be carried out only at the wafer stage, and cannot be carried out after an assembling process. Testing at the wafer stage is carried out only under the condition of a predetermined temperature (for example, only at a high temperature) in view of a relation with a test time. In addition, a signal cable for transmitting a tester signal to a chip is too long to carry out testing for high speed operation. Therefore, when a faulty cell has been produced during a test process after the assembling process, for example, during a low temperature test LT, a high temperature test HT or the like, even if a faulty cell is produced, such a faulty cell cannot be saved.

FIG. 7 shows a test flow when an electrical fuse is used.

In this case, in a test process at a wafer stage, for example, in a die sort test D/S, testing is executed by a tester capable of producing a save address in the same manner as when a laser fuse is used. However, save address programming can be electrically carried out without a laser machine.

Therefore, a process for moving a wafer to a laser machine is eliminated, and thus, wafer touching up to the assembling process can be reduced. This means improved efficiency in manufacturing a semiconductor memory.

Then, a test process is carried out for whether or not a faulty cell has been precisely replaced with a spare cell.

In the case where the electrical fuse is used, saving of a faulty cell can be carried out after the assembling process. For example, in a test process after the assembling process, for example, during a low temperature test LT, a high temperature test HT or the like, testing is executed by means of a test capable of producing a save address. Then, save address programming is electrically executed, and the yield of products can be improved.

However, in a test flow using a conventional electrical fuse, save addresses (save solutions) must be obtained on a test by test basis. In addition, this save address must be obtained by a tester incorporating a FAM (Fall Address Map) function, for example. The tester incorporating the FAM function is very expensive. If this tester is used, a testing cost cannot be reduced.

In testing chips after the assembling process, a plurality of chips are tested at the same time. During one test, there is almost no case in which save addresses coincide with each other in all the chips targeted for testing. That is, for the chips after the assembling process, fuse programming operation is individually carried out on a chip by chip basis.

A tester cannot execute an operation for carrying out a test and producing a save solution during a period in which fuse programming operation is in progress. As a result, a FAM function cannot be used during the period.

Namely, in the conventional technique, an expensive tester incorporating a FAM function must be used. Further, there is a problem that this expensive tester cannot be used efficiently.

In the meantime, a bit failure such as short-circuit between bit lines primarily causes a faulty memory cell after the assembling process. The failure rate of bit failure is prone to increase as items are produced at a higher speed operation.

It is realistically impossible to detect such a bit failure during a die sort test at a wafer stage for one of the reasons stated below.

<1> Test strength or sensitivity must be increased;
<2> A large amount of die sort time is required; and
<3> The lowered yield due to overkill is considered.

A bit failure must be saved in a test process after the assembling test.

If at least a failure of a memory cell which occurs after such an assembling process can be saved without using an expensive tester incorporating FAM, it is very effective for improvement of test efficiency and lowering a test cost.

BRIEF SUMMARY OF THE INVENTION

A semiconductor memory according to an aspect of the present invention comprises: an error detector circuit which, based on first data read out from a memory cell and second data provided to an external input terminal, determines whether the memory cell is good or faulty; and a self fuse program circuit which, in the case where the memory cell is faulty, programs address data for the memory cell as save address data in an electrical fuse.

A method for programming a save address according to an aspect of the present invention comprises: based on first data read out from a memory cell and second data provided to an external input terminal, determining whether the memory cell is good or faulty; and in the case where the memory cell is faulty, programming address data for the memory cell as save address data in an electrical fuse.

BRIEF DESCRIPTION OF THE SEVERAL VIEWS OF THE DRAWING

FIG. 8 is a block diagram depicting essential portions of a semiconductor memory according to a first embodiment of the present invention;

FIG. 9 is a block diagram depicting an example of an error detector circuit;

FIG. 16 is a waveform diagram depicting operations of the pseudo read controller circuits of FIGS. 14 and 15;

FIG. 20 is a circuit diagram depicting an example of a self fuse program circuit;

FIG. 25 is a circuit diagram depicting an example of a master data latch circuit;

FIG. 26 is a circuit diagram depicting an example of a save address data latch circuit;

FIG. 27 is a circuit diagram depicting an example of a PCLK generator circuit;

FIG. 29 is a circuit diagram depicting an example of a switch circuit;

FIG. 30 is a circuit diagram depicting an example of a switch circuit;

FIG. 31 is a circuit diagram depicting an example of a counter;

FIG. 32 is a circuit diagram depicting an example of a bCRDY/bPCLK generator circuit;

FIG. 33 is a circuit diagram depicting an example of constituent element TYPE-A of the counter;

FIG. 34 is a circuit diagram depicting an example of constituent element TYPE-B of the counter;

FIG. 40 is a circuit diagram depicting an example of a self fuse program circuit;

FIG. 44 is a circuit diagram depicting an example of a save address data latch circuit and a bank selector circuit;

FIG. 45 is a circuit diagram depicting an example of a counter;

FIG. 46 is a circuit diagram depicting an example of a CRDY generator circuit;

FIG. 47 is a circuit diagram depicting an example of a bCRDY generator circuit;

FIG. 48 is a circuit diagram depicting an example of constituent element TYPE-A of the counter;

FIG. 49 is a circuit diagram depicting an example of constituent element TYPE-B of the counter;

FIG. 51 is a view showing a test flow according to the present invention.

DETAILED DESCRIPTION OF THE INVENTION

Figure 1:
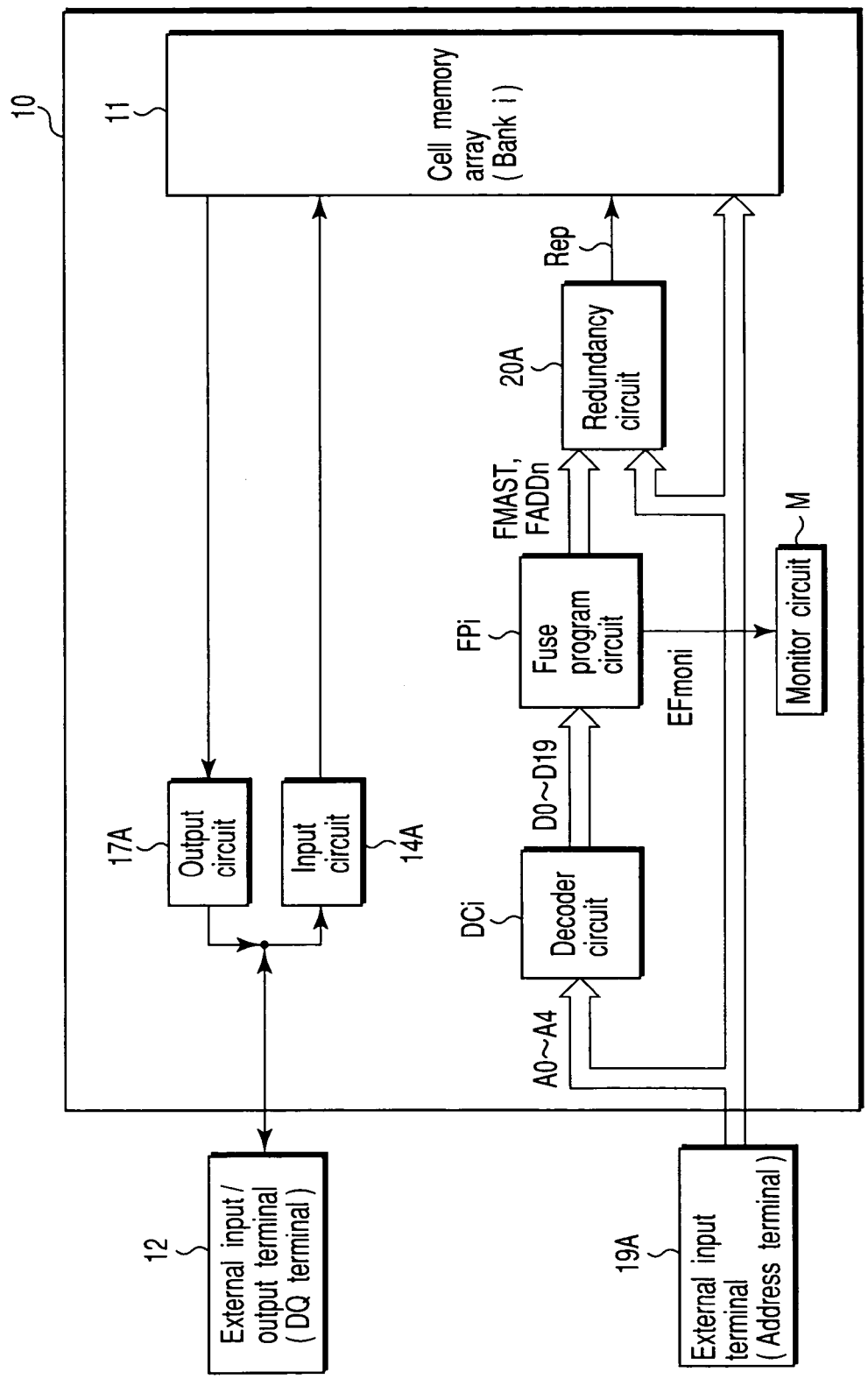
FIG. 1 is a block diagram depicting essential portions of a conventional semiconductor memory.
Figure 2:
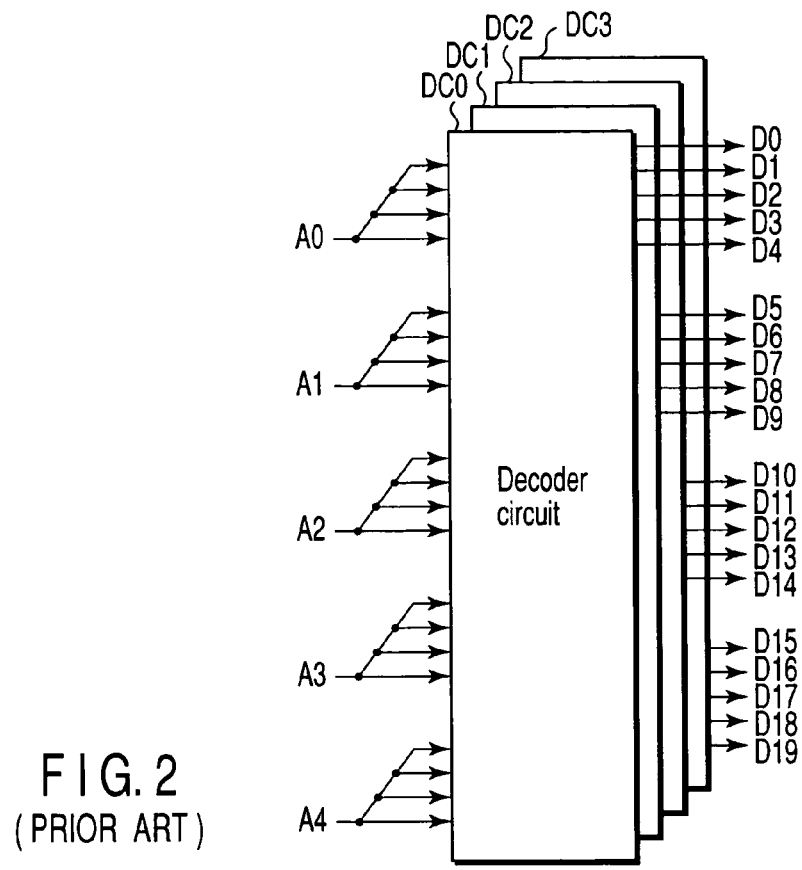
FIG. 2 is a circuit diagram showing an example of a decoder circuit.
Figure 4:
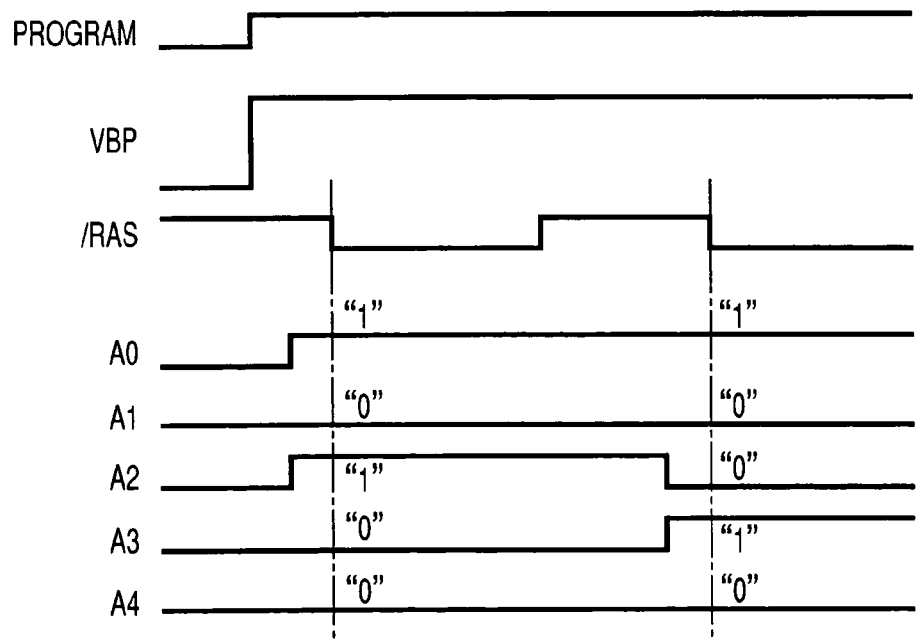
FIG. 4 is a waveform diagram depicting an operation of a semiconductor memory during fuse programming.
Figure 3:
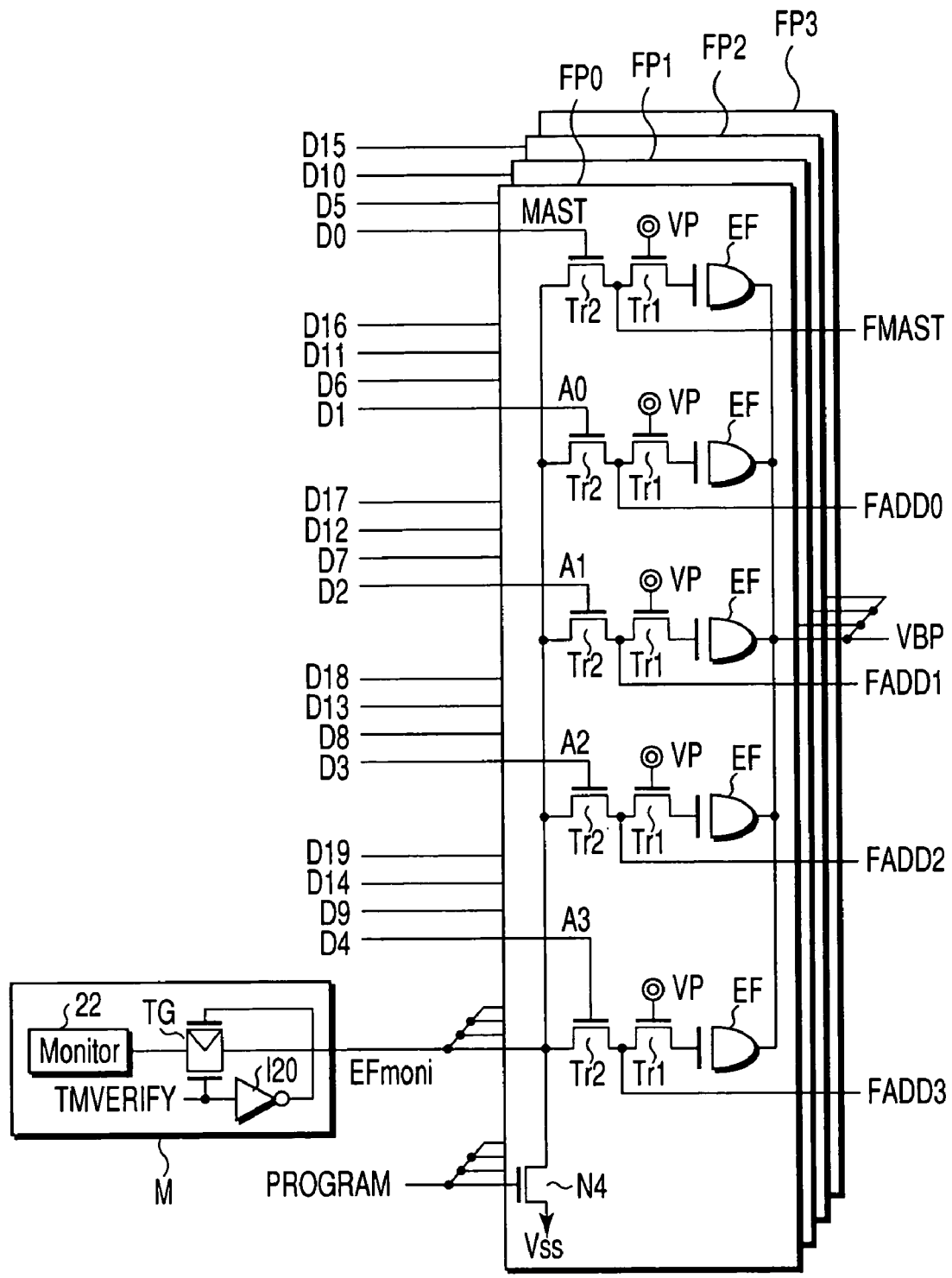
FIG. 3 is a circuit diagram depicting examples of a fuse program circuit and a monitor circuit.
Figure 5:
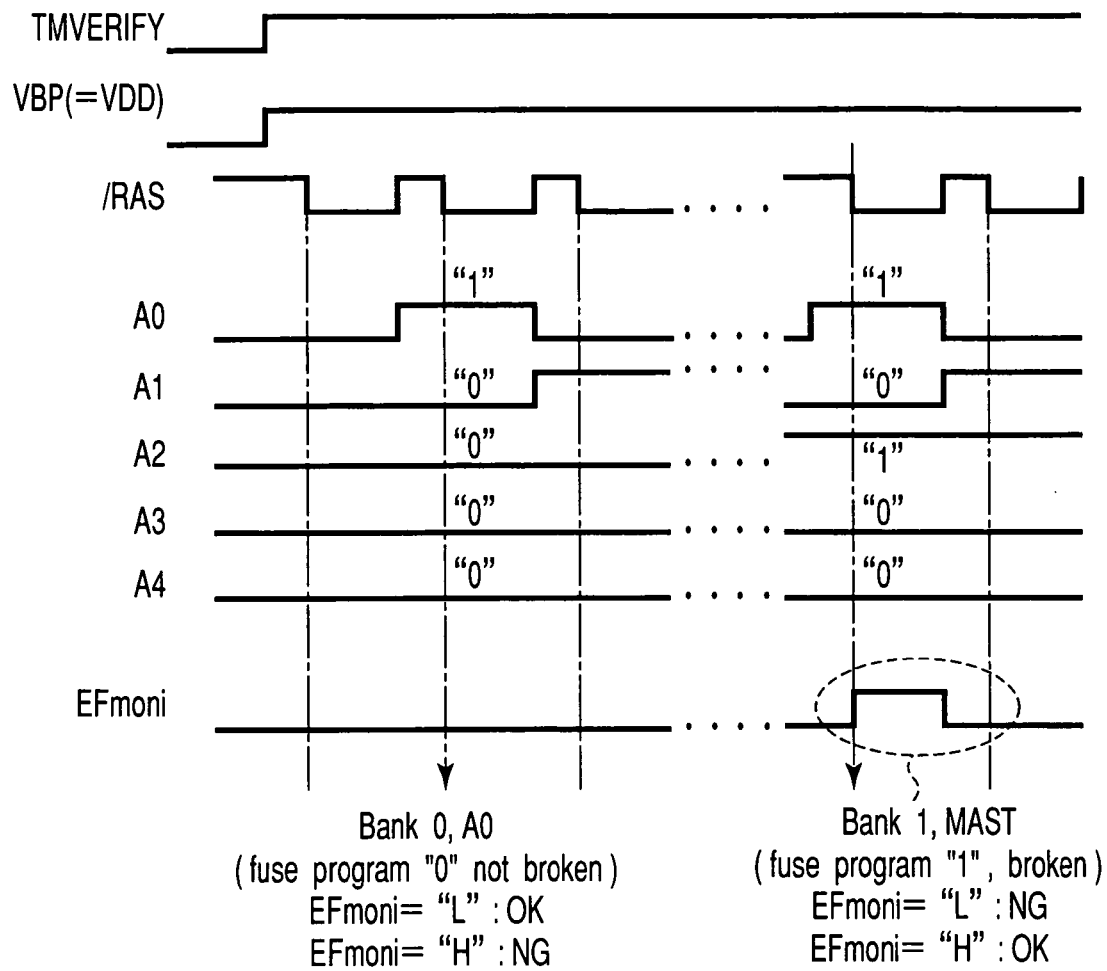
FIG. 5 is a waveform diagram depicting an operation of a semiconductor memory during fuse verification.
Figure 6:
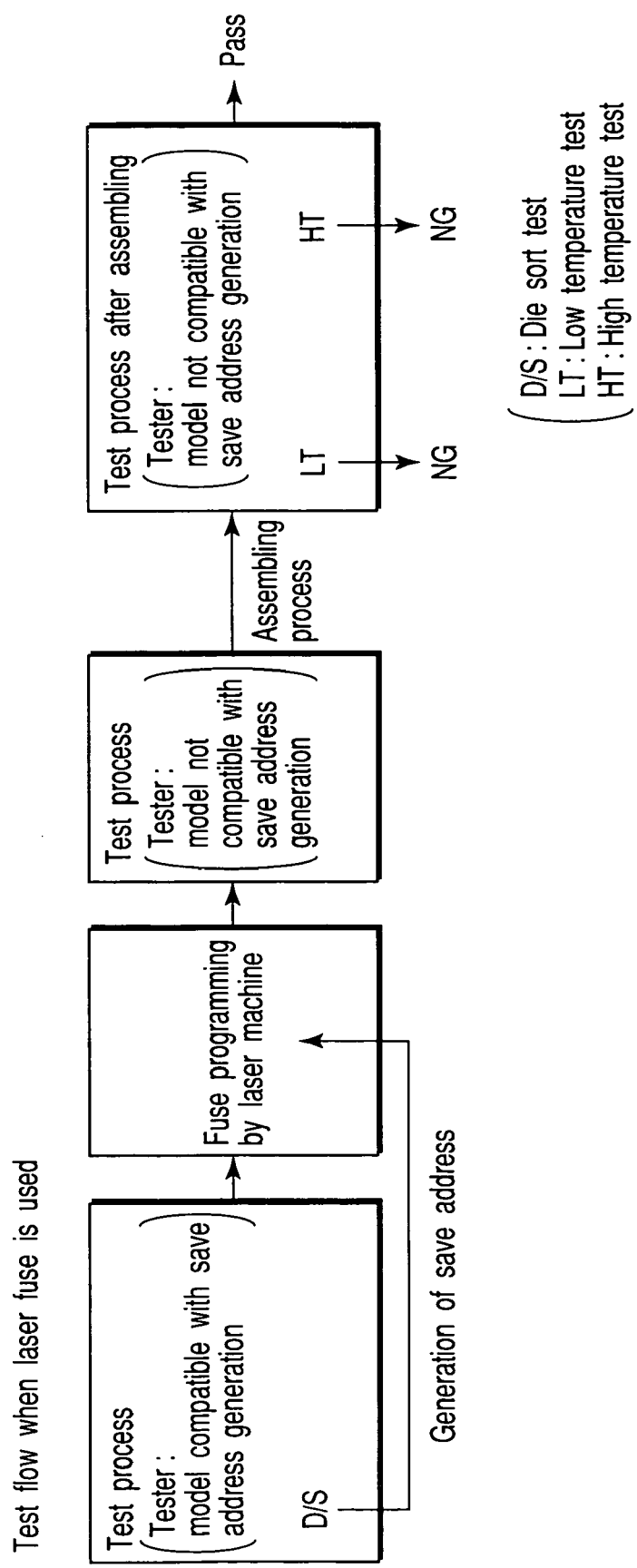
FIG. 6 is a view showing a test flow when a laser fuse is used.

A semiconductor memory of an aspect of the present invention will be described below in detail with reference to the accompanying drawings.

(1) Outline

The present invention proposes a semiconductor memory capable of carrying out programming of a save address without using an expensive tester incorporating an FAM for a memory cell failure, for example, a bit line failure, which occurs after an assembling process in which programming of the save address is often carried out individually on a chip by chip basis.

That is, in the semiconductor memory according to the present invention, a tester may have a function for generating a test address and test data. A save address (save solution) based on a test result is produced by the semiconductor memory itself, and programming of that save address is automatically carried out by the semiconductor memory itself (self fuse programming).

In this manner, there can be achieved improved test efficiency and lowered test cost of a test process associated with detection of a faulty cell and saving of that faulty cell (replacement of a faulty cell with a spare cell), i.e., programming of a save address.

Specifically, in the semiconductor memory according to the present invention, with respect to detection of a faulty cell, an error detector circuit for detection of a faulty cell is newly provided based on test data (write data) provided from a tester into a chip and read data read out from a memory cell in which programming of the test data has been carried out.

In addition, with respect to saving a faulty cell, a self fuse program circuit is newly provided in a chip. The self fuse program circuit comprises: a latch circuit for, when a faulty cell has been detected, latching an address of that faulty cell as a save address (save solution); and a fuse program circuit for programming that save address in an electrical fuse on one bit by one bit basis.

A monitor circuit for testing whether or not the save address is precisely programmed for an electrical fuse after programming the save address may be further provided in a chip.

In this manner, according to the present invention, detection of a faulty cell, generation of a save address (save solution), and programming of the save address are automatically carried out in a semiconductor memory, and thus, a test process can be carried out without using an expensive tester incorporating an FAM.

The present invention is primarily effective for a test process after an assembling process, and can be applied to a test process at a wafer stage.

(2) First Embodiment

Now, a semiconductor memory according to a first embodiment of the present invention will be described here.

<1> Overview

FIG. 8 shows essential portions of the semiconductor memory according to the first embodiment of the present invention. A memory cell array 11 is allocated in a chip 10. The memory cell array 11 may be one of a plurality of memory blocks (for example, a bank). In this example, the memory cell array 11 is assumed to include some of the peripheral devices such as a decoder, a sense amplifier, and a read/write circuit.

An external input/output terminal (DQ terminal) 12 is provided as an element for capturing program data in the chip 10 and outputting read data to the outside of the chip. An input circuit 14 transfers the program data provided to the external input/output terminal 12 to the memory cell array 11. An output circuit 17 transfers the read data read out from the memory cell array 11 to the external input/output terminal 12.

In this example, a pseudo read control circuit 15 is allocated between the memory cell array 11 and the input circuit 14, and a pseudo read control circuit 16 is provided between the memory cell array 11 and the output circuit 16. A comparator circuit 18 outputs a sense signal (latch signal) COMPERR based on output data "compW" and "compR" of the pseudo read control circuits 15 and 16.

The pseudo read control circuit 15 has a function for transferring program data provided to the external input/output terminal 12 to the memory cell array 11 during the write mode (including a write operation during the test mode), and transferring program data (expected value) provided to the external input/output terminal 12 to the comparator circuit 18 in an operation for inputting an expected value during the test mode (pseudo read cycle).

The input circuit 14 is activated such that it can transfer the program data provided to the external input/output circuit 12 to the pseudo read control circuit 15 in a write operation during the test mode and an operation for inputting an expected value during the test mode (pseudo read cycle).

The pseudo read control circuit 16 has a function for transferring the read data read out from the memory cell array 11 to the output circuit 17 during the read mode, and transferring the read data read out from the memory cell array 11 to the comparator circuit 18 in a read operation during the test mode (pseudo read cycle).

Further, in a read operation during the test mode (pseudo read cycle), the output circuit 17 is deactivated so as not to transfer output data for the pseudo read control circuit 16 to the external input/output terminal 12.

The comparator circuit 18 compares program data (expected value) "compW" and with read data "compE" during the test mode, and detects a faulty cell based on the comparison result.

The pseudo read control circuits 15 and 16 and the comparator circuit 18 configure an error detector circuit 13. The error detector circuit 13 is provided as one of the features of the semiconductor memory according to the present invention.

The external input terminal (address terminal) 19 is provided as an element for capturing row/column address data in the chip 10 during a read/write mode and the test mode. The row/column address data is provided to the memory cell array 11 via the external input terminal 19, and is used to select a memory cell.

In a write operation during the test mode, the row/column address data is supplied to the chip 10 in order to program the program data (test data) for a memory cell in the memory cell array 11. In a read operation during the test mode (pseudo read cycle), the row/column address data is supplied to the chip 10 in order to read out read data for comparison with the program data (expected value) from the memory cell in the memory cell array 11.

In addition, in a save address latch cycle during the test mode, when a faulty cell exists in the memory cell array 11, bank address data and row/column address data (part of which is actually latched) are supplied to the chip 10 in order to latch an address (save address) of that faulty cell in a latch circuit LAi.

The latch circuit LAi latches a save address (save solution) in the save address latch cycle during the test mode. In the case of row saving for saving a faulty cell in units of rows, the latch circuit LAi latches a row address. In the case of column saving for saving a faulty cell in units of columns, the latch circuit LAi latches a column address.

A fuse program circuit FPi comprises a fuse array composed of a plurality of electrical fuses. The fuse program circuit FPi electrically breaks a capacitor insulating film of one electrical fuse (for example, capacitor) in a fuse array determined by fuse program data MAST and ADDn. Finally, master data (1 bit) FMAST and save address data (a plurality of bits) FADDn are programmed for a fuse array.

The master data FMAST is provided as data for determining whether the fuse program circuit FPi is valid or invalid. In the case where the master data FMAST indicates that the fuse program circuit FPi is valid, the save address data FADDn programmed for the fuse program circuit FPi is valid.

A counter Ci and a switch circuit SW are provided to program the save addresses latched by the latch circuit LAi in an electrical fuse on one bit by one bit basis. Of a plurality of bits configuring save address data, one bit selected by the counter Ci is transferred from the latch circuit LAi to the fuse program circuit FPi.

The latch circuit LAi, the fuse program circuit FPi, the counter Ci, and the switch circuit SW configure a self fuse program circuit 20. The self fuse program circuit 20 is provided as one of the features of the semiconductor memory according to the present invention.

A monitor circuit M is provided as a circuit for detecting whether the master data FMAST and save address data FADDn have been precisely programmed for a fuse array.

During a read/write mode, the fuse program circuit FPi outputs the master data FMAST and the save address data FADDn. A redundancy circuit 21 compares the save address data FADDn with the external address data in the case where the master data FMAST indicates that the fuse program circuit FPi is valid.

Then, when both of them coincide with each other, the redundancy circuit 21 outputs a replacement signal "Rep". The memory cell array 11 selects a spare cell instead of a faulty cell upon the receipt of the replacement signal "Rep".

The chip 10 includes an IC chip which comprises a memory cell array, for example, a memory mixed IC chip or a system LSI chip, etc. The type of the memory is not limited. The chip includes all memories such as DRAM, SRAM, FeRAM, MRAM, ROM, and flash memory.

<2> Error Detector Circuit

Now, an example of the error detector circuit 13 of FIG. 8 will be described here.

The error detector circuit 13 has a function for detecting a faulty cell based on test data (write data) provided from a tester and read data read out from a memory cell in which programming of the test data has been carried out.

The error detector circuit 13 is composed of the input circuit 14, pseudo read control circuits 15 and 16, output circuit 17, and comparator circuit 18.

<2>-1. Outline

FIG. 9 shows an outline of an error detector circuit.

TMCOMP is provided as a control signal for determining whether or not entry is made in the test mode (pseudo read cycle). For example, a period of TMCOMP="H", the test mode is executed. The control signal TMCOMP is provided to the input circuit 14, the pseudo read control circuits 15 and 16, and the output circuit 17, and the states of these circuits in the test mode is determined.

bWRITE is provided as a control signal which is set to "L" in the write mode (including a write operation during the test mode) and which is set to "H" in a mode other than the write mode. In the write mode, the input circuit 14 is activated by the control signal bWRITE in order to transfer program data to the pseudo read control circuit 15. At this time, the output circuit 17 is activated by the control signal bWRITE.

In the normal write mode, program data is transferred to the memory cell array 11 via route <1>. In a write operation during the test mode (pseudo read cycle) as well, program data is transferred to the memory cell array 11 via route <1>.

In the normal read mode, read data is transferred to the output circuit 17 via route <1>'.

In an operation for inputting an expected value during the test mode (pseudo read cycle), program data is transferred as an expected value to the comparator circuit 18 via route <2>. In a read operation during the test mode (pseudo read cycle), read data is transferred to the comparator circuit 18 via route <2>.

Now, specific examples of circuits configuring the error detector circuit 13 will be described here.

<2>-2. Input Circuit

Figure 10:
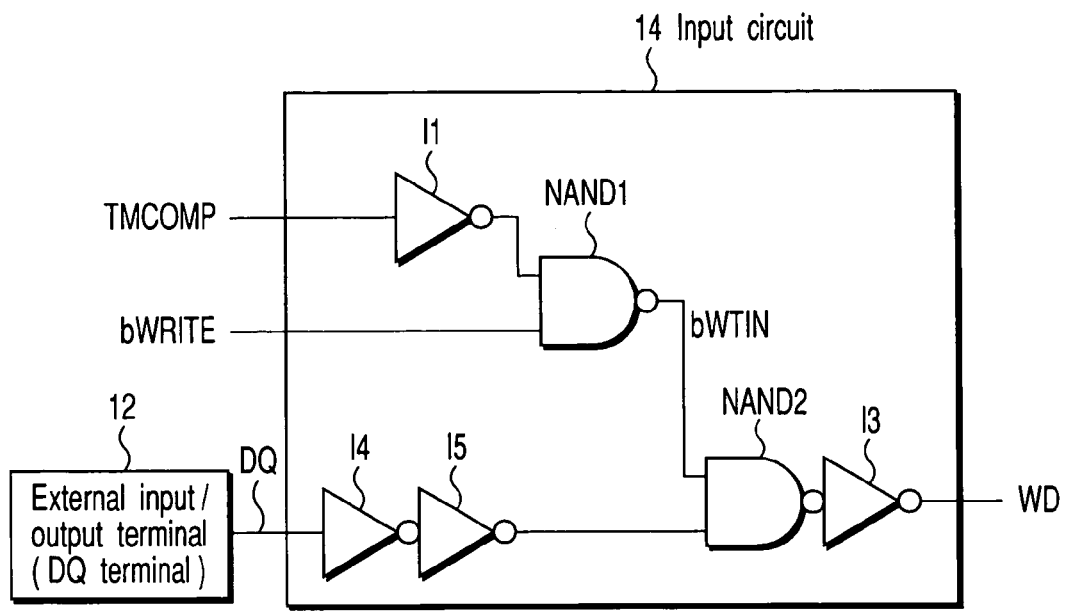
FIG. 10 is a circuit diagram depicting an example of an input circuit.

FIG. 10 shows an example of an input circuit.

The input circuit 14 is composed of inverters I1 to I5 and NAND (logical product negating) gate circuits NAND1 and NAND2. The state of the input circuit 14 is controlled by control signals TMCOMP and bWRITE.

For example, when the normal write mode is established, the control signal TMCOMP and the control signal bWRITE are set to "L", and thus, an output signal bWTIN of the NAND gate circuit NAND1 is set to "H". As a result, the program data provided to the external input/output terminal 12 is outputted as program data WD from the input circuit 14.

When the normal read mode is established, the control signal TMCOMP is set to "L", and the control signal bWRITE is set to "H". Thus, the output signal bWTIN of the NAND gate circuit NAND1 is set to "L". As a result, output data WD of the input circuit 14 is fixed to "L".

Further, when a write operation during the test mode is carried out, the control signal TMCOMP is set to "L", and the control signal bWRITE is set to "L". Thus, the output signal bWTIN of the NAND gate circuit NAND1 is set to "H". As a result, the program provided to the external input/output terminal 12 is outputted as program data WD from the input circuit 14.

Moreover, when an operation for inputting an expected value during the test mode (pseudo read cycle) is carried out, the control signal TMCOMP is set to "H", and the control signal bWRITE is set to "H". Thus, the output signal bWTIN of the NAND gate circuit NAND1 is set to "H". As a result, the program data provided to the external input or output circuit 12 is outputted as program data WD from the input circuit 14.

Figure 11:
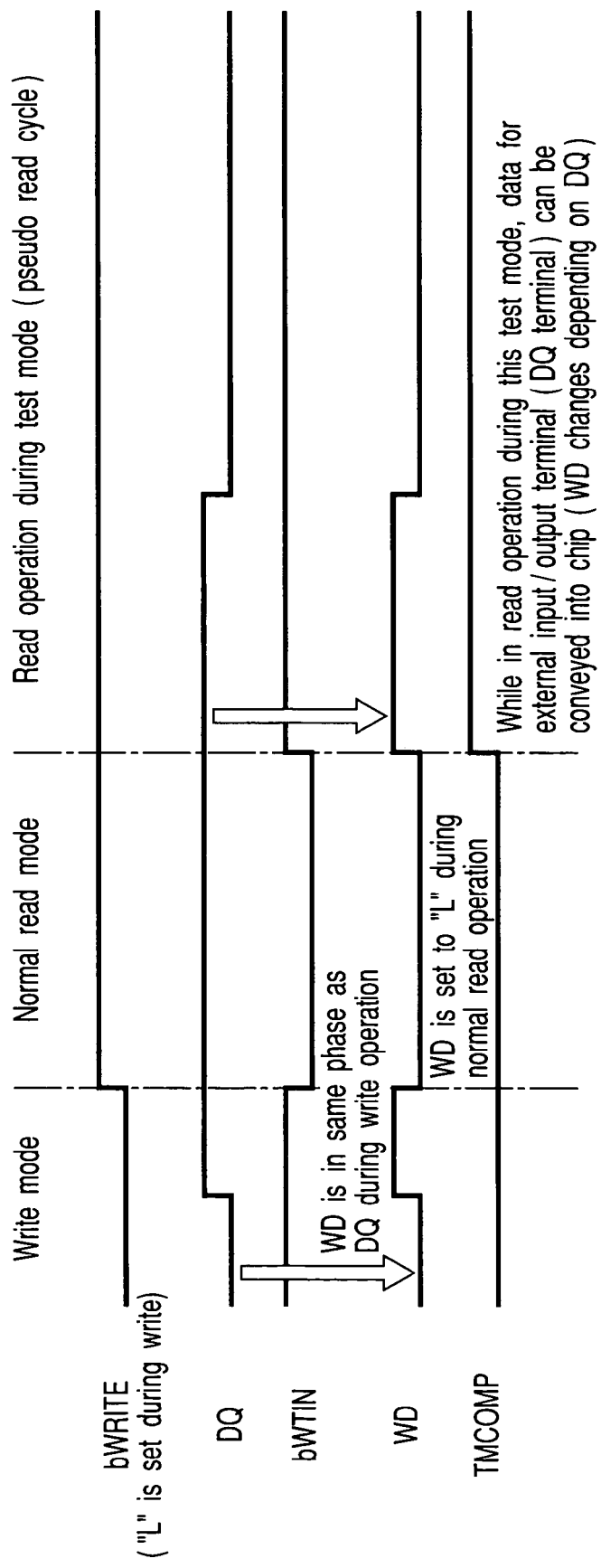
FIG. 11 is a waveform diagram depicting an operation of the input circuit of FIG. 10.

FIG. 11 shows an operating waveform of the input circuit of FIG. 10.

In the write mode (including a write operation during the test mode), since the output signal bWTIN of the NAND gate NAND1 is set to "H", input data (program data) DQ and output data WD are in the same phase.

In the normal read mode, since the output signal bWTIN of the NAND gate circuit NAND1 is set to "L", the output data WD of the input circuit 14 is always set to "L".

In an operation for inputting an expected value during the test mode (pseudo read cycle), since the output signal bWTIN of the NAND gate circuit NAND1 is set to "H", the output data WD changes depending on the input data DQ.

In this way, in this example, the input circuit 14 is configured such that the circuit can capture program data in a chip even in the test mode.

<2>-3. Output Circuit

Figure 12:
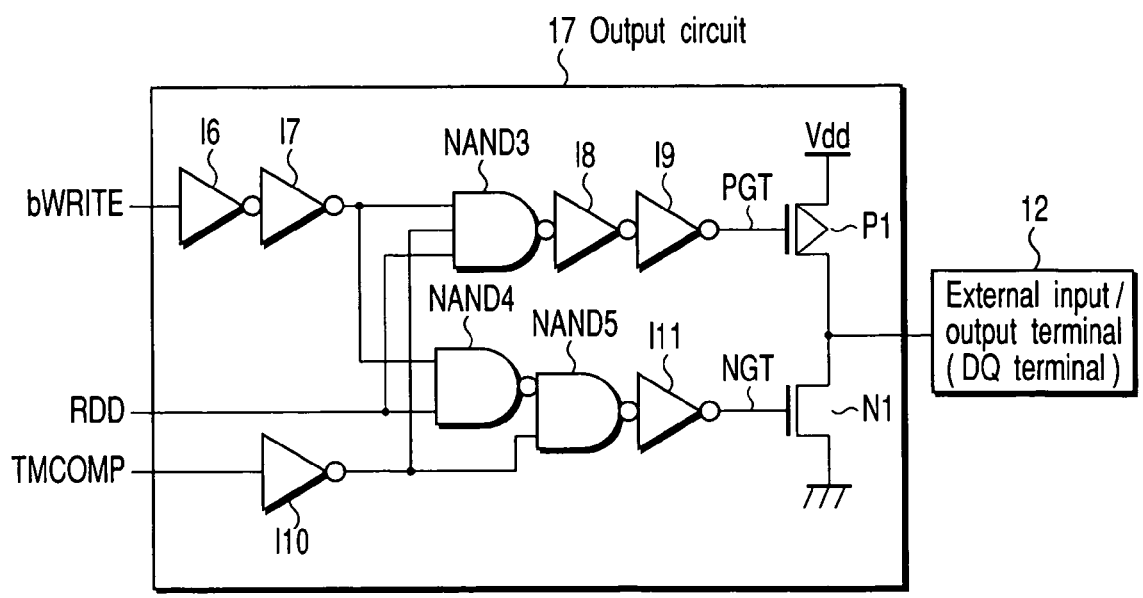
FIG. 12 is a circuit diagram depicting an example of an output circuit.

FIG. 12 shows an example of an output circuit.

The output circuit 17 is composed of: inverters I6 to I11; NAND (logical product negating) gate circuits NAND3 to NAND5; a P-channel MOS transistor P1; and an N-channel MOS transistor N1. The state of the output circuit 17 is controlled by control signals TMCOMP and bWRITE.

For example, when the normal write mode is established, both of the control signal TMCOMP and the control signal bWRITE are set to "L". Thus, output signals of the NAND gate circuits NAND3 and NAND4 are set to "H", and an output signal of the NAND gate circuit NAND5 is set to "L". As a result, the P-channel MOS transistor P1 is set to an OFF state, and the N-channel MOS transistor N1 is set to an ON state. Then, output data for the output circuit 17 is always fixed to "L" irrespective of input data RDD.

When the normal read mode is established, the control signal TMCOMP is set to "L", and the control signal bWRITE is set to H". Thus, the values of output signals of the NAND gate circuits NAND3 to NAND5 change depending on a value of the input data (read data) RDD. For example, when the input data RDD is set to "H", the P-channel MOS transistor P1 is set to an ON state, and the N-channel MOS transistor N1 is set to an OFF state. Then, output data is also set to "H". Further, when the input data RDD is set to "L", the P-channel MOS transistor P1 is set to an OFF state, and the N-channel MOS transistor N1 is set to an ON state. Then, output data is also set to "L".

Further, when a write operation during the test mode is carried out, the control signal TMCOMP is set to "L", and the control signal bWRITE is set to "L". Thus, the output signals of the NAND circuits NAND3 and NAND4 are set to "H", and the output signal of the NAND gate circuit NAND5 is set to "L". As a result, the P-channel MOS transistor P1 is set to an OFF state, and the N-channel MOS transistor N1 is set to an ON state. Then, the output data for the output circuit 17 is always fixed to "L" irrespective of the input data RDD.

Furthermore, when a read operation during the test mode (pseudo read cycle) is carried out, both of the control signal TMCOMP and the control signal bWRITE are set to "H". Thus, the output signals of the NAND gate circuits NAND3 and NAND4 are set to "H", and the output signal of the NAND gate circuit NAND5 is set to "H". As a result, both of the P-channel MOS transistor P1 and the N-channel MOS transistor n1 are set to an OFF state, and an output node of the output circuit 17 is set to a floating state.

Figure 13:
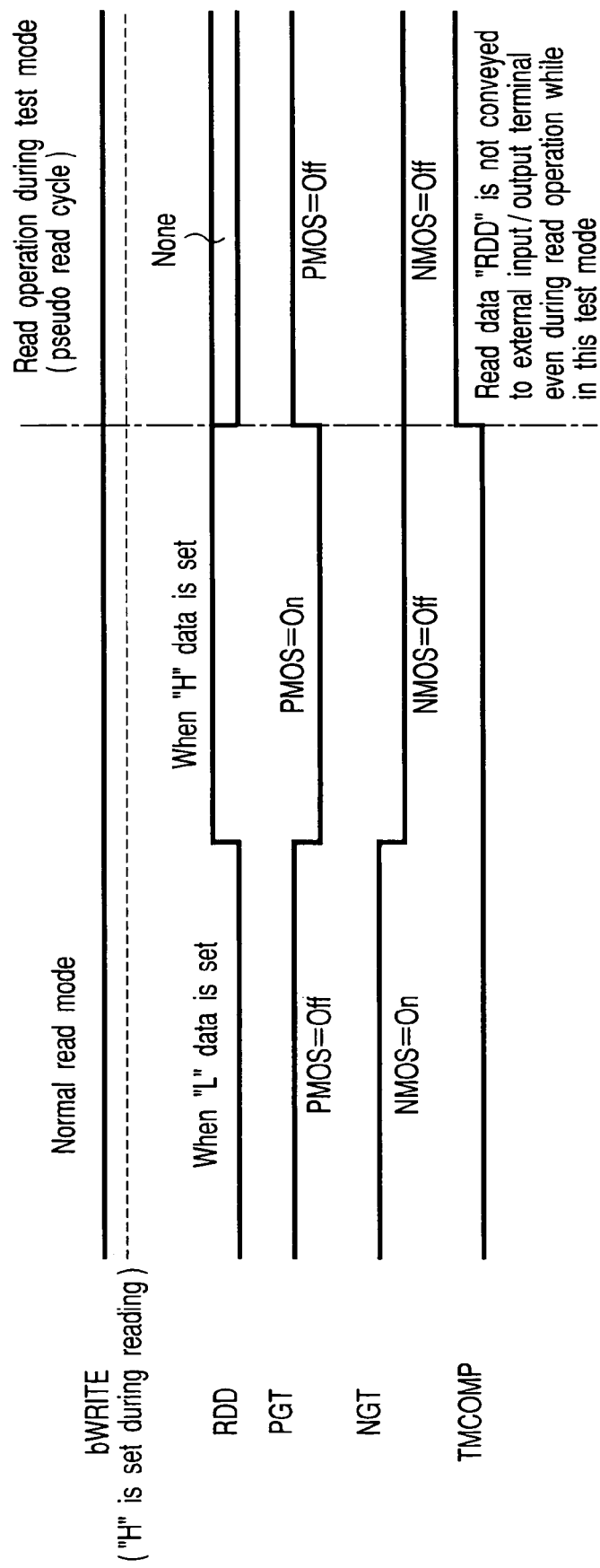
FIG. 13 is a waveform diagram depicting an operation of the output circuit of FIG. 12.

FIG. 13 shows an operating waveform of the output circuit of FIG. 12.

In the normal read mode, the control signal TMCOMP is set to "L", and the control signal bWRITE is set to "H".

When the input data RDD is set to "L", the P-channel MOS transistor P1 is set to an OFF state due to PGT="H", and the N-channel MOS transistor N1 is set to an ON state due to NGT="H". In addition, the input data RDD is set to "H", the P-channel MOS transistor P1 is set to an ON state due to PGT="L", and the N-channel MOS transistor N1 is set to an OFF state due to NGT="L".

In a read operation during the test mode (pseudo read cycle), the control signal TMCOMP is set to "H", and the control signal bWRITE is set to "H". In this case, PGT="H" and NGT="L" are obtained irrespective of the value of the input data RDD, and thus, both of the P-channel MOS transistor P1 and the N-channel MOS transistor N1 are set to an OFF state.

In this way, in this example, in the test mode, the output circuit 17 is configured so as not to transfer read data read out from a memory cell array to an external input/output terminal even in a read operation.

<2>-4. Pseudo Read Control Circuit

Figure 14:
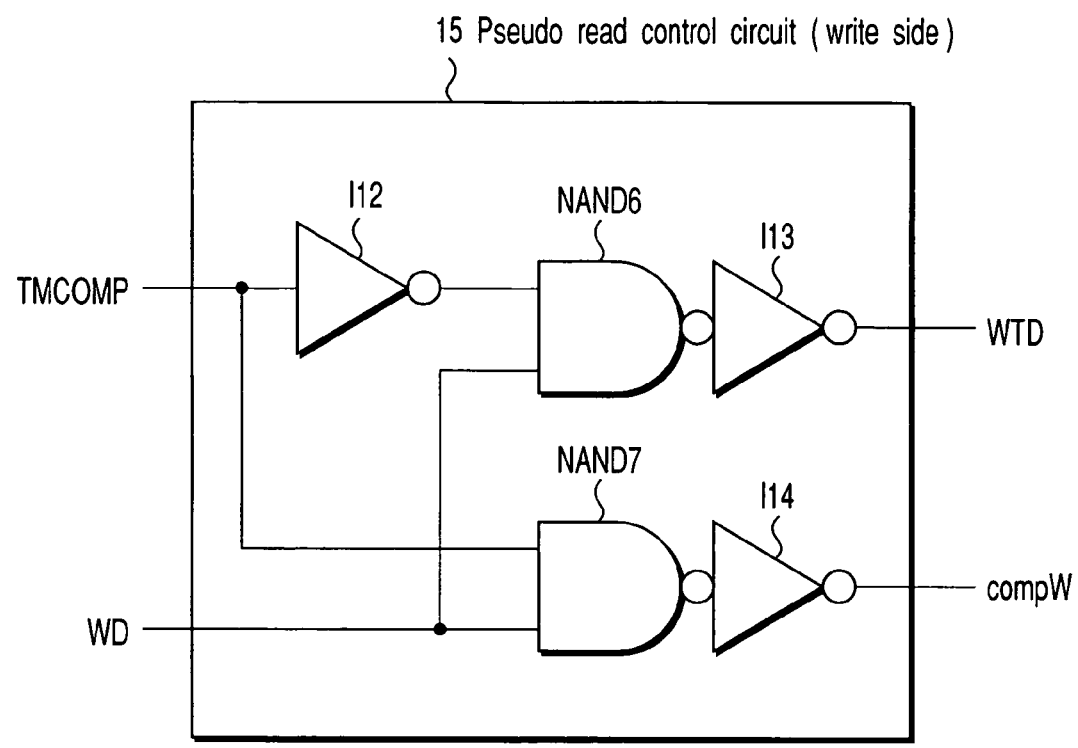
FIG. 14 is a circuit diagram depicting an example of a pseudo read controller circuit (write side)

FIG. 14 shows an example of a pseudo read control circuit (write side).

The pseudo read control circuit 15 is composed of: inverters I12 to I14; and NAND (logical product negating) gate circuits NAND6 and NAND7. The state of the pseudo read control circuit 15 is controlled by the control signal TMCOMP.

For example, in a write operation during the normal operation mode and the test mode, the control signal TMCOMP is set to "L". Thus, a value of output data for the NAND gate circuit NAND6 changes depending on a value of input data (program data) WD. A value of output data for the NAND gate circuit NAND7 is always set to "H" irrespective of the value of the input data (program data) WD.

Therefore, in a write operation during the normal operation mode and the test mode, the pseudo read control circuit 15 transfers the input data (program data) WD as output data WTD to the memory cell array 11.

In an operation for inputting an expected value during the test mode (pseudo read cycle), the control signal TMCOMP is set to "H". Thus, the value of the output data for the NAND gate circuit NAND6 is always set to "H" irrespective of the value of the input data (program data) WD. The value of the output data for the NAND gate circuit NAND7 changes depending on the value of the input data (program data defined as an expected value).

Therefore, in the operation for inputting an expected value during the test mode (pseudo read cycle), the pseudo read control circuit 15 transfers the input data (program data defined as an expected value) WD as output data compW to the comparator circuit 18.

Figure 15:
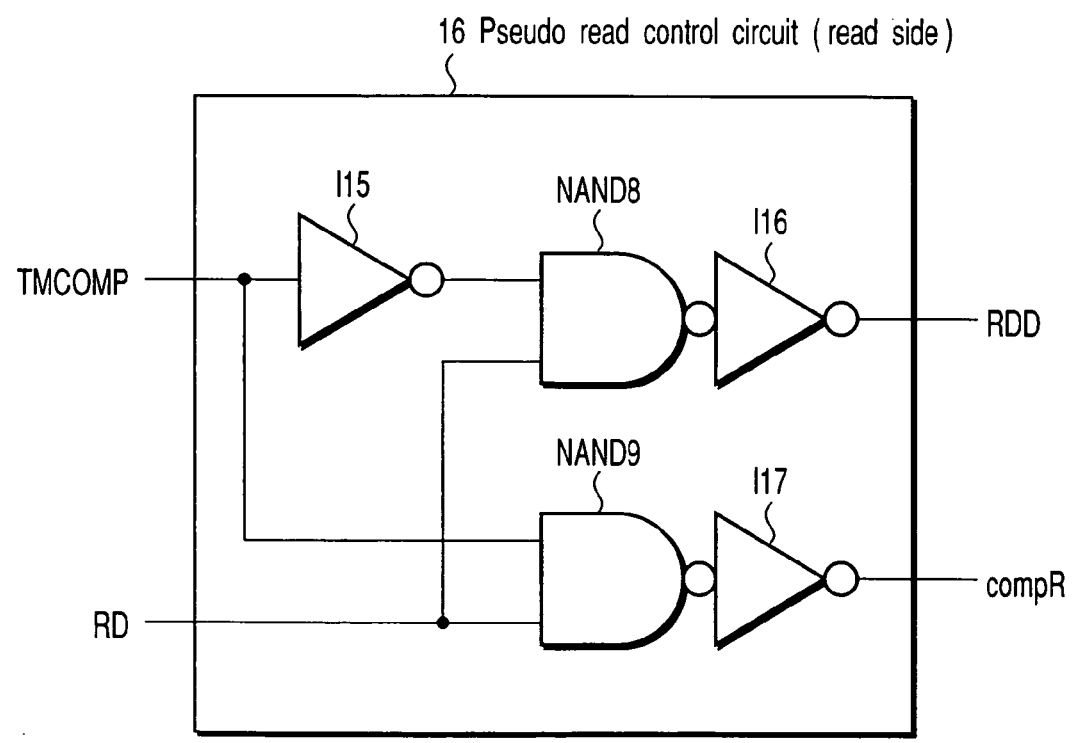
FIG. 15 is a circuit diagram depicting an example of a pseudo read controller circuit (read side)

FIG. 15 shows an example of a pseudo read control circuit (read side).

The pseudo read control circuit 16 is composed of inverters I15 to I17 and NAND (logical product negating) gate circuits NAND8 and NAND9. The state of the pseudo read control circuit 16 is controlled by the control signal TMCOMP.

For example, when the normal operation mode is established, the control signal TMCOMP is set to "L". Thus, a value of output data for the NAND gate circuit NAND8 changes depending on a value of input data (read data) RD, and a value of output data for the NAND gate circuit NAND9 is always set to "H" irrespective of the value of the input data (read data) RD.

Therefore, in the normal operation mode, the pseudo read control circuit 16 transfers the input data (read data) RD as output data RDD to the output circuit 17.

In addition, in a read operation during the test mode (pseudo read cycle), the control signal TMCOMP is set to "H". Thus, the value of the output data for the NAND gate circuit NAND8 is always set to "H" irrespective of the value of the input data (read data) RD, and the value of the output data for the NAND gate circuit NAND9 changes depending on the value of the input data (read data) RD.

Therefore, in a read operation during the test mode (pseudo read cycle), the pseudo read control circuit 16 transfers the input data (read data) RD as output data compR to the comparator circuit 18.

FIG. 16 shows an operating waveform of the pseudo read control circuit of FIGS. 14 and 15.

In the write mode (including a write operation during the test mode), since the control signal TMCOMP is set to "L", the input data (program data) WD and the output data WTD are in the same phase. The output data compW always maintain "L".

In the read mode, since the control signal TMCOMP is set to "L", the input data (read data) RD and the output data RDD are in the same phase. The output data compR always maintains "L".

In an operation for inputting an expected value during the test mode (pseudo read cycle), since the control signal TMCOMP is set to "H", the output data compW is in the same phase as the input data (program data) WD defined as an expected value. The output data WTD always maintains "L".

In a read operation during the test mode (pseudo read cycle), since the control signal TMCOMP is set to "H", the output data compR is in the same phase as the input data (read data) RD. The output data RDD always maintains "L".

In this way, in this example, the pseudo read control circuits 15 and 16 are configured so as to transfer program data (expected value) and read data to the comparator circuit 18 during the test mode (pseudo read cycle).

<2>-5. Comparator Circuit

Figure 17:
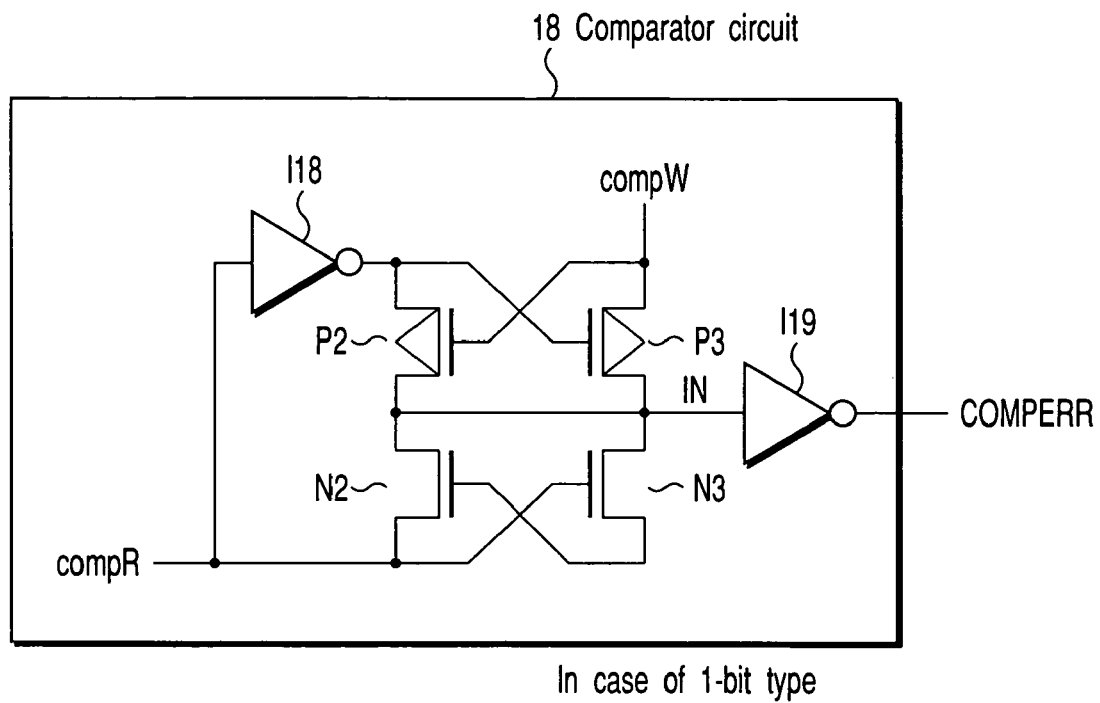
FIG. 17 is a circuit diagram depicting an example of a comparator circuit.

FIG. 17 shows an example of a comparator circuit.

The comparator circuit 18 is composed of: P-channel MOS transistors P2 and P3; N-channel MOS transistors N2 and N3; and inverters I18 and I19.

A value of output data (latch signal) COMPERR of the comparator circuit 18 is determined by values of input data compR and compW. In the case where the values of the input data compR and compW are equal to each other, the value of the output data COMPERR is set to "L". In the case where these values are different from each other, the value of the output data COMPERR is set to "H".

With respect to a configuration of the comparator circuit 18, any circuit may be used without being limited to the circuit of FIG. 17 as long as the circuit can achieve a logic as shown in Table 2.

TABLE 2

| In case of 1-bit type | | | | |
|---|---|---|---|---|
| compR | L | H | L | H |
| compW | L | L | H | H |
| IN | H | L | L | H |
| COMPERR | L | H | H | L |

Figure 18:
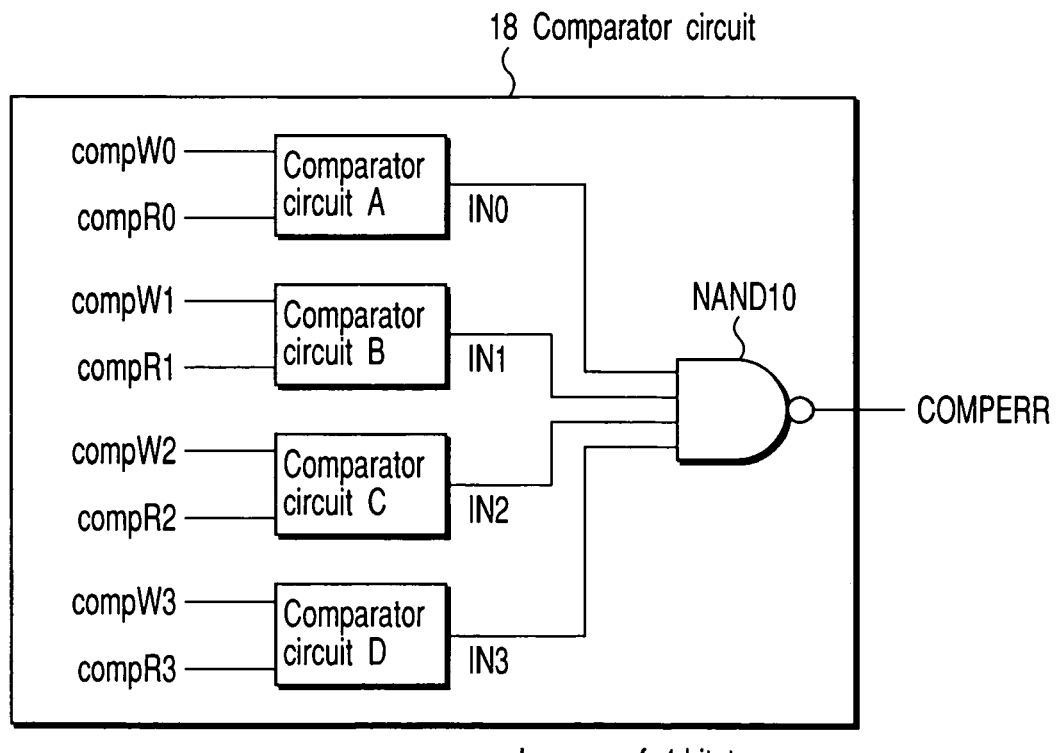
FIG. 18 is a circuit diagram depicting an example of a comparator circuit.

FIG. 18 shows another example of the comparator circuit 18.

In a multiple bit type semiconductor memory capable of achieving read/write operation at the same time with respect to a plurality of memory cells (a plurality of bits) in the memory cell array 11, such a circuit as shown in this example is effective.

The comparator circuit 18 of this example is provided as an example of a comparator circuit applied to a 4-bit type semiconductor memory. Four comparator circuits A, B, C, and D have a configuration which is substantially identical to the comparator circuit shown in FIG. 17, respectively. However, in the case where the comparator circuit of FIG. 17 is applied to the 4-bit type semiconductor memory, output node IN of the P-channel MOS transistor P3 and N-channel MOS transistor N3 in FIG. 17 is provided as an output terminal. That is, the inverter I19 of FIG. 17 is eliminated.

Output data IN0, IN1, IN2, and IN3 of the comparator circuits A, B, C, and D are inputted to a NAND gate circuit NAND10, and output data (latch signal) COMPERR of the comparator 18 is outputted from the NAND gate circuit NAND 10.

In this example, when the output data IN0, IN1, IN2, and IN3 for all the comparator-circuits A, B, C, and D are set to "H", i.e., in all the comparator circuits A, B, C, and D, in the case where values of input data compRi and compWi (i=0, 1, 2, 3) are equal to each other, the output data (latch signal) COMPERR for the comparator circuit 18 is set to "L".

In contrast, at least one of the output data IN0, IN1, IN2, and IN3 of the comparator circuits A, B, C, and D is set to "L", that is, in the case where the values of the input data compRi and compWi (i=0, 1, 2, 3) are different from each other in at least one of the comparator circuits A, B, C, and D, the output data (latch signal) COMPERR for the comparator circuit 18 is set to "H".

With respect to a configuration of the comparator circuit 18, any circuit may be used without being limited to the circuit 18 of FIG. 18 as long as the circuit can achieve a logic as shown in Table 3.

TABLE 3

| In case of 4-bit type | | | | | |
|---|---|---|---|---|---|
| IN0 | L | H | ... | L | H |
| IN1 | L | L | ... | H | H |
| IN2 | L | L | ... | H | H |
| IN3 | L | L | ... | H | H |
| COMPERR | H | H | ... | H | L |

<2>-6. Operation

Figure 19:
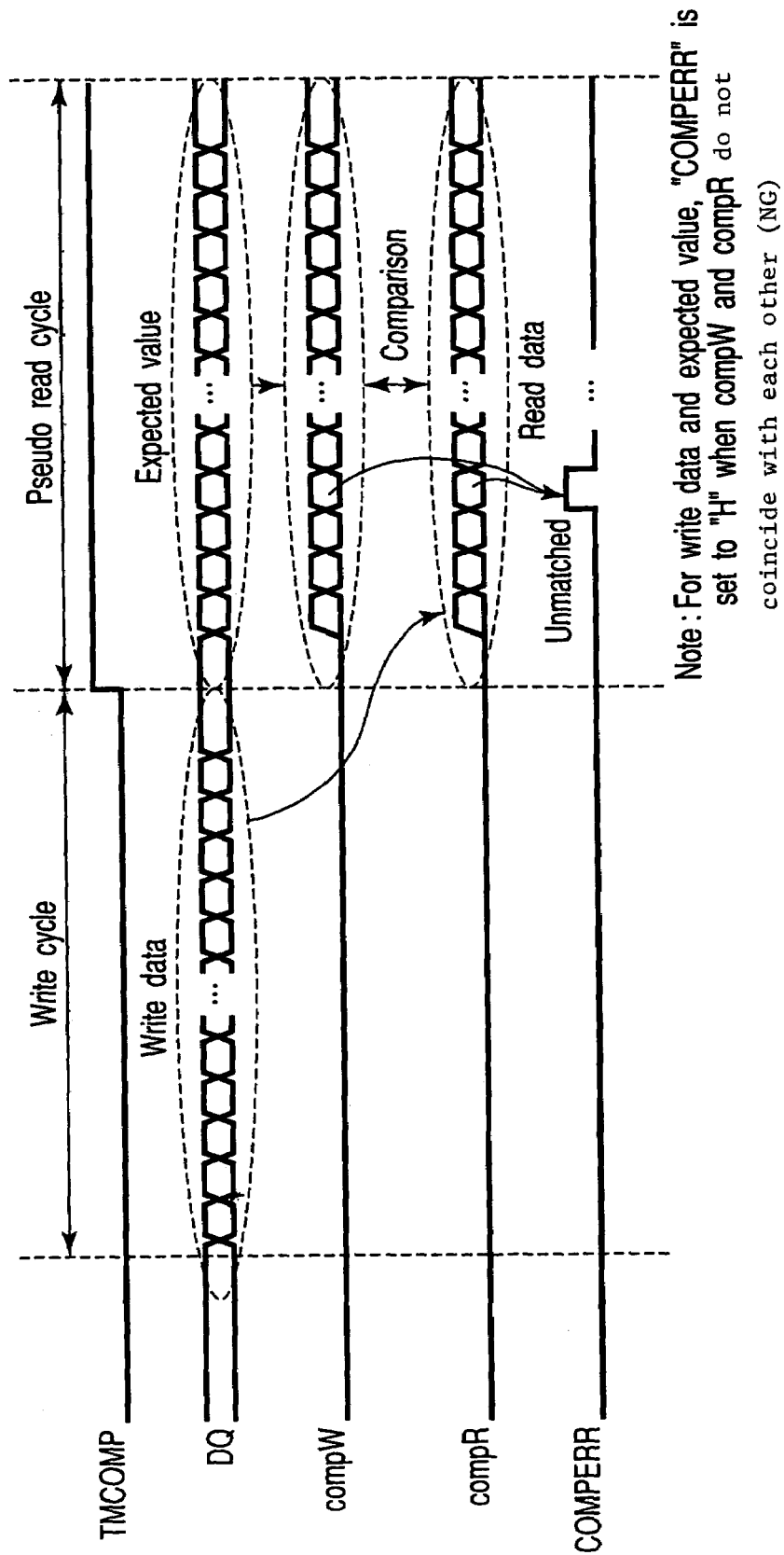
FIG. 19 is a waveform diagram depicting an operation of the error detector circuit of FIG. 9.

FIG. 19 shows an operating waveform of an error detector circuit.

First, a write cycle of programming program data (test data) is executed for a memory cell in a memory cell array (write operation during the test mode). At this time, as described above, the input circuit 14 of FIG. 9 is activated, and the pseudo control circuit (write side) 15 transfers test data to the memory cell array 11.

Then, when the control signal TMCOMP is set to "H", entry is made to the test mode (pseudo read cycle). At this time, as described above, the input circuit 14 is activated, and the pseudo read control circuit (write side) 15 transfers program data (expected value having the same value as test data) to the comparator circuit 18. In addition, the output circuit 17 of FIG. 9 is activated, and the pseudo read control circuit (read side) 16 transfers read data to the comparator circuit 18.

The comparator circuit compares a value of the program data (expected value) compW with a value of the read data compR. Only when both of them do not coincide with each other, the output data (latch signal) COMPERR is set to "H".

<3> Self Fuse Program Circuit

Now, an example of the self fuse program circuit 20 of FIG. 8 will be described here.

The self fuse program circuit 20 has a function for, when a faulty cell has been detected, latching an address of that faulty cell as a save address (save solution) and programming that save address in an electrical fuse on one bit by one bit basis.

The self fuse program circuit 20 is composed of the latch circuit LAi, the fuse program circuit FPi, the counter Ci, and the switch circuit SW.

In the following description, presupposition is defined as follows in order to ensure clarity. 4 banks (memory cell array) are allocated in one chip. One cell fuse program circuit and one redundancy circuit are provided for one bank. One bank consists of 16-row and 16-column matrix shaped memory cell array, for example, and save address data FADD0 to FADD3 are composed of 4 bits.

This preposition is provided for the purpose of clearly explaining the present invention. The number of banks; the number of self fuse program circuits corresponding to one bank; the number of redundancy circuits corresponding to one bank; the number of rows/columns for one bank; and whether row saving or column saving is carried out can be changed.

<3>-1. Outline

FIG. 20 shows an outline of a self fuse program circuit.

The self fuse program circuit comprises: the latch circuit LAi (i=0, 1, 2, 3) for, when a faulty cell has been detected, latching an address of that faulty cell as a save address (save solution); the fuse program circuit FPi for programming a save address in an electrical fuse; and the counter Ci and switch circuit SW for programming save addresses in an electrical fuse on one bit by one bit basis.

A sense signal (latch signal) COMPERR is provided as a signal outputted from the error detector circuit of FIG. 9 described above. Master data Master (Vext) and address data A0 to A5 are inputted to the latch circuit LAi.

The master data is provided as data for determining whether the fuse program circuit FPi is valid or invalid. In the case where a save address (save solution) is programmed for the fuse program circuit FPi, the master data Master is set to a value (for example, "1") indicating that the fuse program circuit FPi is valid.

In this example, 2-bit address data A4 and A5 of the address data (6 bits) A0 to A5 are used to select a bank. Programming of a save address (save solution) is executed for one bank which has been thus selected.

The remaining 4-bit address data A0 to A3 indicate a faulty address (save solution) for the selected bank. In the case of row saving in which a faulty cell is replaced with a spare cell in units of rows, the address data A0 to A3 are provided as row address data. In the case of column saving in which a faulty cell is replaced with a spare in units of columns, the address data A0 to A3 are provided as column address data.

One row/column (faulty address) of 16 rows/columns is selected based on these 4-bit address data A0 to A3. However, it is assumed that saving of a faulty cell is executed in units of one row/column.

Even in units of one row or column, a saving unit of faulty cells may be in a plurality of rows/columns (for example, 2, 4, 8 or the like).

<3>-2. Fuse Program Circuit

First, the fuse program circuit FPi (i=0, 1, 2, 3) will be described with reference to FIG. 20.

Only one fuse program circuit FPi is provided for one bank. In this example, 4 banks are presumed, and thus, 4 fuse program circuits FPi are provided in a chip.

One VBP node is connected to one end of the electrical fuse EF in common. In this case, if a plurality of or all of the programs for the electrical fuse EP are executed at the same time, there is a danger that a sufficient high voltage is not applied to the electrical fuse EP for which a capacitor insulating film must be broken, i.e., an electrical fuse targeted for "1"-programming.

In this example, programs for the electrical fuse EP are executed on a one by one program (one bit) basis.

A grounding node Vss is connected to the other end of the electrical fuse EF via N-channel MOS transistors Tr1, Tr2, and N4.

In the N-channel MOS transistor Tr1, during fuse programming, a high voltage VP is applied to a gate, and an ON state is always established. The N-channel MOS transistor Tr2 is established in an ON state or an OFF state according to values of master data MAST and save address data ADD0 to ADD3 to be inputted to the gate.

Since data which is not selected by the counter Ci is set to "L", the N-channel MOS transistor Tr2 for which that data is inputted to the gate is set to an OFF state. The data selected by the counter Ci changes according to a value of output data for the latch circuit LAi, and thus, the N-channel MOS transistor Tr2 is set to an OFF state ("0"-programming) or an ON state ("1"-programming).

During fuse programming, since a fuse program signal PROGRAM is set to "H", the N-channel MOS transistor N4 is always set to an ON state. Namely, when the N-channel MOS transistor Tr2 is set to an ON state, a high voltage is applied to both ends of the electrical fuse EF, and a capacitor insulating film of the electrical fuse EF is broken.

<3>-3. Latch Circuit

<3>-3.-1. Overview

Figure 21:
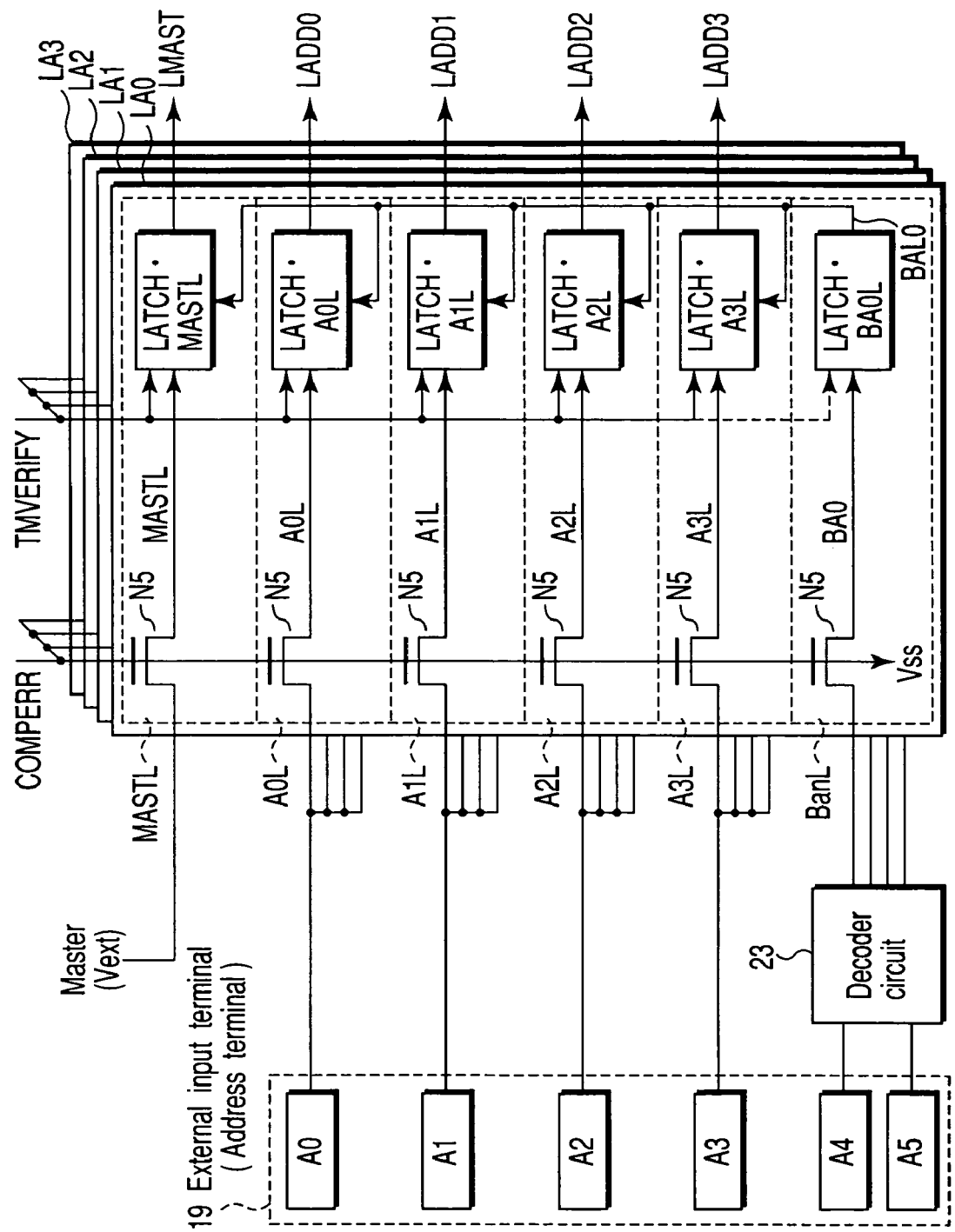
FIG. 21 is a circuit diagram depicting an example of a latch circuit.

FIG. 21 shows an example of a latch circuit.

The latch circuit LAi has a function for, when a faulty cell has been detected, latching an address of that faulty cell as a save address (save solution).

In this example, 4 latch circuits LAi correspond to the number of banks (the number of fuse program circuits PFi). A configuration of each latch circuit is identical to another one.

The latch circuit LAi will be described by way of example of a latch circuit LA0.

The latch circuit LA0 is composed of: a master data latch circuit MASTL; save address (save solution) latch circuits A0L to A3L; and a bank address data latch circuit BanL.

In the test mode, address data A0 to A5 for specifying a memory cell targeted for testing are inputted to the external input terminal (address terminal) 19. In this example, the high order 2-bit address data A4 and A5 of the address data A0 to A5 are provided as bank address data for selecting one of the four banks. The remaining 3-bit address data A0 to A3 are used as address data for actually selecting a memory cell in the selected bank.

In order to actually select a memory cell, in the case where A0 to A3 are provided as low address data, additional column address data is required. In the case where A0 to A3 are provided as column address data, additional row address data is required.

For example, it is tested whether that memory cell is good or faulty by using the error detector circuit (read/write circuit) 13 of FIG. 9 described above. When the test result is faulty, the sense signal (latch signal) COMPERR (="H") is outputted from the comparator circuit 18. This sense signal COMPERR is inputted to a gate of an N-channel MOS transistor N5 in the latch circuit LA0.

Figure 22:
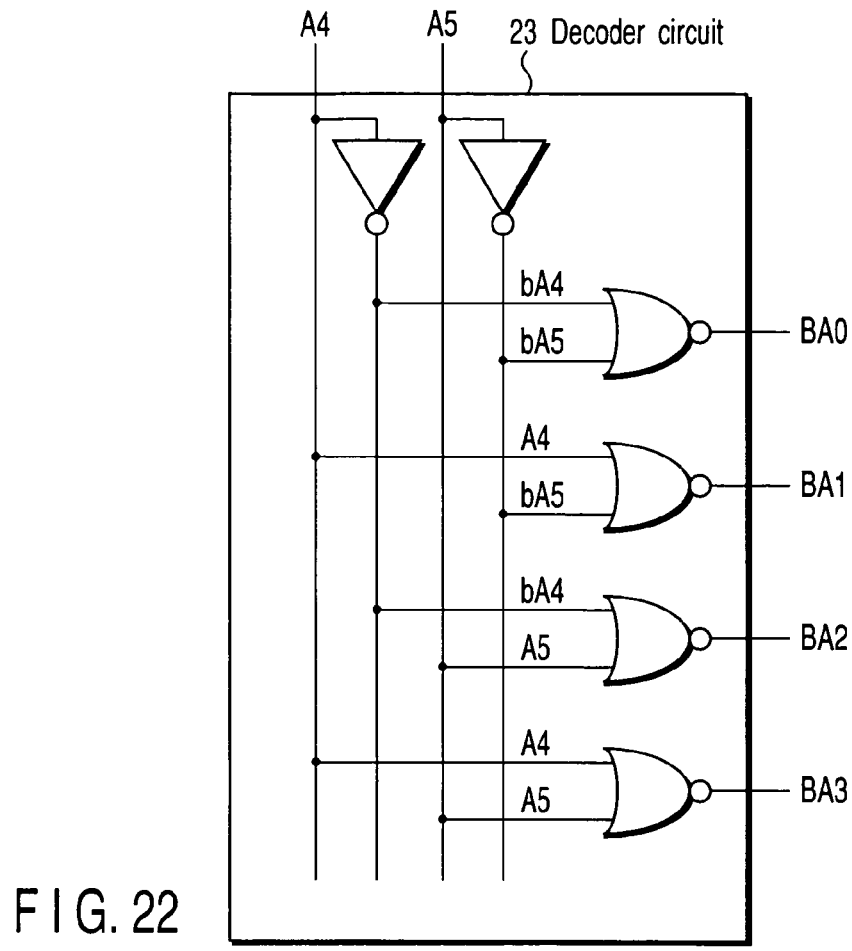
FIG. 22 is a circuit diagram depicting an example of a decoder circuit.

At this time, the address data A0 to A5 for specifying a memory cell targeted for testing are inputted to the external input terminal (address terminal) 19. The address data (bank address data) A4 and A5 are inputted to a decoder circuit 23. The decoder circuit 23 is composed of a circuit as shown in FIG. 22, for example. The decoder circuit 23 selects one of the four banks 0 to 3 based on the address data A4 and A5.

For example, in the case where a memory cell in bank 0 has been tested, bank 0 is selected. At this time, a bank selection signal BA0 to be inputted to the latch circuit LA0 corresponding to bank 0 is set to "H", and bank selection signals BA1 to BA3 to be inputted to the latch circuits LA1 to LA3 corresponding to non-selected banks 1 to 3 are set to "L".

When a memory cell targeted for testing is faulty, the sense signal (latch signal) COMPERR is set to "H". Thus, the bank selection signal BA0 is inputted to a latch circuit LATCH•BA0L in the bank address data latch circuit BanL. Address data for that faulty memory cell is inputted as a save address to latch circuits LATCH•A0L to LATCH•A3L in the save address data latch circuits A0L to A3L.

The master data Master (Vext) is always set to "H" (=power supply potential Vdd)", for example. Therefore, when the sense signal (latch signal) COMPERR is set to "H", master data Master (Vext)="H" is inputted to a latch circuit LATCH•MASTL in the master data latch circuit MASTL.

An output signal (bank selection signal) VAL0 of the latch circuit LATCH•BA0L is inputted to the latch circuit LATCH•MASTL in the master data latch circuit MASTL and the latch circuit LATCH•A0L to LATCH•A3L in the save address data latch circuits A0L to A3L, and controls states of these latch circuits.

The test mode verify signal TMVERIFY is also inputted to the latch circuit LATCH•MASTL in the master data latch circuit MASTL and the latch circuits LATCH•A0L to LATCH•A3L in the save address data latch circuits A0L to A3L, and controls states of these latch circuits.

The test mode verify signal TMVERIFY may be or may not be inputted to the latch circuit LATCH•BA0L in the bank address data latch circuit BanL (indicated by dashed line).

Figure 23:
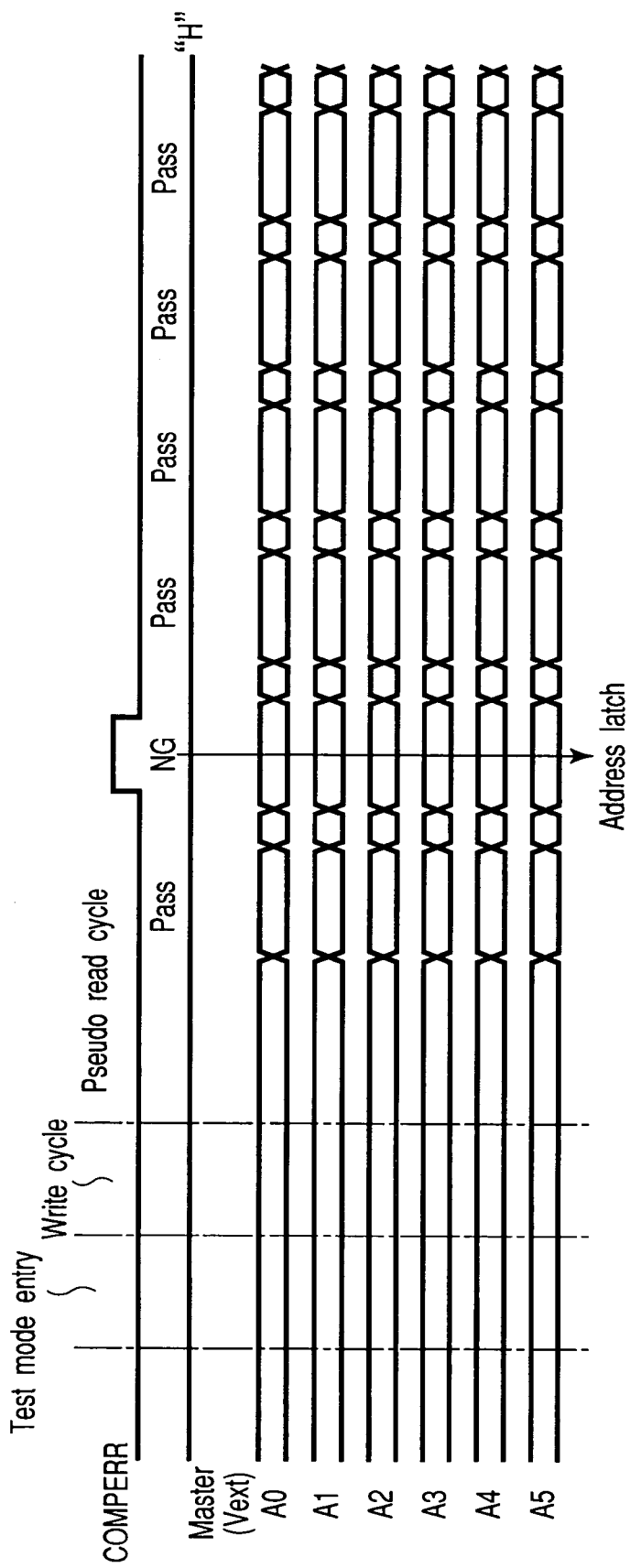
FIG. 23 is a waveform diagram depicting an operation of the latch circuit of FIG. 21.

FIG. 23 shows an example of an operating waveform of the latch circuit in FIG. 21.

In a pseudo read cycle during the test mode, when the sense signal (latch signal) COMPERR is set to "H", the master data Master (Vext) and address data A0 to A5 are latched by the latch circuit.

The master data Master (Vext) is always set to "H", and the address data A0 to A5 each represent an address (low address or column address) of a faulty cell.

<3>-3.-2. Bank Address Data Latch Circuit BanL

Figure 24:
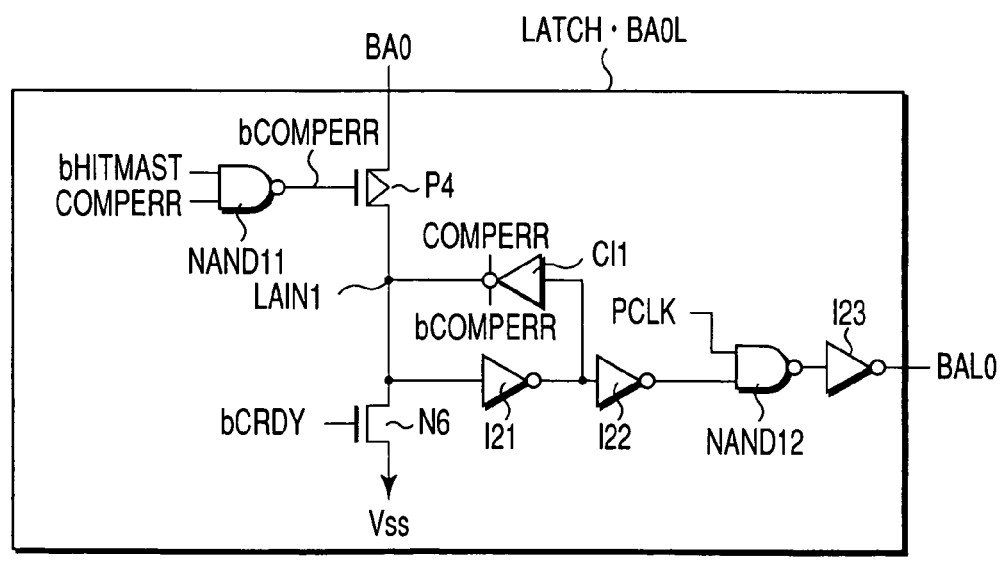
FIG. 24 is a circuit diagram depicting an example of a bank address data latch circuit.

FIG. 24 shows an example of the latch circuit LATCH•BA0L in the bank address data latch circuit BanL.

The latch circuit LATCH•BA0L is composed of: inverters I21 to I23; a clocked inverter CI1; NAND gate circuits NAND11 and NAND12; a P-channel MOS transistor P4; and an N-channel MOS transistor N6.

The N-channel MOS transistor N6 is used for an initializing operation after power has been turned ON. In this example, by setting bCRDY to "H", an input node LAIN1 of a data latch portion is initialized to "L".

In a latch cycle during the test mode, bHIMAST is set to "H". As a result, output data for the NAND gate circuit NAND11 depends on a value of the sense signal (latch signal) COMPERR.

For example, when the value of the sense signal (latch signal) COMPERR is set to "H", the output data for the NAND gate circuit NAND11 is set to "L", and the P-channel MOS transistor P4 is set to an ON state. Thus, the bank selection signal BA0 is transferred to the input node LAIN1 of the data latch portion via the P-channel MOS transistor P4.

In addition, when the value of the sense signal (latch signal) COMPERR is set to "L", the output data for the NANF gate circuit NAND11 is set to "H", and the P-channel MOS-transistor P4 is set to an OFF state. Thus, the bank selection signal BA0 is not transferred to the input node LAIN1 of the data latch portion.

In this example, the latch portion for actually latching data is composed of the inverter I21 and the clocked inverter CI1.

When the value of the sense signal (latch signal) is set to "H", the clocked inverter CI1 is set to an active state, and the latch portion is set to a state in which it can latch the bank selection signal BA0. When the value of the sense signal (latch signal) COMPERR is set to "L", the clocked inverter CI1 is set to an inactive state.

In the case where bank 0 is selected, the bank selection signal BA0 is set to "H", and thus, "H" is latched at the latch portion. In the case where bank 0 is not selected, the bank selection signal BA0 is set to "L", and thus, "L" is latched at the latch portion.

The bank selection signal BA0 latched at the latch portion is synchronized with a clock signal PCLK to be outputted from the latch circuit LATCH•BA0L as a bank selection signal BAL0.

The clock signal PCLK can be obtained by taking an AND logic between an fuse program signal PROGRAM set to "H" and an external clock signal CLK in a fuse program cycle during the test mode, as shown in FIG. 27, for example.

<3>-3.-3. Master Data Latch Circuit MASTL

FIG. 25 shows an example of the latch circuit LATCH•MASTL in the master latch circuit MASTL.

The latch circuit LATCH•MASTL is composed of: inverters I24 to I26; a clocked inverter CI2; NAND gate circuits NAND13 to NAND15; a P-channel MOS transistor P5; and an N-channel MOS transistor N7.

The N-channel MOS transistor N7 is used for an initializing operation after power has been turned ON. In this example, bCRDY is set to "H", whereby an input node LAIN2 of a data latch portion is initialized to "L".

When bank 0 has been selected, the bank selection signal BAL0 (="H") outputted from the bank address data latch circuit LATCH•BA0L of FIG. 24 described above is outputted in synchronism with the clock signal PCLK. In addition, when a memory cell targeted for testing in bank 0 is faulty, the sense signal (latch signal) COMPERR is set to "H".

Therefore, output data for the NAND gate circuit NAND13 is set to "L", and the P-channel MOS transistor P5 is set to an ON state. Thus, the master data (="H") MASTL is transferred to the input node LAIN2 of the data latch portion via the P-channel MOS transistor P5.

Further, when the value of the sense signal (latch signal) COMPERR is set to "L", the output data for the NAND gate circuit NAN13 is set to "H", and the P-channel MOS transistor P5 is set to an OFF state. Thus, the master data (="H") MASTL is not transferred to the input node LAIN2 of the data latch portion.

The latch portion is composed of the inverter I24 and the clocked inverter CI2. When the value of the sense signal (latch signal) COMPERR is set to "H", the clocked inverter CI2 is set to an active state, and the latch portion latches master data (="H") MASTL. The value of the sense signal (latch signal) COMPERR is set to "L", the clocked inverter CI2 is set to an inactive state.

The master data (="H") MASTL latched by the latch portion is synchronized with the clock signal PCLK to be outputted from the latch circuit LATCH•MASTL as master data LMAST. The clock signal PCKL is obtained by taking an AND produce between a fuse program signal PROGRAM and an external clock signal CLK, for example, as described above (FIG. 27).

The test mode verify signal TMVERIFY is provided as a signal set to "H" when save address data programmed by the fuse program circuit FPi is verified. When the test mode verify signal TMVERIFY is set to "H", the master data LMAST outputted from the latch circuit LATCH•MASTL is fixed to "H".

<3>-3.-4. Save Address Data Latch Circuit AnL

FIG. 26 shows an example of a latch circuit LATCH•AnL in a save address data latch circuit AnL.

The latch circuit LATCH•ANL is composed of: inverters I27 to I29; a clocked inverter CI3; NAND gate circuits NAND16 to NAND18; a P-channel MOS transistor P6; and an N-channel MOS transistor N8.

The N-channel MOS transistor N8 is used for an initializing operation after power has been turned ON. In this example, bCRDY is set to "H", whereby an input node LAIN3 of a data latch portion is initialized to "L".

When bank 0 has been selected, the bank selection signal BAL0 (="H") outputted from the bank address data latch circuit LATCH•BA0L of FIG. 24 described above is outputted in synchronism with the clock signal PCLK. In addition, when a memory cell targeted for testing in bank 0 is faulty, the sense signal (latch signal) COMPERR is set to "H".

Therefore, output data for the NANF gate circuit NAND16 is set to "L", and the P-channel MOS transistor P6 is set to an ON state. Thus, save address data AnL is transferred to the input node LAIN3 of the data latch portion via the P-channel MOS transistor P6.

In addition, when the value of the sense signal (latch signal) COMPERR is set to "L", the output data for the NAND gate circuit NAND16 is set to "H", and the P-channel MOS transistor P6 is set to an OFF state. Thus, the save address data AnL is not transferred to the input node LAIN3 of the data latch portion.

The latch portion is composed of the inverter I27 and the clocked inverter CI3. When the value of the sense signal (latch signal) COMPERR is set to "H", the clocked inverter CI3 is set to an active state, and the latch portion latches the save address data AnL. When the value of the sense signal (latch signal) COMPERR is set to "L", the clocked inverter CI3 is set to an inactive state.

The save address data AnL latched by the latch portion is synchronized with the clock signal PCLK to be outputted from the latch circuit LATCH•AnL as save address data LADDn.

The test mode verify signal TMVERIFY is provided as a signal set to "H" when the save address data programmed by the fuse program circuit FPi is verified. When the test mode verify signal TMVERIFY is set to "H", the save address data LADDn outputted from the latch circuit LATCH•AnL is fixed to "H".

<3>-3.-5. Operation

Figure 28:
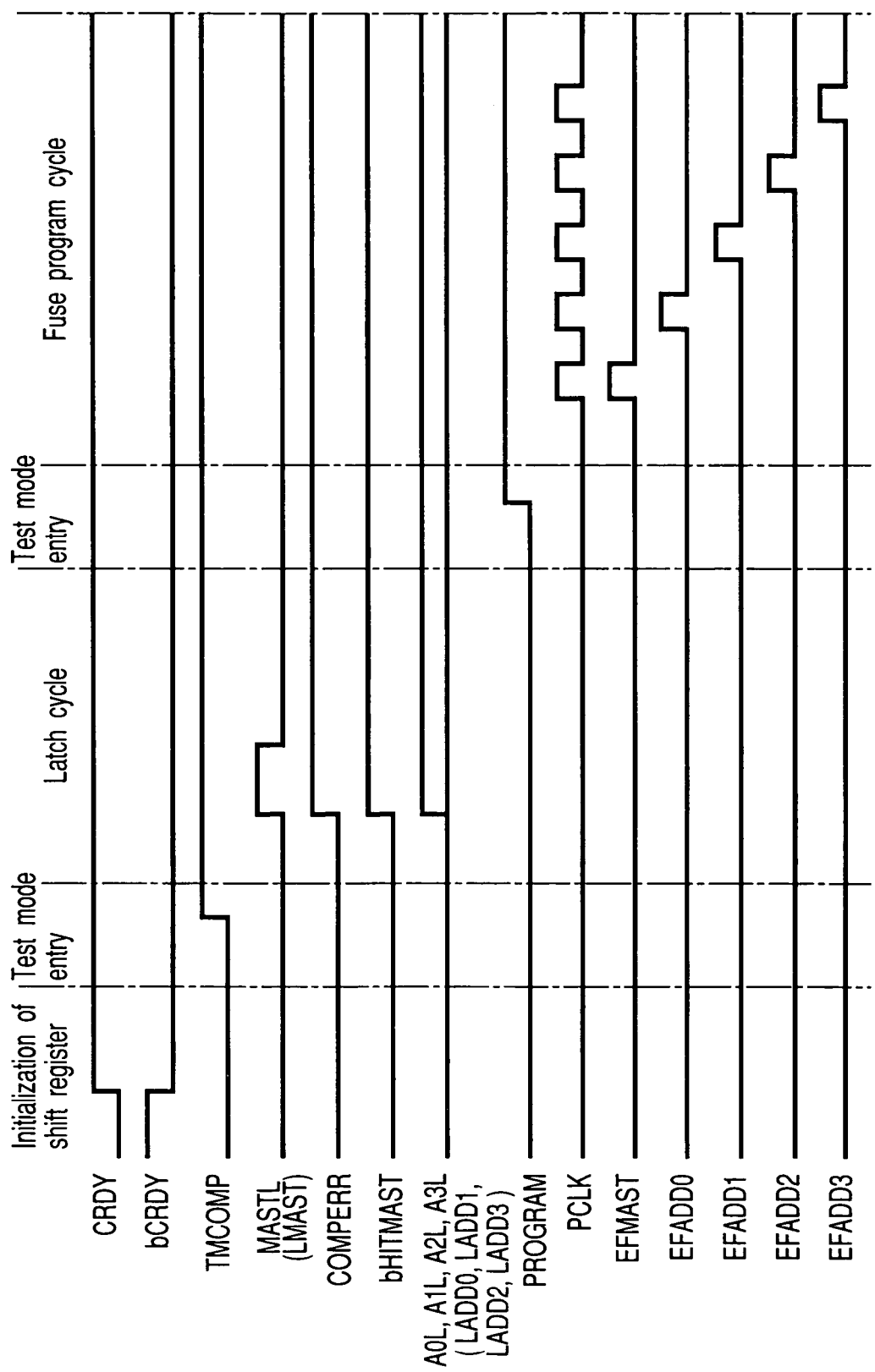
FIG. 28 is a waveform diagram depicting operations of the latch circuits of FIGS. 24 to 26.

FIG. 28 shows an example of an operation waveform of the latch circuit in FIGS. 24 to 27.

First, in a counter (shift register) initializing cycle, bCRDY is set to "H", and a counter is initialized. In addition, the latch circuits LATCH•BA0L, LATCH•MASTL, and LATCH•AnL are initialized (LAIN1 to LAIN3="L"). Then, bCRDY is set to "L".

TMCOMP is set to "H", and entry is made to the test mode (write cycle+pseudo read cycle). Then, a latch cycle is executed.

bHITMAST is set to "H". When the sense signal (latch signal) COMPERR is set to "H", the master data MASTL (="H") is latched by the latch circuit LATCH•MASTL, and the save address data AnL (n=0, 1, 2, 3) is latched by the latch circuit LATH AnL.

Then, PROGRAM is set to "H", and entry is made to the fuse program cycle of the test mode. The master data LMAST and the save address data LADDn are outputted from the latch circuits LATCH•MASTL and LATCH•AnL in synchronism with the clock signal PCLK.

<3>-4. Switch Circuit

FIGS. 29 and 30 each show an example of a switch circuit. When control signals EFMAST and EFADDn (n=0, 1, 2, 3) from the counter are set to "H", the switch circuit SW is set to a state in which data can be transferred.

For example, as shown in FIG. 29, a switch circuit SW for determining whether or not to transfer the master data LMAST is composed of a NAND gate circuit NAND20 and an inverter I31. When the control signal EFMAST from the counter is set to "H", the master data LMAST is transferred as fuse program data (master data) MAST from the latch circuit to the fuse program circuit.

Moreover, as shown in FIG. 30, a switch circuit SW for determining whether or not to transfer the save address data LADDn is composed of a NAND gate circuit NAND21 and an inverter I32. When the control signal EFADDn from the counter is set to "H", the save address data LADDn is transferred as fuse program data (save address data) ADDn from the latch circuit to the fuse program circuit.

In FIGS. 29 and 30, when the control signals EFMAST and EFADDm from the counter are set to "L", output data for the switch circuit SW is always set to "L".

<3>-5. Counter

<3>-5.-1. Outline

As described above, one end of a plurality of electrical fuses EF in the fuse program circuit FPi (FIG. 20) is connected to the VBP node in common. In this case, if data programming is executed for a plurality of or all of the electrical fuses EF at the same time, when two or more electrical fuses EF targeted for "1"-programming exist, a program may occur.

That is, first, assuming that one electrical fuse EF has been broken by a high voltage, the grounding node Vss flows from the VBP node via such one electrical fuse EF. Then, an electrical potential lowers at one end (VBP side) of the plurality of electrical fuses EF, and a sufficient high voltage is not applied to the electrical fuse EF targeted for "1"-programming which is not broken. Thus, there is a possibility that "1"-programming is disabled.

Because of this, in this example, the counter Ci for selecting an electrical fuse EF targeted for programming and the above-described switch circuit SW (FIGS. 29 and 30 are newly provided so as to program the master data LMAST and save address data LADDn for the electrical fuse EF in the fuse program circuit FPi on one bit by one bit basis.

<3>-5.-2. Overview

FIG. 31 shows an example of a counter.

In this example, the counter Ci (i=0, 1, 2, 3) is provided as a shift register having a TYPE-A circuit and a TYPE-B circuit.

Control signals PCLK, bPCLK, CRDY, and bCRDY are inputted to the TYPE-A circuit and the TYPE-B circuit each, and control operation of each of the circuits. A relationship between the control signal CRDY and the control signal bCRDY and a relationship between the control signal PCLK and the control signal bPCLK are as shown in FIG. 32.

<3>-5.-3. TYPE-A Circuit

FIG. 33 shows an example of the TYPE-A circuit.

The TYPE-A circuit is composed of: inverters I34 to I37; a clocked inverter CI4; a NAND gate circuit NAND22; a P-channel MOS transistor P7; and switches (transfer gates) SW1 and SW2.

In a shift register initializing cycle (FIG. 28), the control signal CRDY is set to "L", and an electrical potential of an input node nodeA of a latch portion in the TYPE-A circuit is set to "H". In addition, when the control signal CRDY is set to "L", the clocked inverter CI4 is set to an active state. Thus, "H" is latched at a latch portion composed of the inverter I34 and the clocked inverter CI4.

The control signal PCLK, as shown in FIG. 27, is provided as a clock signal obtained by taking an AND logic between the fuse program signal PROGRAM and the external clock signal CLK. Since the control signal PCLK is initially set to an "L" state, the switch SW2 is set to an ON state, and "H" is latched at a latch portion composed of the inverters I35 and I36. The electrical potential of the node nodeA and a potential of FOUT are equal to each other (FOUT="H").

Then, the control signal CRDY is set to "H".

In the fuse program cycle, since the fuse program signal PROGRAM is set to "H", the clock signal PCLK synchronism with the external clock CLK is generated. An operation of the TYPE-A circuit is controlled by the clock signal PCLK.

That is, when the clock signal PCLK is set to "H", the switch SW1 is set to an ON state, and "L" is latched at the latch portion composed of the inverter I34 and the clocked inverter CI4 (nodeA="L"). In addition, an output signal FOUT is set to "H", and two input signals of the NAND gate circuit NAND22 are set to "H". As a result, the control signal EFMAST is set to "H".

When the control signal EFMAST is set to "H", the above-described switch circuits (FIG. 29) are set to a state in which the master data LMAST can be transferred.

Thereafter, when the clock signal PCLK is set to "L", the switch SW1 is set to an OFF state, and the switch SW2 is set to an ON state again. Then, "L" is latched at the latch portion composed of the inverters I35 and I36 as well. The electrical potential of the node nodeA and the electrical potential of FOUT are equal to each other (FOUT="L").

Further, when the clock signal PCLK is then set to "H", the switch SW1 is set to an ON state, and "L" is latched at the latch portion composed of the inverter I34 and the clocked inverter CI4 (nodeA="L"). In addition, since the output signal FOUT is set to "L", the control signal EFMAST is set to "L".

The control signal EFMAST is set to "H" when a first cycle of the clock signal PCLK, i.e., the clock signal PCLK is first set to "H", and "L" is always set in the subsequent cycles.

<3>-5.-4. TYPE-B Circuit

FIG. 34 shows an example of the TYPE-B circuit.

The TYPE-B circuit is composed of: inverters I38 to I42; a NAND gate circuit NAND23; an N-channel MOS transistor N9; and switches (transfer gates) SW3 and SW4.

In a shift register initializing cycle (FIG. 28), the control signal CRDY is set to "L", the control signal bCRDY is set to "H", and an electrical potential of an input node nodeB of a latch portion in the TYPE-B circuit is set to "L". That is, "L" is latched at a latch portion composed of the inverters I38 and I39.

The control signal PCLK is provided as a clock signal obtained by taking an AND logic between the fuse program signal PROGRAM and the external clock signal CLK. Since the control signal PCLK is first set to an "L" state, the switch SW4 is set to an ON state. In addition, "L" is latched at a latch portion composed of the inverters I40 and I41 as well. The electrical potential of the node nodeB and an electrical potential of FOUTm are equal to each other (FOUTm="L").

Then, the control signal bCRDY is set to "L".

In the fuse program cycle, the fuse program signal PROGRAM is set to "H", and thus, the clock signal PCLK synchronized with the external clock signal CLK is generated. An operation of the external clock signal CLK is controlled by the clock signal PCLK.

That is, when the clock signal PCLK is set to "H", the switch SW3 is set to an ON state, and input data FINm is latched at the latch portion composed of the inverters I38 and I39 (nodeB=FINm).

The input data FINm is provided as an output signal of a unit at a previous stage. In the case where the unit at the previous stage is the TYPE-A circuit, the input data FINm is obtained as output data FOUT of the TYPE-A circuit. In addition, in the case where the unit at the previous stage is the TYPE-B circuit, the input data FINm is obtained as output data FOUTm-1 of the TYPE-B circuit at the previous stage.

Since the output signal FOUTn is first set to "L", output data for the NAND gate circuit NAND22 is set to "H". As a result, the control signal EFADDm is set to "L".

Thereafter, when the clock signal PCLK is set to "L", the switch SW3 is set to an OFF state, and the switch SW4 is set to an ON state again. Then, the input data FINm, i.e., the output signal of the unit at the previous unit is latched at the latch portion composed of the inverters I40 and I41 as well. The electrical potential of the node nodeB and the electrical potential of FOUTm are equal to each other.

Further, if the clock signal is then set to "H", when the input data FINm latched at the latch portion composed of the inverters I38 and I39 in a cycle before this cycle is set to "H", a current state of FOUTm is set to "H". Thus, the control signal EFADDm is set to "H".

When the control signal EFADDm is set to "H", the above-described switch circuit (FIG. 30) is set to a state in which the circuit can transfer save address data (1 bit) LADDm.

In the cycle before this cycle, when the input data FINm latched at the latch portion composed of the inverters I38 and I39, the current state of FOUTn is set to "L", and thus, the control signal EFADDm is set to "L".

In the case where the control signal EFADDm is set to "H" once, the control signal EFADDm is always set to "L" in that cycle and the subsequent cycles.

As has been described above, in the counter operation shown in FIGS. 31 to 34, when the clock signal PCLK is set to "H" in a first cycle, the control signal EFMAST is set to "H". In the subsequent cycles, every time the clock signal PCLK is set to "H", "H" is sequentially shifted from a control signal EFADD0 to a control signal EFADD3.

<3>-5.-5. Operation

Figure 35:
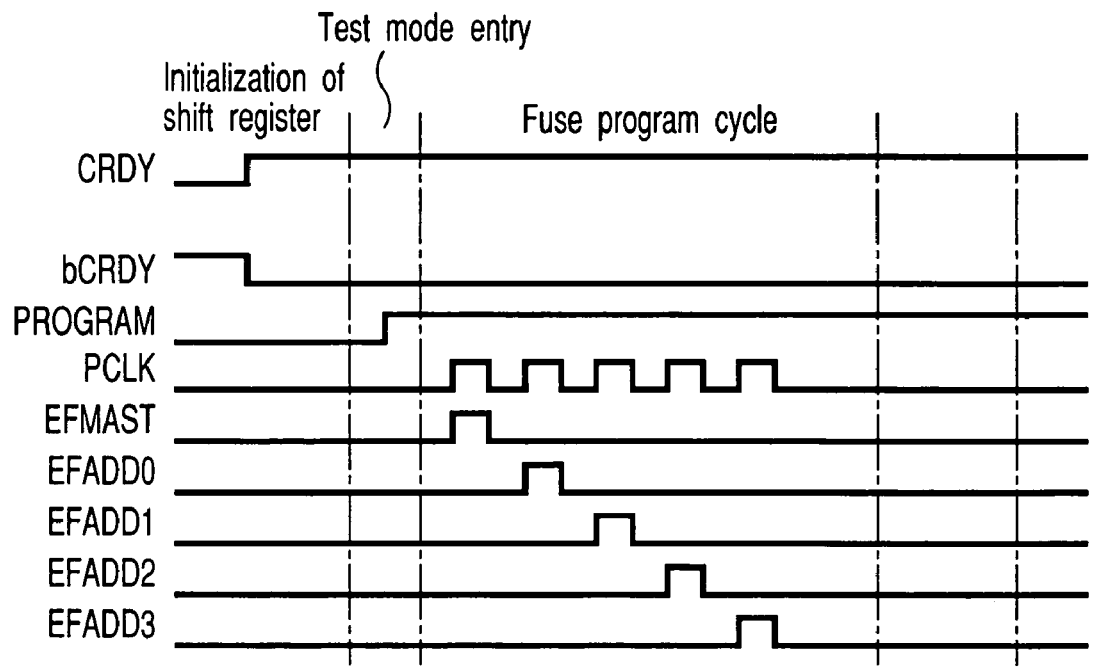
FIG. 35 is a waveform diagram depicting operations of the counters of FIGS. 31 to 34.

FIG. 35 shows an example of an operating waveform of the counter in FIGS. 31 and 34.

In a shift register initializing cycle, the control signal CRDY is set to "H", and the control signal bCRDY is set to "L". In the test mode entry cycle, the fuse program signal PROGRAM is set to "H", and then, in a fuse program cycle, data programming for the electrical fuse EF is actually executed.

That is, when the control signal PCLK is first set to "H", the control signal EFMAST is set to "H". For example, the transistor Tr2 associated with the master data FMAST of FIG. 20 is set to an ON state, the electrical fuse EF is broken, and "1"-programming is executed.

Next, when the control signal PCLK is set to "H", the control signal EFADD0 is set to "H". For example, the transistor Tr2 associated with the save address data FADD0 of FIG. 20 is set to an ON or OFF state according to program data.

In the case where the fuse program data ADD0 is set to "1", the transistor Tr2 associated with the save address data FADD0 of FIG. 20 is set to an ON state. Thus, the electrical fuse EF is broken. In the case where the fuse program data ADD0 is set to "0", the transistor Tr2 associated with the save address data FADD0 of FIG. 20 is set to an OFF state. Thus, the electrical fuse EF is not broken.

Then, every time the control signal PCLK is set to "H", control signals EFADD1 to EFADD3 are sequentially set to "H". For example, save address data is programmed for the electrical fuse EF associated with the save address data FADD1 to FADD3 of FIG. 20.

In the fuse program cycle shown in this example, the control signal PCLK is set to "H" in 5 cycle, i.e., five times, whereby one item of save address data is programmed for one fuse program circuit FPi which corresponds to one bank "i".

According to examples of the present invention, programming operations for the electrical fuse EF in the fuse program circuit FPi are always identical to each other irrespective of the value of the save address data. Thus, fuse programming for a plurality of chips can be carried out by using a single tester at the same time.

That is, in a conventional programming operation for the electrical fuse EF, since a programming operation has been carried out only for an electrical fuse which executes "1"-programming (breakage of insulation film), a single tester can perform only a fuse program for one chip.

In contrast, by using the error detector circuit and self fuse program circuit according to the present invention, fuse programming is always executed by an operation as shown in FIG. 35 irrespective of the value of the save address data.

That is, in the example of the present invention, programming operation is executed for the electrical fuse EF which executes "0"-programming as well as the electrical fuse EF which executes "1"-programming (breakage of insulation film). However, in "0"-programming operation, the electrical fuse EF is not broken, and the state of the electrical fuse EF is not changed at all.

<4> Monitor Circuit

<4>-1. Outline

Now, a monitor circuit will be given here.

A monitor circuit Mi (i=0, 1, 2, 3) corresponds to the fuse program circuit FPi. In this example, assuming that four banks 0 to 3 are provided, four fuse program circuits FPi are provided in a chip. Thus, four monitor circuits Mi are allocated in the chip. However, as shown in an example described later, one monitor circuit Mi may be provided for all the banks 0 to 3 or all the fuse program circuits FPi.

As shown in FIG. 20, for example, the monitor circuit Mi is composed of an inverter I20, a transfer gate (switch) TG, and a monitor 22. The test mode verify signal TMVERIFY is provided as a signal set to "H" when verifying save address data programmed in the electrical fuse EF in the fuse program circuit FPi.

In the case of using the error detector circuit and self fuse program circuit according to the example of the present invention, a save address is automatically generated in a chip and is automatically programmed in the chip.

Then, the monitor circuit Mi is provided for monitoring the save address data programmed for the fuse program circuit FPi. The monitor circuit Mi may be provided at the inside or outside of the chip. A portion of the monitor circuit Mi, for example, only the monitor 22 may be provided at the outside of the chip.

The monitor circuit Mi can be used to monitor the save address data programmed for the fuse program circuit FPi.

For example, in the test mode, the sense signal (latch signal) COMPERR is monitored by a tester, and external address data (save address data) A0 to A3 are stored in advance when COMPERR="H". Then, after programming of the save address data according to the present invention has completed, it is possible to check (verify) whether or not the save address data has been precisely programmed by using the monitor circuit Mi.

<4>-2

Figure 50:
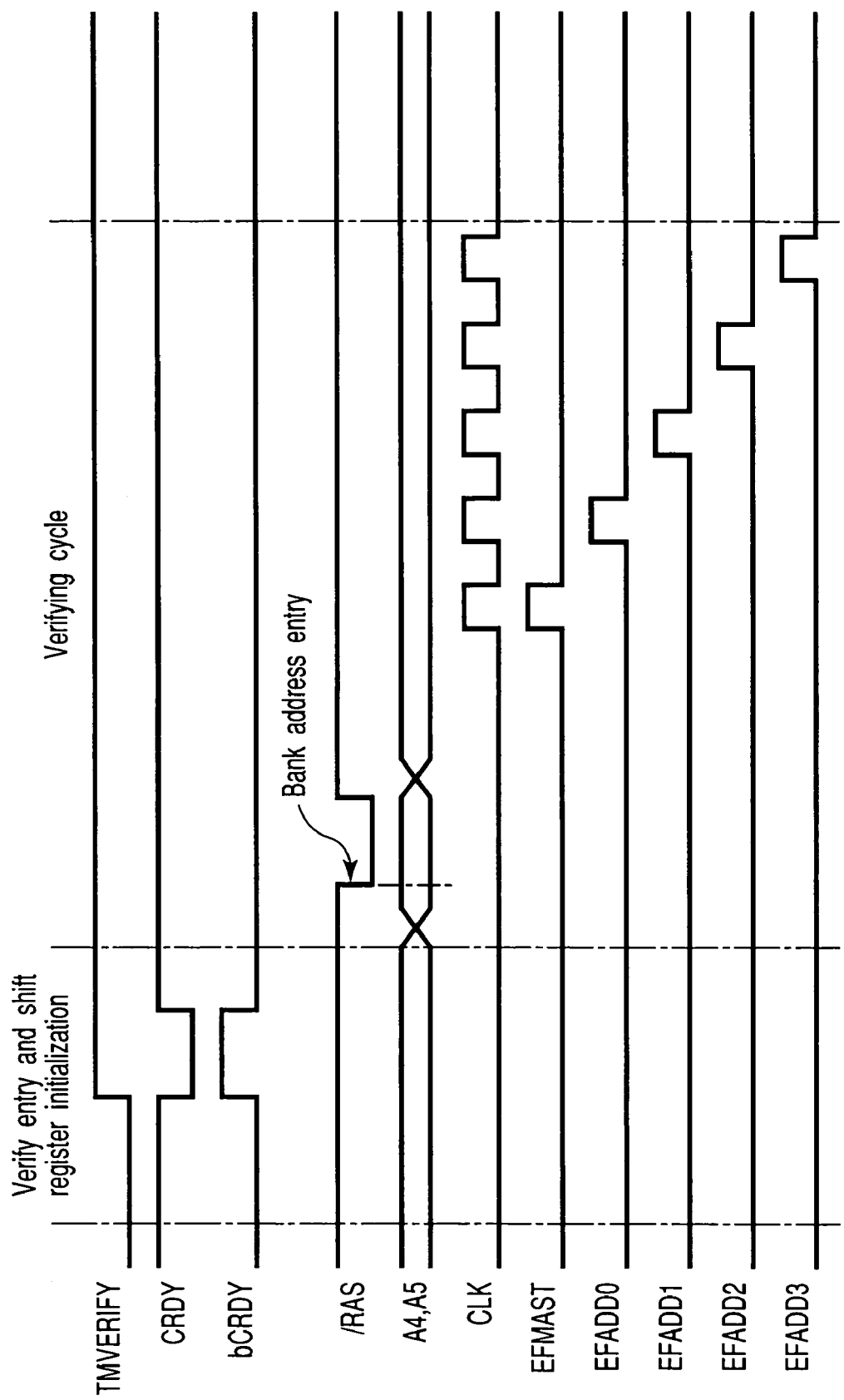
FIG. 50 is a waveform diagram depicting operations of the counters of FIGS. 45 to 49.

FIG. 50 shows an example of an operating waveform of a verifying operation.

In this example, since one monitor circuit is associated with one bank, /RAS and A4 or A5 used to select a bank may be ignored.

In a verifying operation, for example, a power supply electrical potential Vdd is applied to the VBP node connected to one end of the electrical fuse EF of FIG. 20 in common, instead of the high electrical potential VBP. In a verify mode, first, the test mode verify signal TMVERIFY is set to "H".

At this time, for example, the output data LMAST for the master latch circuit LATCH•MASTL shown in FIG. 25 and the output data LADDn for the save address data latch circuit LATCH•AnL shown in FIG. 26 are forcibly set to "H". In addition, the transfer gate TG in the monitor circuit Mi in FIG. 20 is set to an ON state, and the monitor 22 is electrically connected to one end of the transistor Tr2 in the fuse program circuit FPi.

The control signal CRDY is set to "L", and the counter (shift register) Ci of FIGS. 31 to 34 is initialized. Then, the control signal CRDY is set to "H".

In a verifying cycle, in synchronism with the clock signal CLK, the output data EFMAST, EFADD0, EFADD1, EFADD2, and EFADD3 for the counter Ci of FIG. 20 are sequentially set to "H".

The output data LMAST and LADDn for the latch circuits LA0, LA1, LA2, and LA3 of FIG. 20 are set to all "H", as described above. Thus, the output data EFMAST, EFADD0, EFADD1, EFADD2, and EFADD3 of the counter Ci are sequentially set to "H", whereby the state of the electrical fuse EF in the fuse program circuit FPi can be monitored by the monitor circuit Mi.

For example, when the output data EFADD0 of the counter Ci is set to "H", the other end of the electrical fuse EF associated with the save address data FADD0 is electrically connected to the monitor circuit Mi. In this case, if the electrical fuse EF is broken (in a state in which "1" is set), a current flows from the VBP node to the monitor circuit Mi. If the electrical fuse EF is not broken (in a state in which "0" is set), no current flows from the VBP node to the monitor circuit Mi.

Therefore, for example, the presence or absence of this current is detected by the monitor circuit Mi, thereby making it possible to check the state of the electrical fuse EF associated with the save address data FADD0.

In the case of self fuse programming (self saving), since an expected value (a value to be programmed) does not eventually exist, there is no need to execute verifying of fuse program data.

However, even in such a circumstance, verifying is required for checking a circuit operation in the case of intentionally programming write data instead of self fuse programming. Namely, data verified by the monitor circuit Mi is compared with the save address data stored in a tester, thereby making it possible to check (verify) whether or not the save address data has been precisely programmed in the fuse program circuit FPi.

Verifying operation can be continuously carried out after fuse programming operation. However, as shown in FIG. 50, before the verifying operation, there is a need to carry out verify entry operation and shift register initializing operation.

<5> Modified Example

A description will be given with respect to a modified example of the bank address data latch circuit LATCH•BA0L of FIG. 24, the master data latch circuit LATCH•MASTL of FIG. 25, and the save address data latch circuit LATCH•AnL of FIG. 26.

<5>-1. Bank Address Data Latch Circuit BanL

Figure 36:
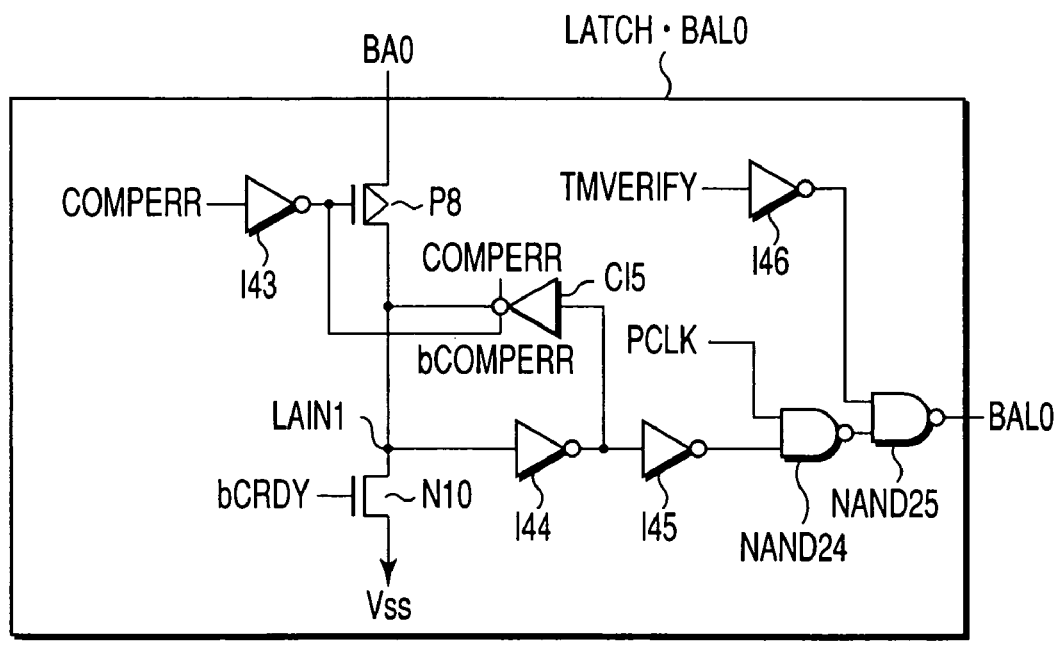
FIG. 36 is a circuit diagram depicting a modified example of the bank address data latch circuit.

FIG. 36 shows an example of the latch circuit LATCH•BA0L in the band address data latch circuit BanL.

The latch circuit LATCH•BA0L is composed of: inverters I43 to I46; a clocked inverter CI15; an NAND gate circuits NAND24 and NAND25; a P-channel MOS transistor P8; and an N-channel MOS transistor N10.

The N-channel MOS transistor N10 is used for an initializing operation after power has been turned ON. In this example, bCRDY is set to "H", whereby the input node LAIN1 of the data latch portion is initialized to "L".

In a latch cycle during the test mode, for example, when the value of the sense signal (latch signal) is set to "H", the P-channel MOS transistor P8 is set to an ON state. Thus, the bank selection signal BA0 is transferred to the input node LAIN1 of the data latch portion via the P-channel MOS transistor P8.

When the value of the sense signal (latch signal) COMPERR is set to "L", the P-channel MOS transistor P8 is set to an OFF state. Thus, the bank selection signal BA0 is not transferred to the input node LAIN1 of the data latch portion.

In this example, the latch portion for actually latching data is composed of the inverter 144 and the clocked inverter CI5.

When the value of the sense signal (latch signal) COMPERR is set to "H", the clocked inverter CI15 is set to an active state, and the latch portion is set to a state in which it can latch the band select signal BA0. When the value of the sense signal (latch signal) is set to "L", the clocked inverter CI5 is set to an inactive state.

In the case where bank 0 has been selected, since the bank selection signal BA0 is set to "H", "H" is latched at the latch portion. Further, in the case where bank 0 has not been selected, since the bank selection signal BA0 is set to "L", "L" is latched at the latch portion.

The bank selection signal BA0 latched at the latch portion is synchronized with the clock signal PCLK to be outputted from the latch circuit LATCH•BA0L as the bank selection signal BAL0.

When the test mode verify signal TMVERIFY is set to "H", the output data BAL0 of the latch circuit LATCH•BA0L is fixed to "H".

<5>-2. Master Data Latch Circuit MASTL

Figure 37:
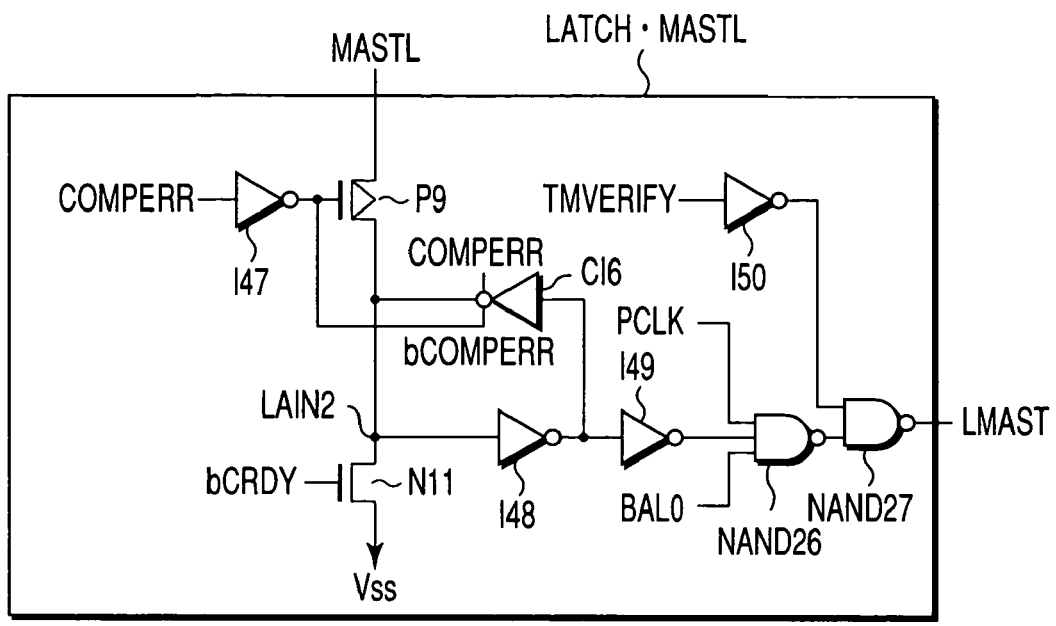
FIG. 37 is a circuit diagram depicting a modified example of the master data latch circuit.

FIG. 37 shows an example of the latch circuit LATCH•MASTL in the master data latch circuit MASTL.

The latch circuit LATCH•MASTL is composed of: inverters I47 to I50; a clocked inverter CI6; NAND gate circuits NAND26 and NAND27; a P-channel MOS transistor P9; and an N-channel transistor N11.

The N-channel MOS transistor N11 is used for an initializing operation after power has been turned ON. In this example, bCRDY is set to "H", whereby the input node LAIN2 of the data latch portion is initialized to "L".

In the case where bank 0 has been selected, the bank selection signal BAL0 (="H") outputted from the bank address data latch circuit LATCH•BA0L of FIG. 36 described above is outputted in synchronism with the clock signal PCLK. Further, in the case where a memory cell targeted for testing in bank 0 is faulty, the sense signal (latch signal) COMPERR is set to "H".

Therefore, the P-channel MOS transistor P9 is set to an ON state. Thus, the master data (="H") MASTL is transferred to the input node LAIN2 of the data latch portion via the P-channel MOS transistor P9.

When the value of the sense signal (latch signal) is set to "L", the P-channel MOS transistor P9 is set to an OFF state. Thus, the master data (="H") MASTL is not transferred to the input node LAIN2 of the data latch portion.

The latch portion is composed of the inverter I48 and the clocked inverter CI6. When the value of the sense signal (latch signal) COMPERR is set to "H", the clocked inverter CI6 is set to an active state, and the latch portion latches master data (="H") MASTL. When the value of the sense signal (latch signal) COMPERR is set to "L", the clocked inverter CI6 is set to an inactive state.

The master data (="H") MASTL latched at the latch portion is synchronized with the clocked signal PCLK to be outputted from the latch circuit LATCH•MASTL as master data MAST.

When the bank selection signal BAL0 is set to "L", the output data LMAST for the latch circuit LATCH•MASTL is set to "L". In addition, when the test mode verify signal TMVERIFY is set to "H", the output data LMAST for the latch circuit LATCH•MASTL is fixed to "H".

<5>-3. Save Address Data Latch Circuit AnL

Figure 38:
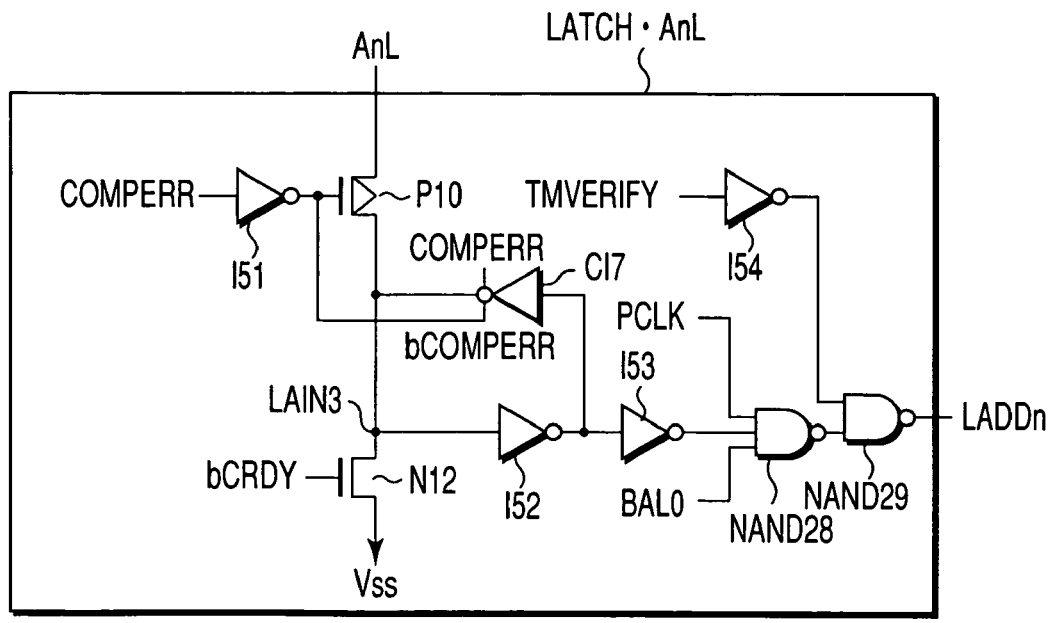
FIG. 38 is a circuit diagram depicting a modified example of the save address data latch circuit.

FIG. 38 shows an example of the latch circuit LATCH•AnL in the save address data latch circuit AnL.

The latch circuit LATCH•AnL is composed of: inverters I51 to I54; a clocked inverter CI7; NAND gate circuit NAND28 and BAND29; a P-channel MOS transistor P10; and an N-channel MOS transistor N12.

The N-channel MOS transistor N12 is used for an initializing operation after power has been turned ON. In this example, bCRDY is set to "H", whereby the input node LAIN3 of the data latch portion is initialized to "L".

In the case where bank 0 has been selected, the bank selection signal BAL0 (="H") outputted from the bank address data latch circuit LATCH•BA0L of FIG. 36 described above is outputted in synchronized with the clock signal PCLK. Further, in the case where a memory cell targeted for testing in bank 0 is faulty, the sense signal (latch signal) COMPERR is set to "H".

Therefore, the P-channel MOS transistor P10 is set to an ON state. Thus, the save address data AnL is transferred to the input node LAIN3 of the data latch portion via the P-channel MOS transistor P10.

In addition, when the value of the sense signal (latch signal) COMPERR is set to "L", the P-channel MOS transistor P10 is set to an OFF state. Thus, the save address data AnL is not transferred to the input node LAIN3 of the data latch portion.

The latch portion is composed of the inverter I52 and the clocked inverter CI7. When the value of the sense signal (latch signal) COMPERR is set to "H", the clocked inverter is set to an active state, and the latch portion latches save address data AnL. When the value of the sense signal (latch signal) COMPERR is set to "L", the clocked inverter CI7 is set to an inactive state.

The save address data AnL latched at the latch portion is synchronized with the clock signal PCLK, and save address data LADDn is outputted from the latch circuit LATCH•AnL.

When the bank selection signal BAL0 is set to "L", the output data LADDn for the latch circuit LATCH•AnL is fixed to "L". In addition, when the test mode verify signal TMVERIFY is set to "H", the output data LADDn for the latch circuit LATCH•AnL is fixed to "H".

<6> Advantageous Effect

According to the fist embodiment of the present invention, in a chip, there are newly provided: an error detector circuit for detecting a faulty memory cell; and a self fuse program circuit for automatically programming an address of that faulty memory cell as a save address for a fuse program circuit. Thus, in particular, a faulty memory cell which occurs after an assembling process can be saved without using an expensive tester incorporating an FAM.

For example, as shown in FIG. 51, according to a test flow of the present invention, it is possible to test a faulty memory cell which occurs after an assembling process by means of an inexpensive tester which does not have a function for generating a save address. Moreover, generation of a save address and programming thereof are automatically carried out in a chip (self fuse programming), and fuse programming can be carried out for a plurality of chips by means of a single tester at the same time.

Figure 7:
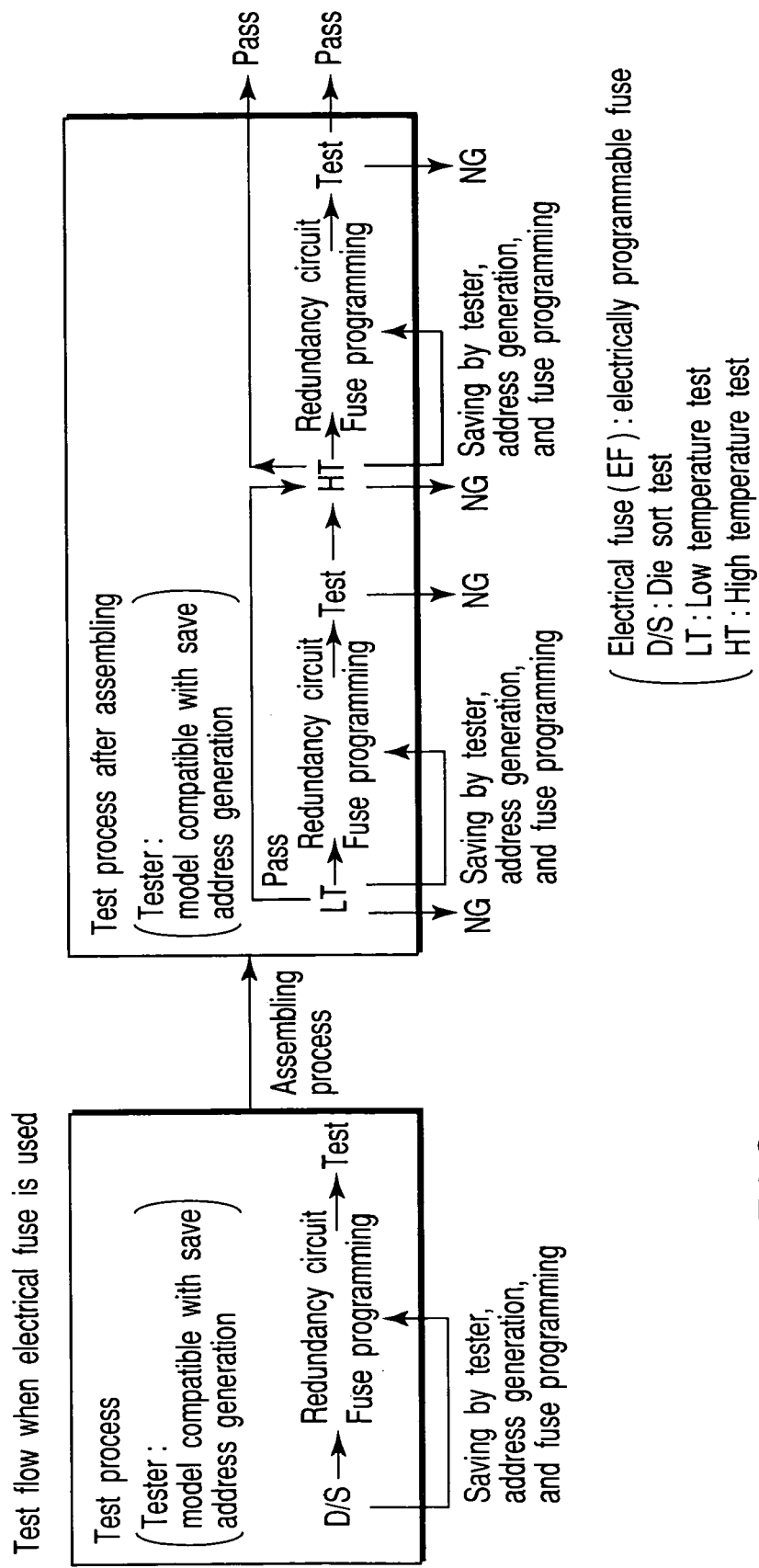
FIG. 7 is a view showing a test flow when an electrical fuse is used.

This advantageous effect is obvious in comparing the test flow of FIG. 51 with the test flow of FIG. 7.

Therefore, manufacturing cost can be reduced due to reduction of a test time.

(3) SECOND EMBODIMENT

Now, a semiconductor memory according to a second embodiment of the present invention will be described here.

<1> Overview

Figure 39:
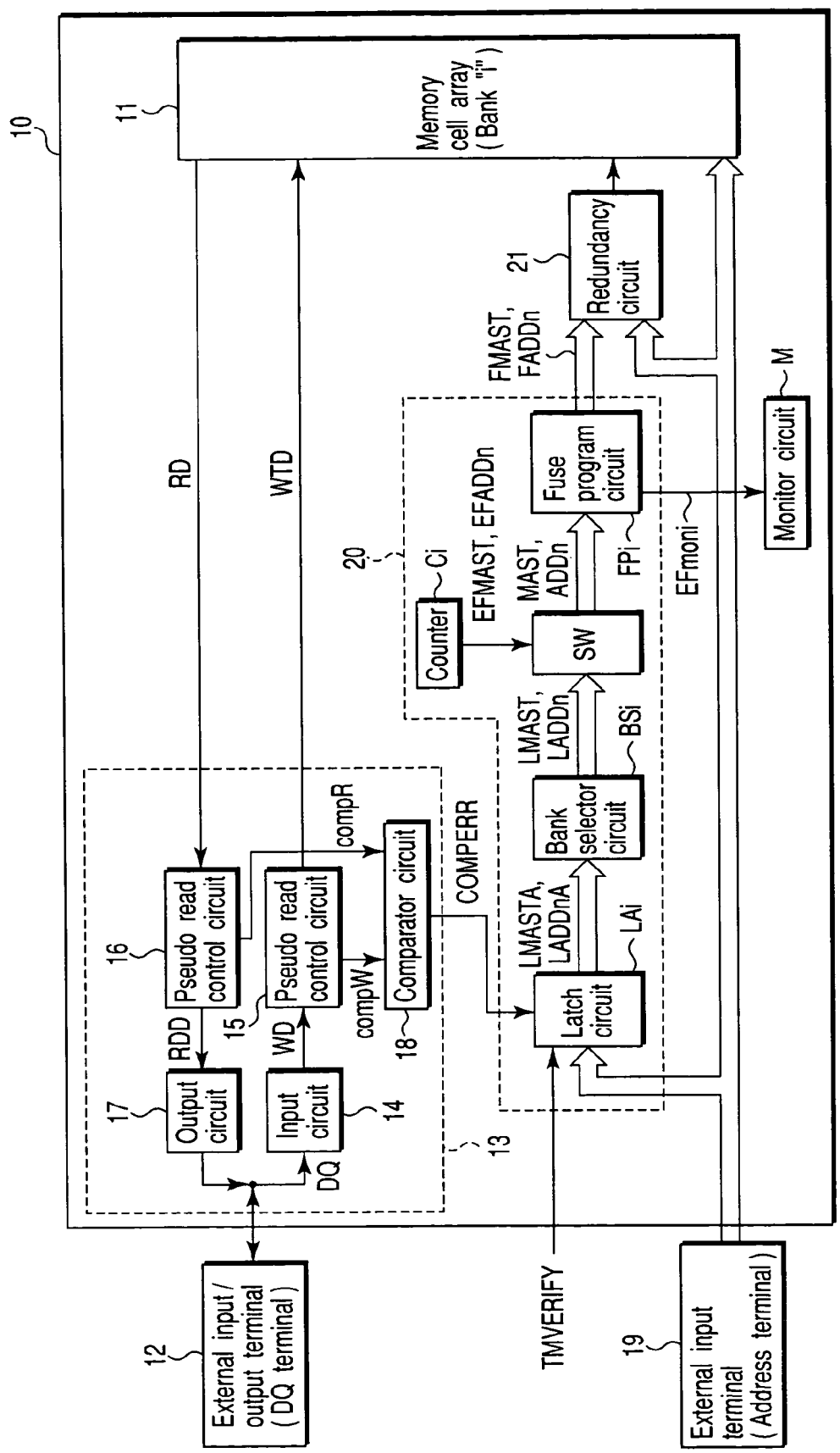
FIG. 39 is a block diagram depicting essential portions of a semiconductor memory according to a second embodiment of the present invention.

FIG. 39 shows essential portions of the semiconductor memory according to the second embodiment of the present invention.

In comparison with the semiconductor memory according to the first embodiment, the semiconductor memory according to the second embodiment is featured in that a bank selector circuit BSi capable of achieving a bank select function for selecting a bank in the test mode verify cycle has been provided in a self fuse program circuit 20.

In the first embodiment, the latch circuit LAi has a bank select function. However, this bank select function has been achieved in a fuse program cycle during the test mode. Namely, in the test mode verify cycle, the test mode verify signal TMVERIFY is set to "H", whereby a save address data monitor operation has been carried out for all fuse program circuits FPs which correspond to all the banks (FIGS. 20, 24 to 19, and 36 to 38).

In contrast, in the second embodiment, the bank selector circuit BSi can achieve a bank select function for selecting a bank in a fuse program cycle and a verify cycle during the test mode. Thus, only the save address data programmed for the electrical fuse EF in the fuse program circuit FPi which corresponds to the selected bank can be selectively monitored by the monitor circuit M. As a result, providing only one monitor circuit M in the chip 10 will suffice.

Now, a specific configuration of the semiconductor memory of this embodiment will be described here.

A memory cell array 11 is allocated in a chip 10. The memory cell array 11 may be one of a plurality of memory blocks (for example, a bank). In this embodiment, the memory cell array 11 is assumed to include a potion of the peripheral circuits such as a decoder, a sense amplifier, a read/write circuit.

An external input/output terminal (DQ terminal) 12 is provided as an element for capturing program data in the chip 10 and outputting read data to the outside of the chip. An input circuit 14A transfers to the memory cell array 11 the program data provided to the external input/output terminal 12. An output circuit 17A transfers to the external input/output terminal 12 the read data read out from the memory cell array 11.

A pseudo read control circuit 15 is allocated between the memory cell array 11 and the input circuit 14A, and a pseudo read control circuit 16 is allocated between the memory cell array 11 and the output circuit 16. A comparator circuit 18 outputs a sense signal (latch signal) COMPERR based on output data compW and compR of the pseudo read control circuits 15 and 16.

The pseudo read control signal 15 has a function for transferring to the memory cell array 11 the program data provided to the external input/output terminal 12 during the write mode (including a write operation during the test mode) and transferring to the comparator 18 the program data (expected value) provided to the external input/output terminal 12 in an operation for inputting an expected value during the test mode (pseudo read cycle).

In addition, in a write operation during the test mode and in an operation for inputting an expected value during the test mode (pseudo read cycle), the input circuit 14 is activated such that the input circuit can transfer to the pseudo read control circuit 15 the program data provided to the external input/output terminal 12.

The pseudo read control circuit 16 has a function for transferring to the output circuit 17 the read data read out from the memory cell array 11 during the read mode and transferring to the comparator circuit 18 the read data read out from the memory cell array 11 in a read operation during the test mode (pseudo read cycle).

In a read operation during the test mode (pseudo read cycle), the output circuit 17 is activated so as not to transfer output data for the pseudo read control circuit 16 to the external input/output terminal 12.

The comparator circuit 18 compares program data (expected value) compW with read data compR during the test mode, and detects a faulty cell based on the comparison result.

The pseudo read control circuits 15 and 16 and the comparator circuit 18 configure an error detector circuit 13.

An external input terminal (address terminal) 19 is provided as an element for capturing row/column address data in the chip 10 during the read/write mode and during the test mode. The row/column address data is provided to the memory cell array 11 via the external input terminal 19, and is used to select a memory cell.

In a write operation during the test mode, row or column data is supplied to the chip 10 in order to program the program data (test data) for the memory cell in the memory cell array 11. In a read operation during the test mode (pseudo read cycle), row/column address data is supplied to the chip 10 in order to read data for comparison with program data (expected value) from the memory cell in the memory cell array 11.

In a save address latch cycle during the test mode, in the case where a faulty cell has existed in the memory cell array 11, row/column address data (a portion of which is actually latched) is supplied to the chip 10 so as to latch an external address of that faulty cell as a save address at a latch circuit LAi.

The latch circuit LAi latches a save address (save solution) in a save address latch cycle during the test mode. In the case of row saving for saving a faulty cell in units of rows, the latch circuit LAi latches a row address. In the case of column saving for saving a faulty cell in units of columns, the latch circuit LAi latches a column address.

A fuse program circuit FPi comprises a fuse array composed of a plurality of electrical fuses. The fuse program circuit FPi electrically breaks a capacitor insulating film of one electrical fuse (for example, capacitor) in a fuse array determined by fuse program data MAST and ADDn. Finally, master data (1 bit) FMAST and save address data (a plurality of bits) FADDn are programmed in a fuse array.

The master data FMAST is provided as data for determining whether the fuse program circuit FPi is valid or invalid. In the case where the master data FMAST indicates that the fuse program circuit FPi is valid, the save address data FADDn programmed in the fuse program circuit FPi is valid.

A counter Ci and a switch circuit SW are provided to program the save addresses latched at the latch circuit LAi in an electrical fuse on one bit by one bit basis. 1 bit selected by the counter $C_i$, of a plurality of bits configuring the save address data is transferred from the latch circuit $LA_i$ to the fuse program circuit $FP_i$.

The bank selector circuit $BS_i$ is provided as an element for selecting one of a plurality of banks during test mode fuse programming and during verifying operation and executing a fuse programming operation for the fuse program circuit $FP_i$ which corresponds to the one selected bank and a verifying operation of the save address programmed therefor.

The latch circuit $LA_i$, the bank selector circuit $BS_i$, the fuse program circuit $FP_i$, the counter $C_i$, and the switch SW configure a self fuse program circuit 20.

The monitor circuit M is provided as a circuit for detecting whether or not the master data FMAST and save address data FADDn have been precisely programmed for a fuse array.

In the read/write mode, the fuse program circuit $FP_i$ outputs the master data FMAST and save address data FADDn. A redundancy circuit 21 compares the save address data FADDn with the external address data in the case where the master data FMAST indicates that the fuse program circuit $FP_i$ is valid.

When both of them coincide with each other, the redundancy circuit 21 outputs a replacement signal Rep. The memory cell array 11 selects a spare cell instead of a faulty cell upon the receipt of the replacement signal Rep.

<2> Error Detector Circuit

Examples (FIGS. 9 to 19) of the error detector circuit 13 of FIG. 8, for example, can be applied as is, to the error detector circuit 13 of FIG. 39. Therefore, a description of the error detector circuit 13 is omitted here.

<3> Self Fuse Program Circuit

Now, an example of the self fuse program circuit 20 of FIG. 39 will be described here.

The self fuse program circuit 20 has a function for, when a faulty cell has been detected, latching an address of that faulty cell as a save address (save solution), and programming that save address for an electrical fuse on one bit by one bit basis.

The self fuse program circuit 20 is composed of the latch circuit $LA_i$, the bank selector circuit $BS_i$, the fuse program circuit $FP_i$, the counter $C_i$, and the switch circuit SW.

Upon explanation of this circuit, as in the first embodiment, presumption is defined as follows. 4 banks (memory cell array) are allocated in a single chip. One self fuse program circuit and one redundancy circuit are provided for one bank. One bank consists of 16 rows or 16 columns, and save address data FADD0 to FADD3 are composed of 4 bits.

This presupposition is merely provided for clear understanding of the present invention, as in the first embodiment. The number of banks, the number of self fuse program circuits corresponding to a single bank, the number of redundancy circuits, the number of rows/columns for a single bank, and whether row saving or column saving is carried out can be changed.

In the following, a description will be given with respect to an example in which one save address (save solution) is obtained for one bank, and this address is subject to self programming. However, a plurality of save addresses (save solutions) are obtained, whereby the save addresses may be subject to self programming.

<3>-1. Outline

FIG. 40 shows an outline of a self fuse program circuit.

The self fuse program circuit comprises the latch circuit $LA_i$ (i=0, 1, 2, 3) for, when a faulty cell has been detected, latching an address of that faulty cell as a save address (save solution); the fuse program circuit $FP_i$ for programming a save address for an electrical fuse; the counter $C_i$ and switch circuit SW for programming a save address for an electrical fuse on one bit by one bit basis; and the bank selector circuit for selecting a bank targeted for a fuse programming operation or a verifying operation.

A test mode verify signal TMVERIFY is provided as a signal activated when checking (verifying) data programmed for the electrical fuse EF in the fuse program $FP_i$. Master data Master (Vext) and address data A0 to A5 are inputted to the latch circuit $LA_i$.

The master data Master is provided as data for determining whether or not the fuse program circuit $FP_i$ is valid or invalid. In the case where a save address (save solution) is programmed for the fuse program $FP_i$, the master data Master is set to a value (for example, "1") indicating that the fuse program circuit $FP_i$ is valid.

2-bit address data A4 and A5 of the address data (6 bits) A0 to A5 are used to select a bank. That is, one of the 4 banks is selected based on the address data A4 and A5, and programming of a save address (save solution) and verification of the data programmed for the electrical fuse EF in the fuse program $FP_i$ is executed for the one selected bank.

The remaining 4-bit address data A0 to A3 each indicate a faulty address (save solution) for the selected bank. In the case of row saving in which a faulty cell is replaced with a spare cell in units of rows, the address data A0 to A3 are provided as row address data. In the case of column saving in which a faulty address is replaced with a spare cell in units of columns, the address data A0 to A3 are provided as column address data.

One row/column (faulty address) of 16 rows/columns is selected based on the 4-bit address data A0 to A3.

<3>-2. Fuse Program Circuit

A fuse program circuit $FP_i$ (i=0, 1, 2, 3) of FIG. 40 is completely identical to that of FIG. 20. Therefore, a description of the fuse program circuit $FP_i$ is omitted here.

<3>-3. Latch Circuit and Bank Selector Circuit

<3>-3.-1. Overview

Figure 41:
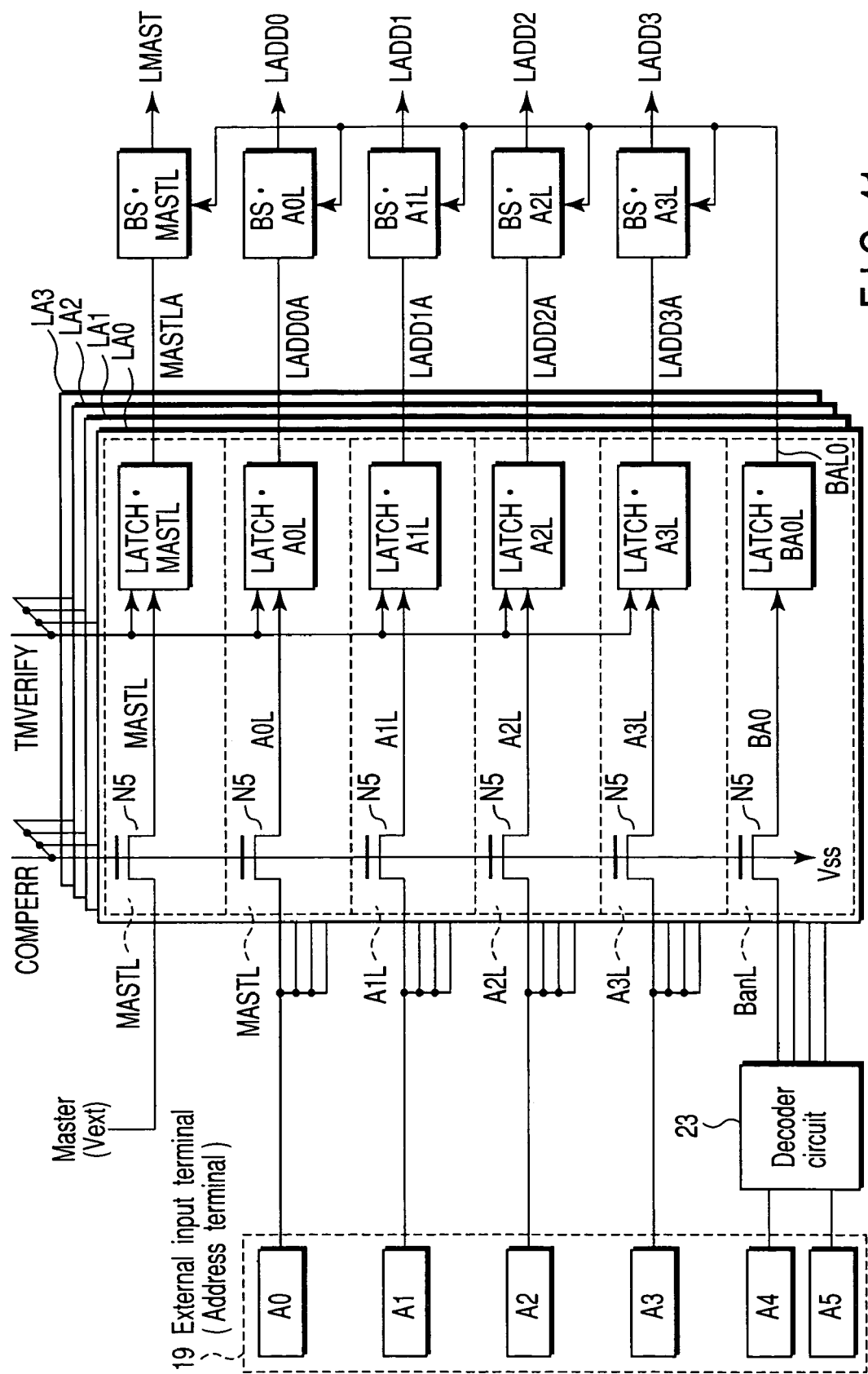
FIG. 41 is a circuit diagram depicting examples of a latch circuit and a bank selector circuit.

FIG. 41 shows examples of a latch circuit and a bank selector circuit.

The latch circuit $LA_i$ has a function for, when a faulty cell has been detected, latching an address of that faulty cell as a save address (save solution).

In this example, 4 latch circuits $LA_i$ exist in correspondence with the number of banks (the number of fuse program circuits $PF_i$). A configuration of one latch circuit is identical to that of another.

The latch circuit $LA_i$ will be described by way of example of a latch circuit LA0.

The latch circuit LA0 is composed of: a master data latch circuit MASTL; a save address (save solution) latch circuits A0L to A3L; and a bank address data latch circuit BanL.

In the test mode, address data A0 to A5 for specifying a memory cell targeted for testing are inputted to the external input terminal (address terminal) 19. In this example, the high order 2-bit address data A4 and A5 of the address data A0 to A5 are provided as bank address data for selecting one of the 4 banks, and the remaining 3-bit address data A0 to A3 are used as address data for actually selecting a memory cell in the selected bank.

For example, it is tested whether the memory cell is good or faulty by using the error detector circuit (read/write circuit) 13 of FIG. 9 described above. In the case where the memory cell is faulty, a sense signal (latch signal) COMPERR (="H") is outputted from the comparator circuit 18. This sense signal COMPERR is inputted to a gate of an N-channel MOS transistor N5 in the latch circuit LA0.

At this time, the address data A0 to A5 for specifying a memory cell targeted for testing are inputted to the external input terminal (address terminal) 19. The address data (bank address data) A4 and A5 are inputted to a decoder circuit 23. The decoder circuit 23 is composed of a circuit as shown in FIG. 22, for example. The decoder circuit 23 selects one of the 4 banks 0 to 3 based on the address data A4 and A5.

For example, in the case where a memory cell in bank 0 has been tested, bank 0 is selected. At this time, a bank selection signal BA0 to be inputted to the latch circuit LA0 which corresponds to bank 0 is set to "H", and bank selection signals BA1 to BA3 to be inputted to latch circuits LA1 to LA3 which correspond to non-selected bank 3 are set to "L".

In the case where a memory cell targeted for testing is faulty, the sense signal (latch signal) COMPERR is set to "H". Thus, the bank selection signal BA0 is inputted to a latch circuit LATCH•BA0L in the bank address data latch circuit BanL. Address data for that faulty memory cell is inputted as a save address to latch circuits LATCH•A0L to LATCH•A3L in the save address data latch circuits A0L to A3L.

The master data Master (Vext) is always set to "H (=power supply electrical potential Vdd)", for example. Therefore, when the sense signal (latch signal) COMPERR is set to "H", the master data Master (Vext)="H" is inputted to a latch circuit LATCH•MASTL in the master data latch circuit MASTL.

An output signal (bank selection signal) BAL0 of the latch circuit LATCH•BA0L is inputted to selectors BS•MASTL and BS•AnL in the bank selector circuit BS0, and the states of these selectors BS•MASTL and BS•AnL are controlled.

The test mode verify signal TMVERIFY is inputted to the latch circuits LATCH•MASTL in the master data latch circuit MASTL and the latch circuits LATCH•A0L to LATCH•A3L in the save address data latch circuits A0L to A3L, and the states of these latch circuits are controlled.

An example of operating waveform of the latch circuit in FIG. 41 is identical to that of FIG. 23 according to the first embodiment. A description of an example of operating waveform will be omitted here.

<3>-3.-2. Bank Address Data Latch Circuit BanL

Figure 42:
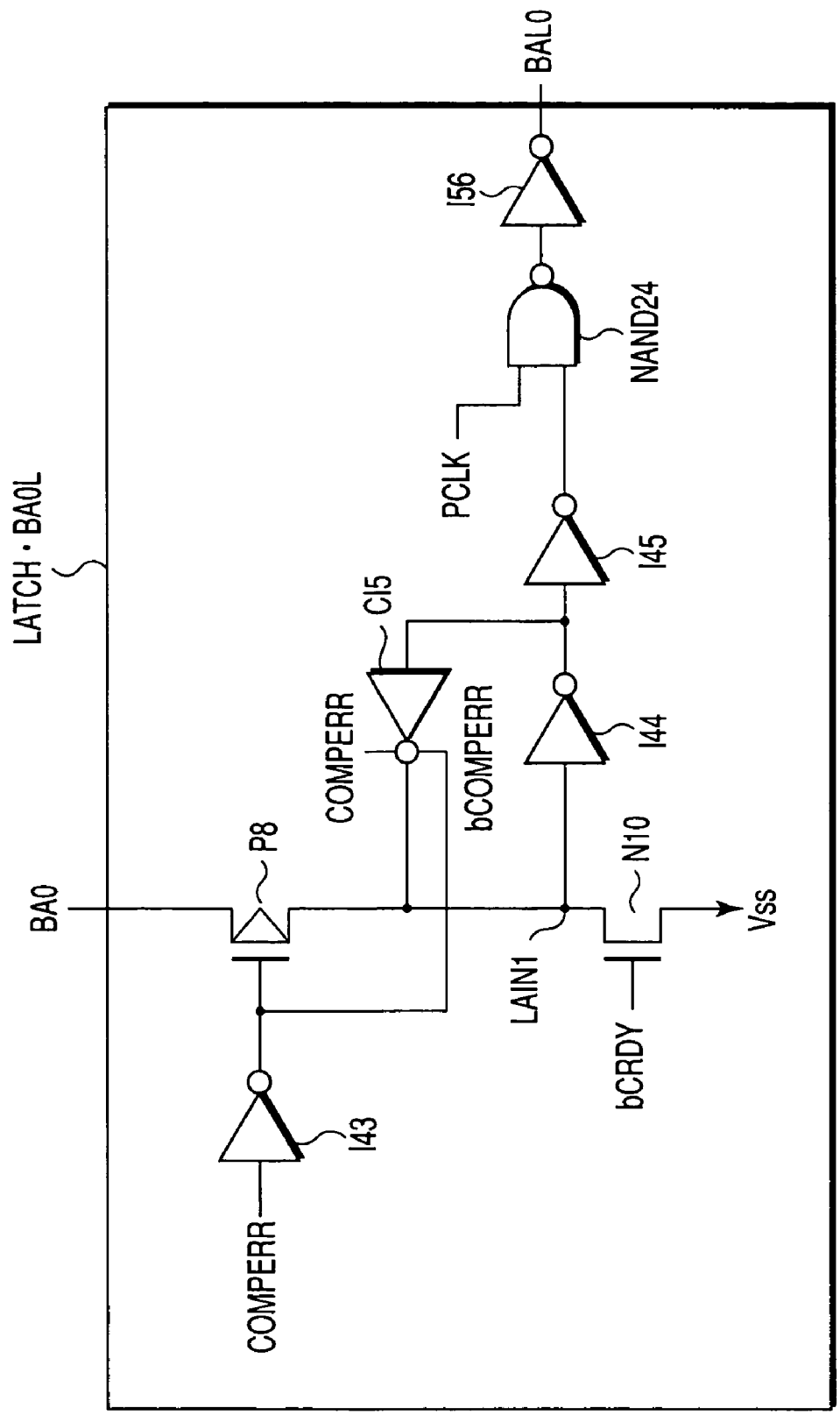
FIG. 42 a circuit diagram depicting an example of a bank address data latch circuit.

FIG. 42 shows an example of the latch circuit LATCH•BA0L in the bank address data latch circuit BanL.

The latch circuit LATCH•BA0L is composed of: inverters I43 to I45 and I56; a clocked inverter CI5; a NAND gate circuit NAND 24; a P-channel MOS transistor P8; and an N-channel MOS transistor N10.

The N-channel MOS transistor N10 is used for an initializing operation after power has been turned ON. In this example, bCRDY is set to "H", whereby an input node LAIN1 of a data latch portion is initialized to "L".

In a latch cycle during the test mode, for example, when the value of the sense signal (latch signal) COMPERR is set to "H", the P-channel MOS transistor P8 is set to an ON state. Thus, the bank selection signal BA0 is transferred to the input node LAIN1 of the data latch portion via the P-channel MOS transistor P8.

In addition, when the value of the sense signal (latch signal) COMPERR is set to "L", the P-channel MOS transistor P8 is set to an OFF state. Thus, the bank selection signal BA0 is not transferred to the input node LAIN1 of the data latch portion.

In this example, the latch portion for actually latching data is composed of the inverter I44 and the clocked inverter CI5.

When the value of the sense signal (latch signal) COMPERR is set to "H", the clocked inverter CI5 is set to an active state, and the latch portion is set to a state in which it can latch the bank selection signal BA0. When the value of the sense signal (latch signal) COMPERR is set to "L", the clocked inverter CI5 is set to an inactive state.

In the case where bank 0 has been selected, the bank selection signal BA0 is set to "H", and "H" is latched at the latch portion. Further, in the case where bank 0 has not been selected, the bank selection signal BA0 is set to "L", and thus, "L" is latched at the latch portion.

The bank selection signal BA0 latched at the latch portion is synchronized with a clock signal PCLK, and the bank selection signal BAL0 is outputted from the latch circuit LATCH•BA0L.

<3>-3.-3. Master Data Latch Circuit MASTL and Bank Selector Circuit BS•MASTL

Figure 43:
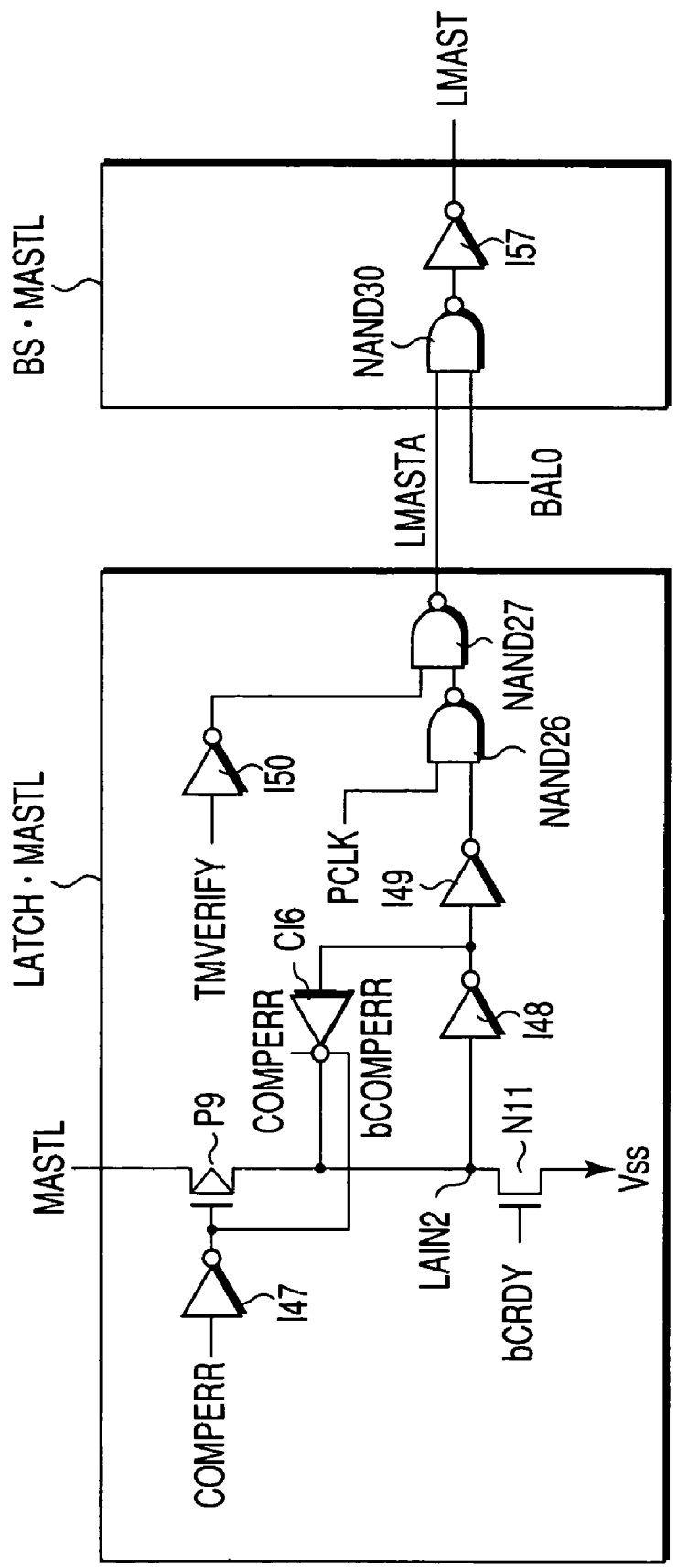
FIG. 43 is a circuit diagram depicting examples of a master data latch circuit and a bank selector circuit.

FIG. 43 shows an example of the latch circuit LATCH•MASTL in the master data latch circuit MASTL and an example of the bank selector circuit BS•MASTL.

The latch circuit LATCH•MASTL is composed of: inverters I47 to I50; a clocked inverter CI6; NAND gate circuits NAND26 and NAND27; a P-channel MOS transistor P9; and an N-channel MOS transistor N11.

The N-channel MOS transistor N11 is used for an initializing operation after power has been turned ON. In this example, bCRDY is set to "H", whereby an input node LAIN2 of a data latch portion is initialized to "L".

In the case where bank 0 has been selected, the bank selection signal BAL0 (="H") outputted from the bank address data latch circuit LATCH•BA0L of FIG. 42 is outputted in synchronism with the clock signal PCLK. In addition, in the case where a memory cell targeted for testing in bank 0 is faulty, a sense signal (latch signal) COMPERR is set to "H".

Therefore, the P-channel MOS transistor P9 is set to an ON state. Thus, the master data (="H") MASTL is transferred to the input node LAIN2 of the data latch portion via the P-channel MOS transistor P9.

When the value of the sense signal (latch signal) COMPERR is set to "L", the P-channel MOS transistor P9 is set to an OFF state. Thus, the master data (="H") MASTL is not transferred to the input node LAIN2 of the data latch portion.

The latch portion is composed of the inverter I48 and the clocked inverter CI6. When the value of the sense signal (latch signal) COMPERR is set to "H", the clocked inverter CI6 is set to an active state, and the latch portion latches master data (="H"). When the value of the sense signal (latch signal) COMPERR is set to "L", the clocked inverter CI6 is set to an inactive state.

The master data (="H") latched at the latch portion is synchronized with the clock signal PCLK to be outputted from the latch circuit LATCH•MASTL as master data LMASTA.

When the test mode verify signal TMVERIFY is set to "H", the output data LMASTA for the latch circuit LATCH•MASTL is fixed to "H".

The bank selector circuit BS•MASTL is composed of the NAND gate circuit NAND30 and the inverter I57.

When the bank selection signal BAL0 is set to "H", the bank selector circuit BS•MASTL outputs the output data LMASTA of the latch circuit LATCH•MASTL as output data LMAST.

When the bank selection signal BAL0 is set to "L", the output data LMAST for the bank selector circuit BS•MASTL is fixed to "L" irrespective of the value of the output data LMASTA of the latch circuit LATCH•MASTL.

<3>-3.-4. Save Address Data Latch Circuit AnL and Bank Selector BS•AnL

FIG. 44 shows an example of the latch circuit LATCH•AnL in the save address data latch circuit AnL and an example of the bank selector circuit BS•AnL.

The latch circuit LATCH•AnL is composed of: inverters I51 to I54; a clocked inverter CI7; NAND gate circuits NAND28 and NAND29; a P-channel MOS transistor P10; and an N-channel MOS transistor N12.

The N-channel MOS transistor N12 is used for an initializing operation after power has been turned ON. In this example, bCRDY is set to "H", whereby an input node LAIN3 of a data latch portion is initialized to "L".

In the case where bank 0 has been selected, the bank selection signal BAL0 (="H") outputted from the bank address data latch circuit LATCH•BA0L of FIG. 42 is outputted in synchronism with the clock signal PCLK. In addition, in the case where a memory cell targeted for testing in bank 0 is faulty, the sense signal (latch signal) COMPERR is set to "H".

Therefore, the P-channel MOS transistor P10 is set to an ON state. Thus, the save address data AnL is transferred to the input node LAIN3 of the data latch portion via the P-channel MOS transistor P10.

In addition, when the value of the sense signal (latch signal) COMPERR is set to "L", the P-channel MOS transistor P10 is set to an OFF state. Thus, the save address data AnL is not transferred to the input node LAIN3 of the data latch portion.

The latch portion is composed of the inverter I52 and the clocked inverter C17. When the value of the sense signal (latch signal) is set to "H", the clocked inverter CI7 is set to an active state, and the latch portion latches the save address data AnL. When the value of the sense signal (latch signal) is set to "L", the clocked inverter CI7 is set to an inactive state.

The save address data AnL latched at the latch portion is synchronized with the clock signal PCLK, and save address data LADDNA is outputted from the latch circuit LATCH•AnL.

When the test mode verify signal TMVERIFY is set to "H", the output data LADDNA for the latch circuit LATCH•AnL is fixed to "H".

The bank selector circuit BS•AnL is composed of the NAND gate circuit NAND31 and the inverter I58.

When the bank selection signal BAL0 is set to "H", the bank selector circuit BS•AnL outputs the output data LADDnA for the latch circuit LATCH•AnL as output data LADDn.

When the bank selection signal BAL0 is set to "L", the output data LADDn for the bank selector circuit BS•AnL is fixed to "L" irrespective of the value of the output data LADDnA for the latch circuit LATCH•AnL.

<3>-3.-5. Operation

An operation of the latch circuit in FIGS. 42 to 44 is as shown in FIG. 28, for example, as in the first embodiment. However, the bank selection signal BAL0 is set to "H", and the test mode verify signal TMVERIFY is set to "H".

<3>-4 Switch Circuit

FIGS. 29 and 30 each show an example of a switch circuit.

As the switch circuit SW of FIG. 49, an example (FIGS. 29 and 30) of the switch circuit SW of FIG. 20 can be used as is. Therefore, a description of the switch circuit is omitted here.

<3>-5. Counter

<3>-5.-1. Outline

The counter generates control signals EFMAST and EFADDn for programming master data LMAST and save address data LADDn for the electrical fuse in the fuse program circuit FPi on one bit by one bit basis, as in the first embodiment.

<3>-5.-2. Overview

FIG. 45 shows an example of a counter.

In this example, the counter Ci (i=0, 1, 2, 3) is provided as a shift register having a TYPE-A circuit and a TYPE-B circuit.

Control signals CLK, bCLK, CRDY, and bCRDY are inputted to the TYPE-A circuit and the TYPE-B circuit each, and control an operation of each of these circuits.

The control signal CRDY may be generated from the test mode verify signal TMVERIFY, as shown in FIG. 46, for example. In this case, the control signal CRDY is set to "L" after a predetermined period of time after the test mode verify signal TMVERFY has been set to "H". When the control signal CRDY is set to "L", the counter Ci is initialized. As shown in FIG. 47, the control signal bCRDY is provided as an inverted signal of the control signal CRDY.

<3>-5.-3. TYPE-A Circuit

FIG. 48 shows an example of a TYPE-A circuit.

The TYPE-A circuit is composed of: inverters I34 to I37; a clocked inverter CI4; a NAND gate circuit NAND22; a P-channel MOS transistor P7; and switches (transfer gates) SW1 and SW2.

In a shift register initializing cycle, the control signal CRDY is set to "L", and an electrical potential of an input node "nodeA" of a latch portion in the TYPE-A circuit is set to "H". In addition, when the control signal CRDY is set to "L", the clocked inverter CI4 is set to an active state. Thus, "H" is latched at the latch portion composed of the inverter I34 and the clocked inverter CI4.

When the control signal (clock signal) CLK is set to "L", the switch SW2 is set to an ON state, and "H" is latched at the latch portion composed of the inverters I35 and I36. An electrical potential of the node "nodeA" and an electrical potential of FOUT are equal to each other (FOUT="H").

Then, the control signal CRDY is set to "H".

In a verifying cycle, an operation of the TYPE-A circuit is controlled by the clock signal CLK.

That is, when the clock signal is set to "H", a switch SW1 is set to an ON state, and "L" is latched at the latch portion composed of the inverter I34 and the clocked inverter CI4 (nodeA="L")L. Further, the output signal FOUT is set to "H", and two input signals of the NAND gate circuit NAND22 both are set to "H". As a result, the control signal EFMAST is set to "H".

When the control signal EFMAST is set to "H", the switch circuit (FIG. 29) is set to a state in which it can transfer master data LMAST.

Thereafter, when the clock signal CLK is set to "L", the switch SW1 is set to an OFF state, and the switch SW2 is set to an ON state again. Then, "L" is latched at the latch portion composed of the inverters I35 and I36. An electrical potential of the node "nodeA" and an electrical potential of FOUT are equal to each other (FOUT="L").

Moreover, when the clock signal is then set to "H", the switch SW1 is set to an ON state, and then, "L" is latched at the latch portion composed of the inverter I34 and the clocked inverter CI4 (nodeA="L"). In addition, the output signal FOUT is set to "L", and thus, the control signal EFMAST is set to "L".

<3>-5.-4. TYPE-B Circuit

FIG. 49 shows an example of a TYPE-B circuit.

The TYPE-B circuit is composed of: inverters I38 to I42; a NAND gate circuit NAND23; an N-channel MOS transistor N9; and switches (transfer gates) SW3 and SW4.

In a shift register initializing cycle, the control signal CRDY is set to "L", and the control signal bCRDY is set to "H". Then, an electrical potential of an input node "node B" of a latch portion in the TYPE-B circuit is set to "L". That is, "L" is latched at the latch portion composed of the inverters I38 and I39.

When the control signal (clock signal) CLK is set to "L", the switch SW4 is set to an ON state, and "L" is latched at the latch portion composed of the inverters I40 and I41 as well. An electrical potential of the node "node B" and an electrical potential of FOUTm are equal to each other (FOUTm="L").

Then, the control signal bCRDY is set to "L".

In a verifying cycle, an operation of the TYPE-B circuit is controlled by the clock signal CLK.

That is, when the clock signal is set to "H", the switch SW3 is set to an ON state, and the input data FINm is latched at the latch portion composed of the inverters I38 and I39.

The input data FINm is provided as an output signal of a unit at the previous stage. In the case where the unit at the previous stage is a TYPE-A circuit, the input data FINm is obtained as output data FOUT for the TYPE-A circuit. In addition, in the case where the unit at the previous stage is a TYPE-B circuit, the input data FINm is obtained as output data FOUTm-1 for the TYPE-B circuit at the previous stage.

The output signal FOUTm is initially set to "L", and output data for the NAND gate circuit NAND22 is set to "H". As a result, the control signal EFADDm is set to "L".

Thereafter, when the clock signal CLK is set to "L", the switch SW3 is set to an OFF state, and the switch SW4 is set to an ON state again. Then, the input data FINm, i.e., the output signal of the unit at the previous stage is latched at the latch portion composed of the inverters I40 and I41 as well. An electrical potential of the node "node B" and an electrical potential of FOUTm are equal to each other.

Further, if the clock signal CLK is then set to "H", when the input data latched at the latch portion composed of the inverters I38 and I39 in a cycle before this cycle is set to "H", a current state of FOUT is set to "H". Thus, the control signal EFADDm is set to "H".

When the control signal EFADDm is set to "H", the switch circuit (FIG. 30) is set to a state in which it can transfer save address data (1 bit) LADDm.

When the input data FINm latched at the latch portion composed of the inverters I38 and I39 in a cycle before this cycle is set to "L", a current state of FOUTm is set to "L". Thus, the control signal EFADDm is set to "H".

In the case where the control signal EFADDm is set to "H" once, the control signal EFADDm is always set to "L" in that cycle and subsequent cycles.

<3>-5.-5. Operation

FIG. 50 shows an example of an operating waveform of the counter in FIGS. 45 to 49.

In a verifying operation, for example, the power supply electrical potential Vdd is provided to the VBP node connected to one end of the electrical fuse EF of FIG. 40 in common, instead of the high voltage VBP. In a verify mode, first, the test mode verify signal TMVERIFY is set to "H".

At this time, for example, the output data LMASTA for the master data latch circuit LATCH•MASTL shown in FIG. 43 and the output data LADDnA for the save address data latch circuit LATCH•AnL shown in FIG. 44 are forcibly set to "H". The transfer gate TG in the monitor circuit M of FIG. 40 is set to an ON state, and the monitor 22 is electrically connected to one end of the transistor Tr2 in the fuse program circuit FPi.

The control signal CRDY is set to "L", and the counter (shift register) Ci of FIGS. 45 and 49 is initialized. Then, the control signal CRDY is set to "H".

In a verifying cycle, first, bank address data A4 and A5 are inputted into a chip in synchronism with a fall edge of a signal/RAS.

In the selected bank, the bank selection signal BAL0 is set to "H", and the bank selector circuit BS•MASTL of FIG. 43 is set to a state in which it can transfer the output data LMASTA for the latch circuit LATCH•MASTL. In addition, the bank selector circuit BS•AnL of FIG. 44 is set to a state in which it can transfer the output data LADDNA for the latch circuit LATCH•AnL.

In a non-selected bank, since the bank selection signal BAL0 is set to "L", the output data LMAST for the bank selector circuit BS•MASTL of FIG. 43 and the output data LADDn for the bank selector circuit BS•AnL of FIG. 44 are fixed to "L".

Thereafter, output data EFMAST, EFADD0, EFADD1, EFADD2, and EFADD3 for the counter Ci are sequentially set to "H" in synchronism with the clock signal CLK.

Output data LMAST and LADD0 to LADD3 for bank selector circuits BS0, BS1, BS2, and BS3 associated with the selected bank are set to all "H". Then, the output data EFMST, EFADD0, EFADD1, EFADD2, and EFADD3 for the counter Ci are sequentially set to "H". In this manner, a state of the electrical fuse EF in the fuse program circuit FPi associated with the selected bank can be monitored by the monitor circuit M.

For example, when the output data EFADD0 for the counter Ci is set to "H", the other end of the electrical fuse EF associated with the save address data FADD0 is electrically connected to the monitor circuit M. In this case, if the electrical fuse EF is broken (in a state in which "1" is set), a current flows from the VBP node to the monitor circuit M. If the electrical fuse EF is broken (in a state in which "0" is set), no current flows from the VBP mode to the monitor circuit M.

Therefore, for example, the presence or absence of this current is detected by the monitor circuit M, thereby making it possible to check a state of the electrical fuse EF associated with the save address data FADD0.

In the case of self fuse programming (self saving), since an expected value (a value to be programmed) does not eventually exist, there is no need to execute verifying of fuse program data.

However, even in such a circumstance, in the case of intentionally programming write data as well as self fuse programming in order to check a circuit operation, verifying operation is required. Namely, the data checked by the monitor circuit Mi is compared with save address data stored in a tester, thereby making it possible to check (verify) whether or not save address data has been programmed for the fuse program circuit FPi.

<4> Monitor Circuit

In this example, as shown in FIG. 40, the monitor circuit M is connected to 4 fuse program circuits FPi which correspond to 4 banks in common. A configuration of the monitor circuit M itself is identical to that of the monitor circuit Mi (FIG. 20) according to the first embodiment. Thus, a duplicate description of the monitor circuit is omitted here.

<5> Advantageous Effect

In the second embodiment according to the present invention as well, as in the first embodiment, in a chip, there are provided: an error detector circuit for detecting a faulty memory cell; and a self fuse program circuit for automatically programming an address of that faulty memory cell as a save address in a fuse program circuit.

Thus, in particular, a faulty memory cell which occurs after an assembling process can be saved without an expensive tester incorporating an FAM.

(4) Advantageous Effect According to Embodiments of the Present Invention

As has been described above, according to the embodiments of the present invention, a faulty memory cell which occurs after an assembling process can be saved without using an expensive tester incorporating an FAM. In addition, since generation of a save solution and fuse programming are executed during the same operation in all the chips, saving of a faulty cell can be carried out for a plurality of chips by means of a single tester at the same time.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory comprising:
an error detector circuit which, based on first data read out from a memory cell and second data provided to an external input terminal, determines whether the memory cell is good or faulty; and
a self fuse program circuit which, when the memory cell is faulty, programs address data for the memory cell as save address data in an electrical fuse;
wherein the error detector circuit has an output circuit, and the output circuit is deactivated when the first data is read out from the memory cell.

2. A semiconductor memory comprising:
an error detector circuit which, based on first data read out from a memory cell and second data provided to an external input terminal, determines whether the memory cell is good or faulty; and
a self fuse program circuit which, when the memory cell is faulty, programs address data for the memory cell as save address data in an electrical fuse,
wherein the error detector circuit has a comparator circuit, and the comparator circuit has a function for comparing the first data with the second data, and in the case where values of both data do not coincide with each other, outputting a sense signal, and
wherein the error detector circuit has an input circuit, and the input circuit has a function for inputting third data to be programmed for the memory cell and inputting the second data.

3. The semiconductor memory according to claim 2, wherein the second data and the third data has an identical value.

4. The semiconductor memory according to claim 3, wherein the error detector circuit has a pseudo read control circuit, and the pseudo read control circuit has a function for transferring the second data to the comparator circuit and transferring the third data to the memory cell.

5. The semiconductor memory according to claim 4, wherein, after the third data has been programmed for the memory cell, the first data is read out from the memory cell.

6. The semiconductor memory according to claim 1, wherein the error detector circuit has a pseudo read control circuit, and the pseudo read control circuit has a function for transferring the first data to the a comparator circuit.

7. A semiconductor memory comprising:
an error detector circuit which, based on first data read out from a memory cell and second data provided to an external input terminal, determines whether the memory cell is good or faulty; and
a self fuse program circuit which, when the memory cell is faulty, programs address data for the memory cell as save address data in an electrical fuse,
wherein the error detector circuit has a comparator circuit, and the comparator circuit has a function for comparing the first data with the second data, and in the case where values of both data do not coincide with each other, outputting a sense signal, and
wherein the self fuse program circuit has a latch circuit, and the latch circuit has a function for latching the address data upon receipt of the sense signal.

8. The semiconductor memory according to claim 7, wherein the latch circuit has a function for latching master data for validating the address data as the save address data upon receipt of the sense signal.

9. The semiconductor memory according to claim 8, wherein the latch circuit has a function for latching a bank selection signal for selecting a bank including the memory cell upon receipt of the sense signal.

10. The semiconductor memory according to claim 9, wherein the latch circuit determines whether or not to output the master data and the save address data based on the bank selection signal.

11. The semiconductor memory according to claim 7, wherein the self fuse program circuit has a fuse program circuit, and the fuse program circuit has a function for programming the save address data for the electrical fuse.

12. The semiconductor memory according to claim 11, wherein the self fuse program circuit has a counter and a switch circuit, and the counter and the switch circuit have a function for transferring the save address data to the fuse program circuit on one bit by one bit basis.

13. The semiconductor memory according to claim 12, wherein the save address data is configured of a plurality of bits, and a programming operation for the electrical fuse is carried out for all bits irrespective of a value of each bit of the save address data.

14. The semiconductor memory according to claim 13, further comprising a monitor circuit which monitors data programmed for the electrical fuse.

15. The semiconductor memory according to claim 14, wherein, when a verifying operation for monitoring data programmed for the electrical fuse is carried out, all bits of the save address data are set to an identical value.

16. The semiconductor memory according to claim 15, wherein the counter is initialized before carrying out a verifying operation.

17. The semiconductor memory according to claim 12, wherein the self fuse program circuit has a bank selector circuit, and the bank selector circuit has a function for, when the fuse program circuit corresponds to a selected bank, transferring the save address data to the switch circuit.

* * * * *